(12) United States Patent
Matsushita et al.

(10) Patent No.: US 8,211,811 B2
(45) Date of Patent: Jul. 3, 2012

(54) SEMICONDUCTOR DEVICE AND METHOD FOR MANUFACTURING THE SAME

(75) Inventors: Daisuke Matsushita, Hiratsuka (JP); Yuichiro Mitani, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 12/508,234

(22) Filed: Jul. 23, 2009

(65) Prior Publication Data

US 2010/0052039 A1    Mar. 4, 2010

(30) Foreign Application Priority Data

Sep. 2, 2008    (JP) .................................. 2008-224448

(51) Int. Cl.
*H01L 21/31* (2006.01)
(52) U.S. Cl. ................. 438/763; 257/324; 257/E29.309
(58) Field of Classification Search .................. 438/260, 438/763; 257/314–326, E27.078, E29.003–E29.309
See application file for complete search history.

(56) References Cited

U.S. PATENT DOCUMENTS

| 2005/0285180 | A1 | 12/2005 | Mitani et al. |
| 2007/0018231 | A1* | 1/2007 | Mitani et al. ................... 257/315 |
| 2008/0121887 | A1* | 5/2008 | Choi et al. ....................... 257/66 |

FOREIGN PATENT DOCUMENTS

| JP | 2003-347543 | 12/2003 |
| JP | 2007-287856 | 11/2007 |

OTHER PUBLICATIONS

Matsushita et al., "Semiconductor Device and Method for Manufacturing the Same", U.S. Appl. No. 12/200,467, filed Aug. 28, 2008.

* cited by examiner

*Primary Examiner* — Tony Tran
(74) *Attorney, Agent, or Firm* — Finnegan, Henderson, Farabow, Garrett & Dunner, L.L.P.

(57) ABSTRACT

A semiconductor device of an embodiment can prevent nitriding of the lower-layer insulating film and oxygen diffusion from the upper-layer insulating film, so as to minimize the decrease in charge capture density. This semiconductor device includes a semiconductor layer, a first insulating film provided on the semiconductor layer, a nitrogen-added amorphous silicon layer formed on the first insulating film, a first silicon nitride layer formed on the amorphous silicon layer, and a second insulating film formed above the first silicon nitride layer.

3 Claims, 41 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2008-224448 filed on Sep. 2, 2008 in Japan, the entire contents of which are incorporated herein by reference.

BACKGROUND

1. Technical Field

Described herein are a semiconductor device and a method for manufacturing the semiconductor device.

2. Related Art

Since flash memories that are nonvolatile memories, particularly NAND flash memories, are easily made smaller in size, the prices of those flash memories are rapidly declining, and the capacities of those memories are rapidly becoming larger. Having high shock resistance, those memories are being rapidly developed as still image memory media and high-quality voice recording media, and are now forming a large market.

The memory cells used in NAND flash memories are characterized by being of a floating gate (FG) type having a floating gate that is covered with an insulating film and is made of polysilicon, a MONOS (Metal-Oxide-Nitride-Oxide-Silicon) type having a charge trap film that is covered with an insulating film and is formed with a silicon nitride film, or a SONOS (Silicon-Oxide-Nitride-Oxide-Silicon) type. A control gate that is to be the charge storage film is formed on the floating gate or the charge trap film, and sandwiches an interelectrode insulating film or a block insulating film. The voltage (control voltage) to be applied to the control gate is controlled. Also, electrons are injected (writing) by FN (Fowler-Nordheim) tunneling into the floating gate or the charge trap film from the substrate via the tunnel insulating film, or electrons are withdrawn (erasing in a FG type or a MONOS/SONOS type) from the floating gate via the tunnel insulating film, or holes are injected into the charge trap film so as to cause electron-pair annihilation (auxiliary erasing in a MONOS/SONOS type). In this manner, the threshold values of memory cells are varied. However, as the sizes of the memories have become smaller, one large problem has surfaced.

To increase the memory capacities, reductions in device size are most effective. However, it is also necessary to reduce the charge storage film in size. Even in a case where the charge storage film is made smaller, the charge amount required for driving the memory cells should be as high as possible, so as to prevent errors and realize multivalue recording to increase the number of bits stored in each cell. In other words, it is necessary to improve the charge capture density. Moreover, if the size in the horizontal direction (the direction perpendicular to the depositing direction of the charge storage film) becomes smaller, the size in the vertical direction (the depositing direction of the charge storage film) also becomes smaller, or the film thickness becomes smaller. As a result, the capture time becomes shorter, and the amount of released charges becomes larger. Therefore, it is necessary to improve the capture efficiency and the retention characteristics.

To improve the charge capture density, a method for improving the silicon concentration in the silicon nitride film to be the charge storage film has been suggested (see JP-A 2003-347543 (KOKAI), for example). According to the technique disclosed in JP-A 2003-347543 (KOKAI), however, a silicon nitride film is deposited directly on the tunnel insulating film through a heating process. As a result, the tunnel insulating film is nitrided, and a charge trap source is formed. Since charges are captured at the portion where the trap source is generated, charges are not efficiently injected into the charge storage film, and the capture efficiency becomes poorer.

Also, a technique has been suggested to maintain high retention characteristics by forming a block insulating film with a high-dielectric film (high-k film) provided above the charge storage film. In this manner, higher insulating properties are achieved, and captured charges are not released (see JP-A 2007-287856 (KOKAI)). According to the technique disclosed in JP-A 2007-287856 (KOKAI), however, the block insulating film containing oxygen and metal is deposited directly on the silicon nitride film to be the charge storage film. Therefore, oxygen is diffused into the silicon nitride film, and defects are corrected through oxidation. As a result, the capture efficiency becomes poorer.

SUMMARY

Possible embodiments of this invention are made in view of these circumstances, and some embodiments of this invention may provide a semiconductor device having a nitride film and a method for manufacturing the semiconductor device that can prevent nitriding of the lower-layer insulating film and oxygen diffusion from the upper-layer insulating film, and can minimize the decrease in charge capture density.

A semiconductor device according to a first aspect includes: a semiconductor layer; a first insulating film provided on the semiconductor layer; an amorphous silicon layer provided on the first insulating film and having nitrogen added thereto; a first silicon nitride layer provided on the amorphous silicon layer; and a second insulating film provided above the first silicon nitride layer.

A method for manufacturing a semiconductor device according to a second aspect includes: forming a first insulating film; forming an amorphous silicon layer on the first insulating film by supplying a silicon containing gas in an atmosphere at a first temperature of 550° C. or lower; forming a first silicon nitride layer on the amorphous silicon layer by stopping supplying the silicon containing gas, and supplying a nitriding gas while increasing the temperature of the atmosphere to a second temperature and maintaining the atmosphere at the second temperature; and forming a second insulating film on the first silicon nitride layer, wherein nitrogen is added to the amorphous silicon layer during forming the first silicon nitride layer.

A method for manufacturing a semiconductor device according to a third aspect includes: forming a first insulating film; forming an amorphous silicon layer on the first insulating film by supplying a silicon containing gas in an atmosphere at a first temperature of 550° C. or lower; forming a first silicon nitride layer on the amorphous silicon layer by supplying the silicon containing gas, and supplying a nitriding gas while maintaining the atmosphere at the first temperature; and forming a second insulating film above the first silicon nitride layer, wherein nitrogen is added to the amorphous silicon layer during forming of the first silicon nitride layer.

DESCRIPTION OF THE DRAWINGS

FIGS. 11(a) to 14(b) are cross-sectional views illustrating the procedures for manufacturing a nonvolatile semiconductor memory device according to a second embodiment;

FIGS. 16(a) to 19(b) are cross-sectional views illustrating the procedures for manufacturing a nonvolatile semiconductor memory device according to a third embodiment;

FIGS. 22(a) to 25(b) are cross-sectional views illustrating the procedures for manufacturing a nonvolatile semiconductor memory device according to a fourth embodiment;

FIGS. 28(a) to 31(b) are cross-sectional views illustrating the procedures for manufacturing a nonvolatile semiconductor memory device according to a fifth embodiment;

FIGS. 34(a) to 37(b) are cross-sectional views illustrating the procedures for manufacturing a nonvolatile semiconductor memory device according to a sixth embodiment;

DETAILED DESCRIPTION

First Embodiment

First, a method for manufacturing a semiconductor device in accordance with a first embodiment is described. A semiconductor device to be manufactured by the manufacture method of this embodiment is a MONOS nonvolatile semiconductor memory device, and includes memory cells. Referring to FIGS. 1(a) through 4(b), the method for manufacturing the nonvolatile semiconductor memory device of this embodiment is described. FIGS. 1(a) through 4(b) are cross-sectional views illustrating the manufacture procedures according to the manufacture method of this embodiment. FIGS. 1(a), 1(c), 1(e), 2(a), 2(c), 3(a), 3(c), and 4(a) show cross sections perpendicular to the cross sections shown in FIGS. 1(b), 1(d), 1(f), 2(b), 2(d), 3(b), 3(d), and 4(b), respectively.

First, as shown in FIGS. 1(a) and 1(b), a silicon substrate 1 doped with desired impurities is subjected to a diluted HF treatment, so that the surface of the silicon substrate 1 is terminated by hydrogen. The silicon substrate 1 is then placed in the chamber of a film forming device. The atmosphere in the chamber is then filled only with a gas (such as a nitrogen gas) that does not react with silicon or does not etch silicon during the manufacturing process. After that, the temperature of the silicon substrate 1 is increased to 700° C., so as to completely remove hydrogen from the silicon substrate 1.

The atmosphere in the chamber is turned into a mixed atmosphere of a $N_2$ gas of 30 Torr in partial pressure and an $O_2$ gas of 3 Torr in partial pressure, for example. The surface of the silicon substrate 1 is increased to 1050° C., and is maintained at that temperature for 50 seconds. In this manner, a silicon oxide film 2 to be a tunnel insulating film is formed on the silicon substrate 1, as shown in FIGS. 1(c) and 1(d).

Figure 1:
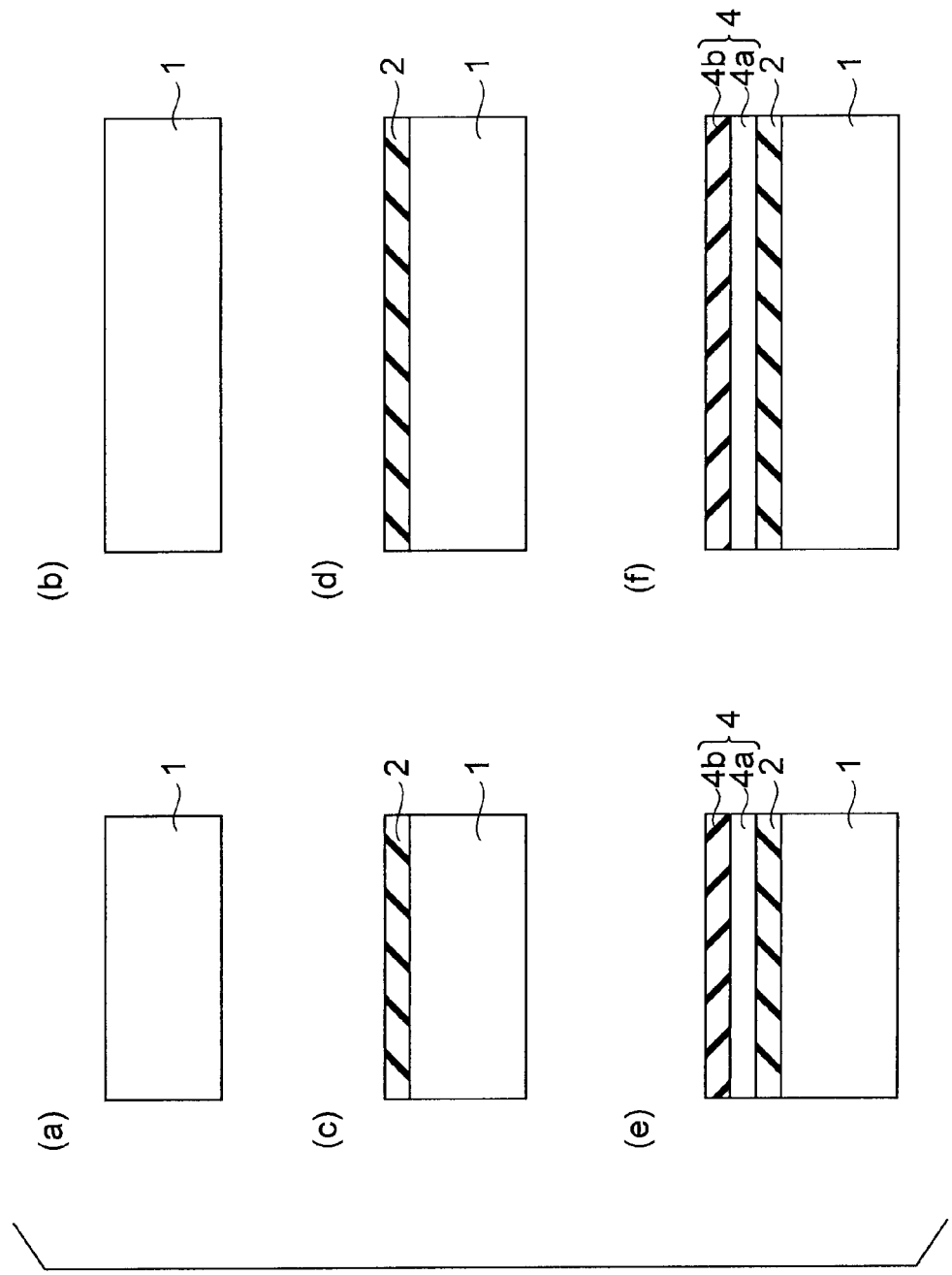
FIGS. 1(*a*) to 4(*b*) are cross-sectional views illustrating the procedures for manufacturing a nonvolatile semiconductor memory device according to a first embodiment.
Figure 2:
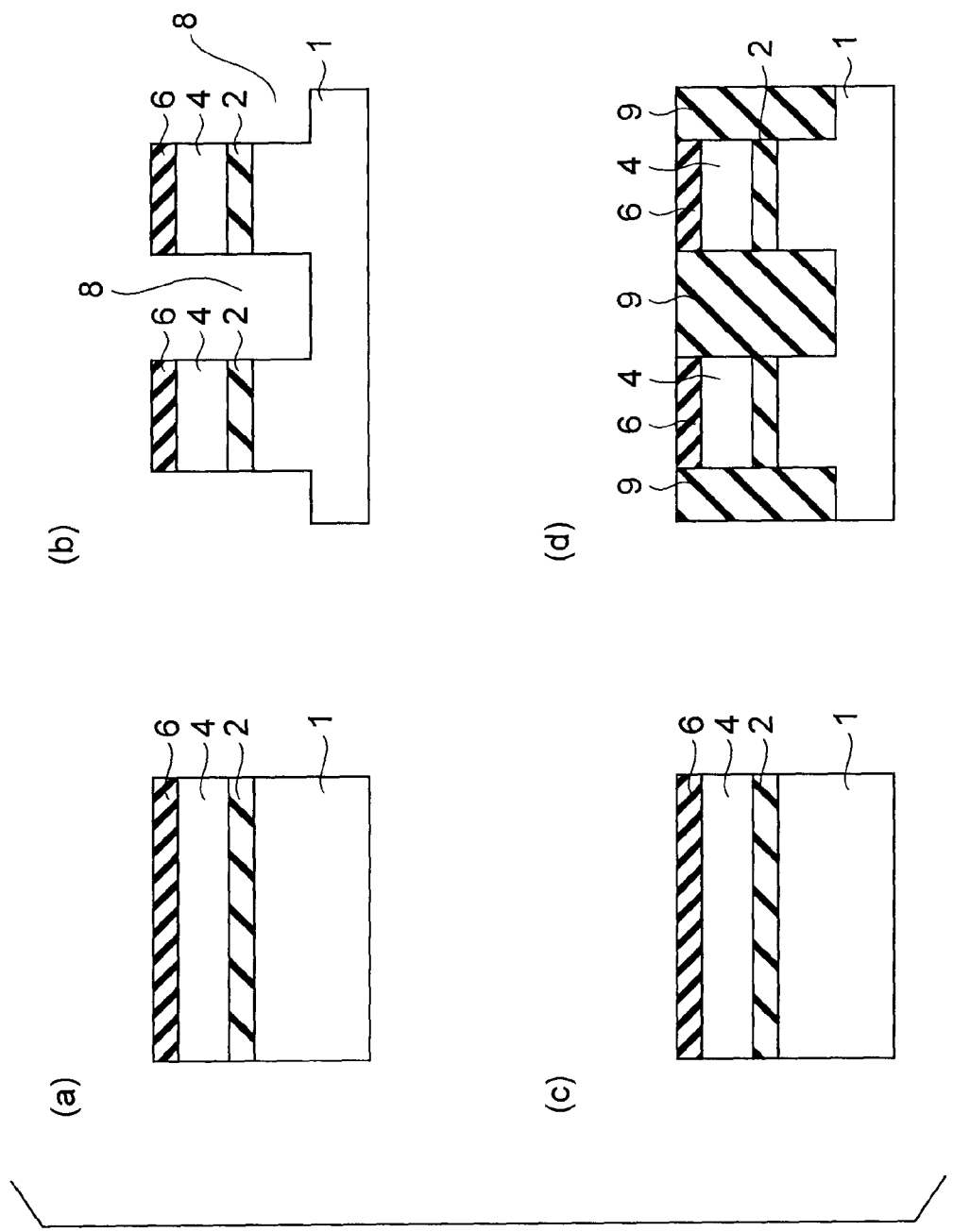
Figure 3:
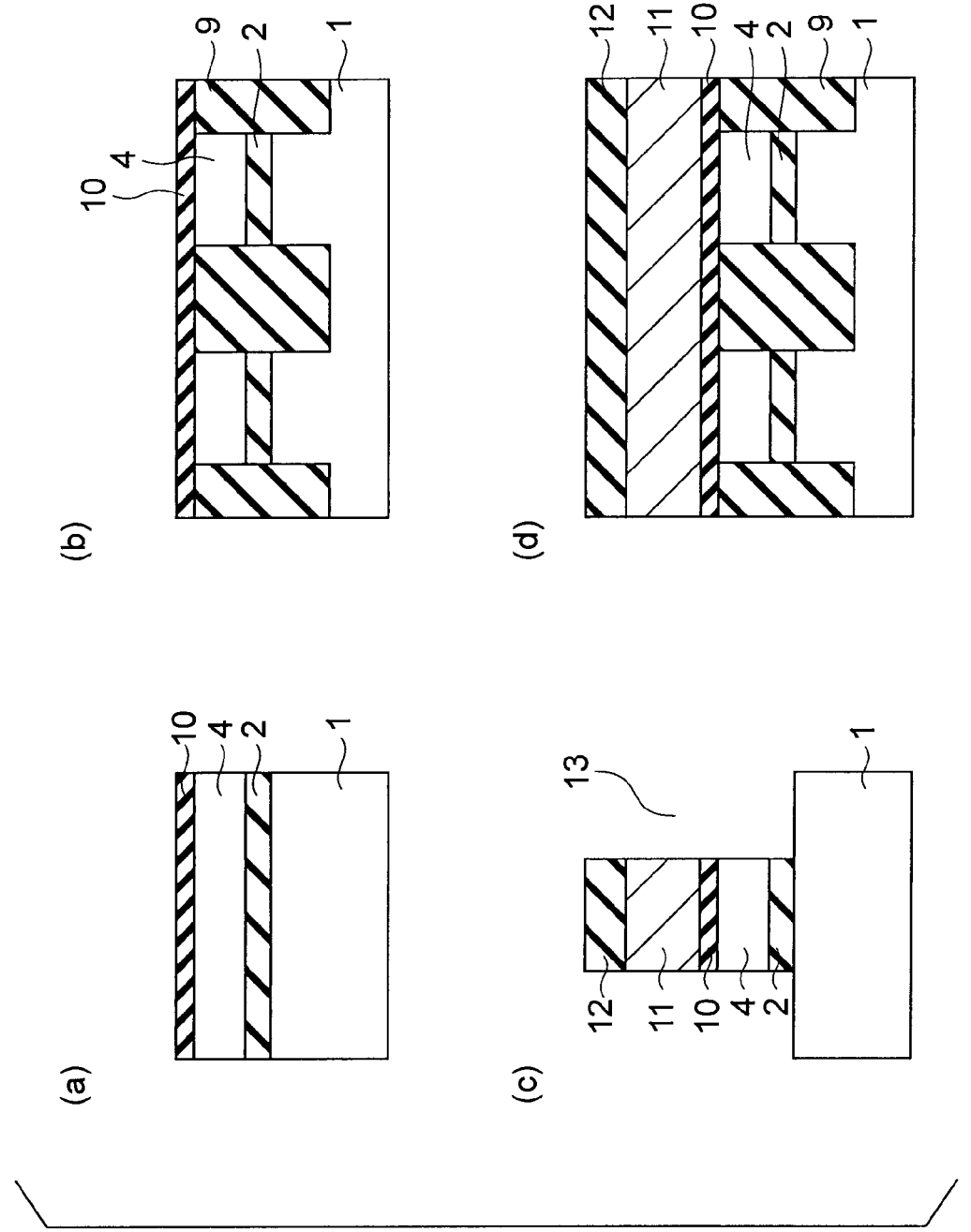
Figure 4:
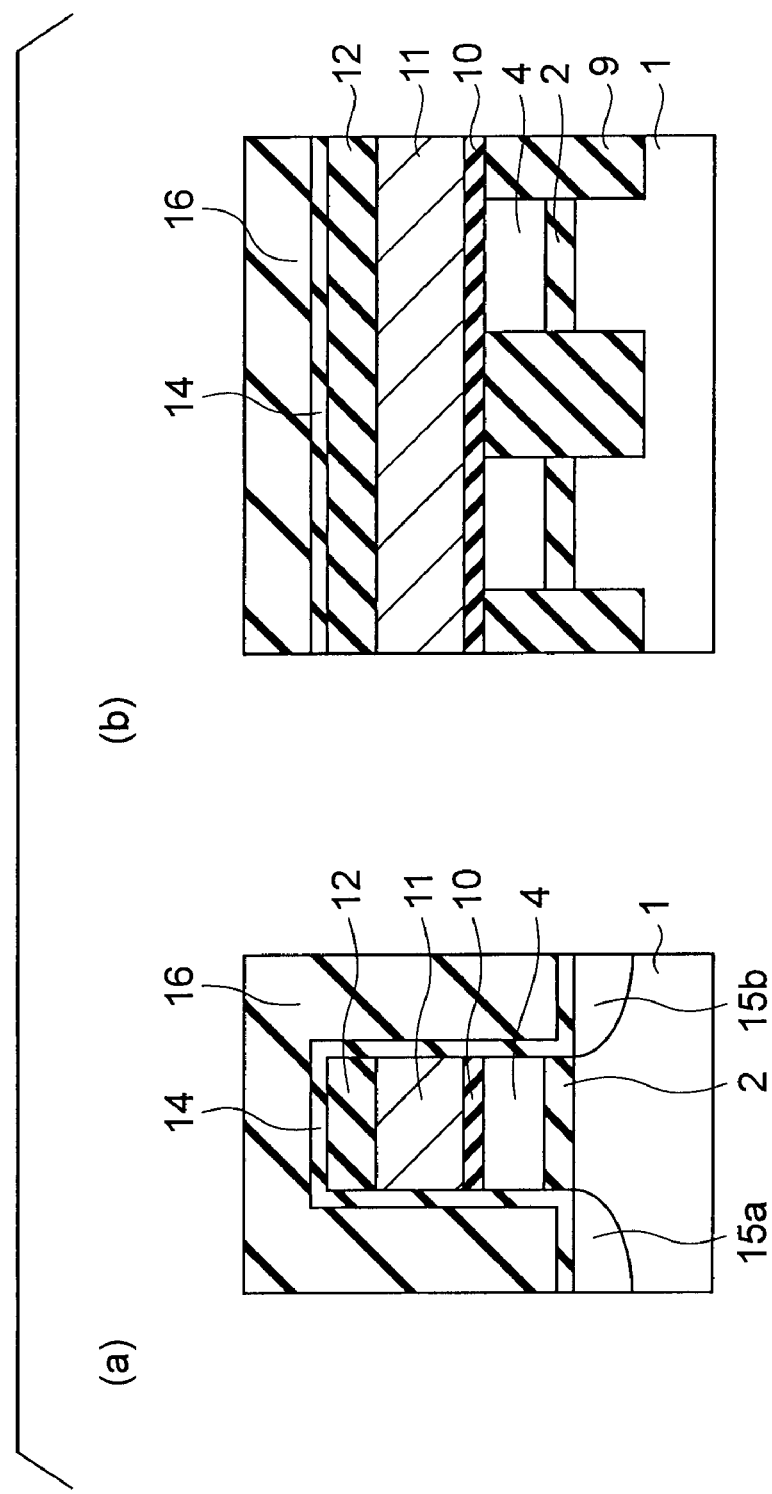
Figure 5:
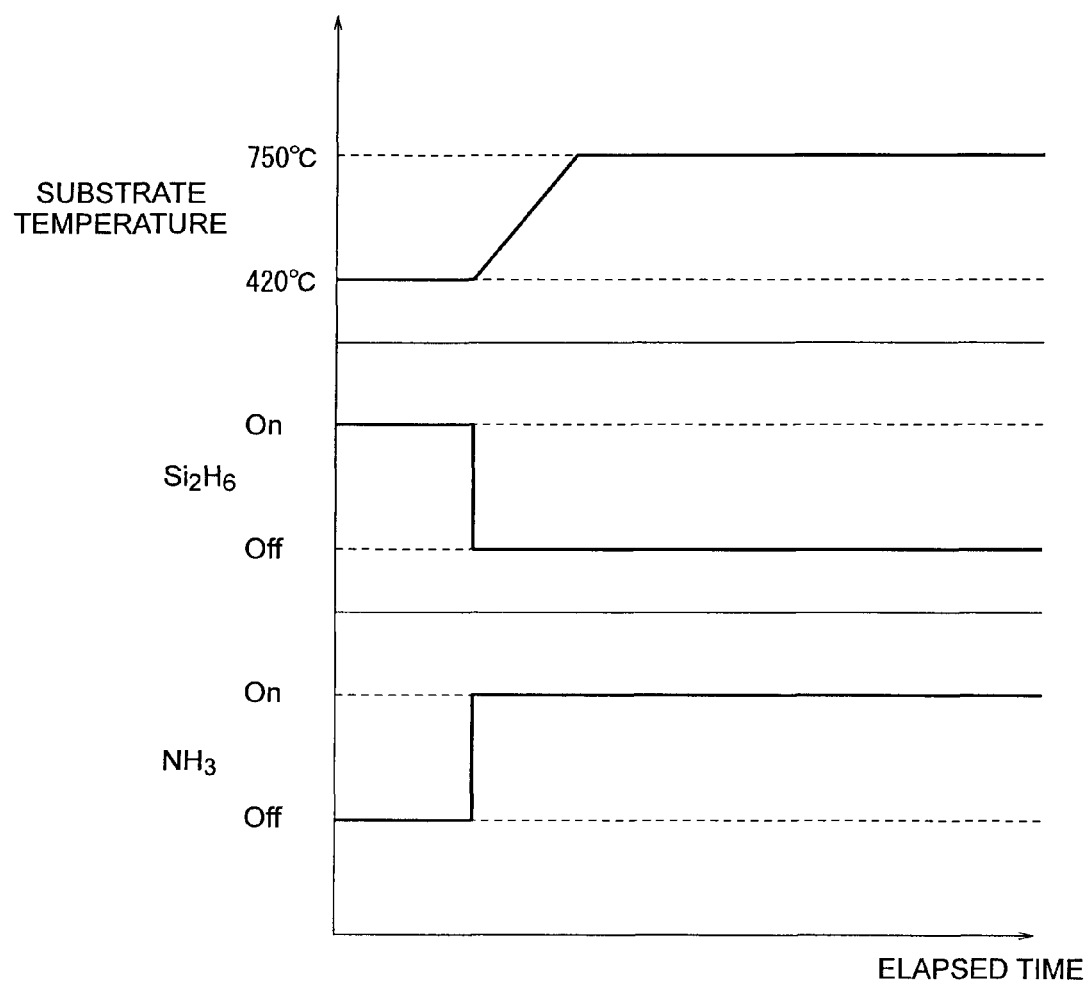
FIG. 5 shows the conditions for manufacturing the charge storage film of the first embodiment.

With the use of a disilane gas ($Si_2H_6$), a 2-nm thick amorphous silicon layer is deposited on the silicon oxide film 2. At this point, it is preferable that the temperature of the silicon substrate 1 is 550° C. or lower. In this embodiment, the temperature of the silicon substrate 1 is 420° C., for example. The atmosphere in the chamber is then turned into a mixed atmosphere of a $N_2$ gas of 30 Torr in partial pressure and a $NH_3$ gas of 0.03 Torr in partial pressure, for example. The surface of the silicon substrate 1 is changed to 750° C., and is maintained at that temperature for 100 seconds. In this manner, nitrogen is diffused into the amorphous silicon layer, so that an amorphous silicon layer 4a having nitrogen added thereto is formed, and a silicon nitride layer 4b is formed on the amorphous silicon layer 4a. Thus, a charge storage film 4 having a stack structure formed with the amorphous silicon layer 4a and the silicon nitride layer 4b is formed. Here, the silicon nitride layer 4b is a layer that extends in the in-plane direction, and has a structure that includes three-coordinate nitrogen bonds and has a nitrogen atom as at least one of the second-nearest neighbors of nitrogen. Here, a three-coordinate nitrogen bond is a bond of one nitrogen atom with three silicon atoms. FIG. 5 shows the timing charts of the temperature of the silicon substrate, the supply of the disilane gas ($Si_2H_6$), and the supply of the $NH_3$ gas during the process for forming the charge storage film 4.

A mask material 6 to be used for the device isolation process is deposited on the charge storage film 4 by CVD (Chemical Vapor Deposition) (FIGS. 2(a) and 2(b)). After that, etching is successively performed on the mask material 6, the charge storage film 4, and the tunnel insulating film 2 by RIE (Reactive Ion Etching) using a resist mask (not shown), so as to expose a part of the surface of the silicon substrate 1. Etching is further performed on the exposed region of the silicon substrate 1, so as to form device isolation grooves 8 of 100 nm in depth, as shown in FIG. 2(b). After that, the resist mask is removed.

A silicon oxide film 9 for device isolation is then deposited on the entire surface, so as to completely fill the device isolation grooves 8. The portions of the silicon oxide film 9 existing on the surface are then removed by CMP (Chemical Mechanical Polishing), so that the surface of the silicon oxide film 9 is flattened. At this point, the mask material 6 becomes exposed (FIGS. 2(c) and 2(d)).

After the exposed mask material 6 is selectively removed by etching, the exposed portions of the silicon oxide film 9 on the surface are removed by etching with the use of a diluted hydrofluoric acid solution. An alumina layer of 15 nm in thickness is then deposited on the entire surface by ALD (Atomic Layer Deposition). At this point, the silicon nitride layer 4b in contact with the alumina layer is oxidized by the oxidant used for the film formation by ALD. As a result, a very thin silicon oxynitride layer is formed, and a 16-nm thick block insulating film 10 having a two-layer structure of the silicon oxynitride layer and the alumina layer is formed (FIGS. 3(a) and 3(b)).

A polycrystalline silicon layer and a tungsten silicide layer are then successively deposited by CVD, so that a 100-nm thick conductive film 11 having a two-layer structure of the polycrystalline layer and the tungsten silicide layer is formed as a control gate electrode. Further, a mask material 12 for RIE is deposited by CVD. After that, etching is successively performed on the mask material 12, the conductive film 11, the block insulating film 10, the charge storage film 4, and the tunnel insulating film 2 by RIE with the use of a resist mask (not shown), so as to form grooves 13 extending in the word line direction (FIGS. 3(c) and 3(d)). In this manner, the shapes of the charge storage film 4 and the control gate electrode 11 are defined.

Lastly, a silicon oxide film 14 that is an electrode sidewall oxide film is formed on the exposed faces of the mask material 12, the conductive film 11, the block insulating film 10, the charge storage film 4, and the tunnel insulating film 2 by a thermal oxidation technique. Source/drain regions 15a and 15b are then formed by an ion implantation technique, and an interlayer insulating film 16 is formed to cover the entire surface by CVD (FIGS. 4(a) and 4(b)). After that, wiring layers and the likes are formed by a known technique, so as to complete a nonvolatile semiconductor memory device.

The MONOS structure formed by adding nitrogen to amorphous silicon to form the charge storage film, and forming the silicon nitride layer above the charge storage film at the same time is characterized in having excellent capture characteristics and retention characteristics, as the amorphous silicon restricts nitrogen diffusion into the tunnel insulating film 2, and the silicon nitride layer 4b restricts oxygen diffusion into the charge storage film 4 at the time of the formation of the block insulating film 10. Also, in a case where the block insulating film formed on the charge storage film does not contain oxygen, and the control gate electrode provided on the block insulating film is made of a conductive material such as an oxide conductive material containing oxygen as described in this embodiment, oxygen diffusion from the control gate electrode through the block insulating film can be minimized, as the charge storage film is a stack structure formed with the amorphous silicon layer having nitrogen added thereto and the first nitride silicon layer formed on the amorphous silicon layer.

Figure 6:
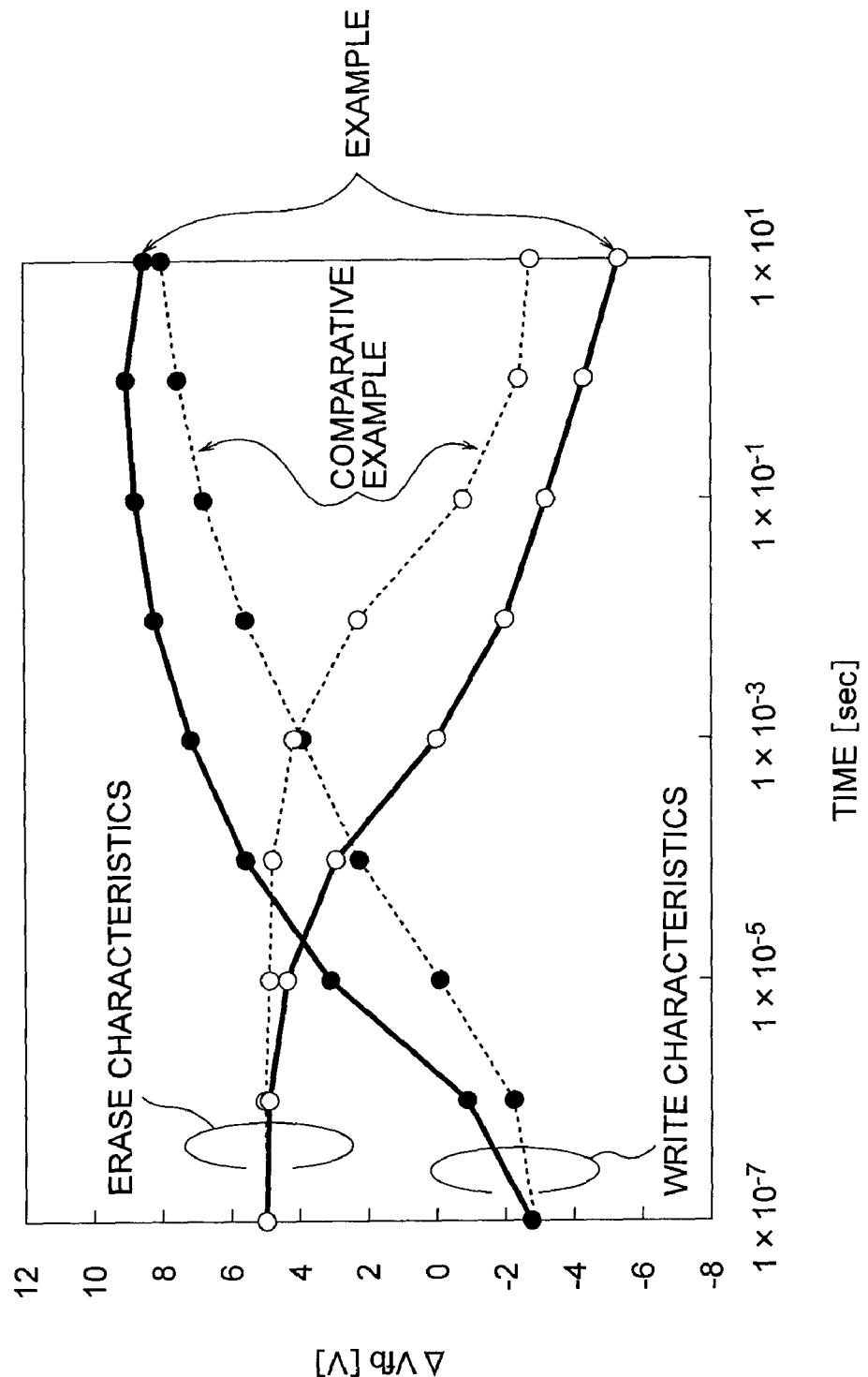
FIG. 6 shows the write/erase characteristics of the memory device manufactured according to the manufacture method of the first embodiment.
Figure 7:
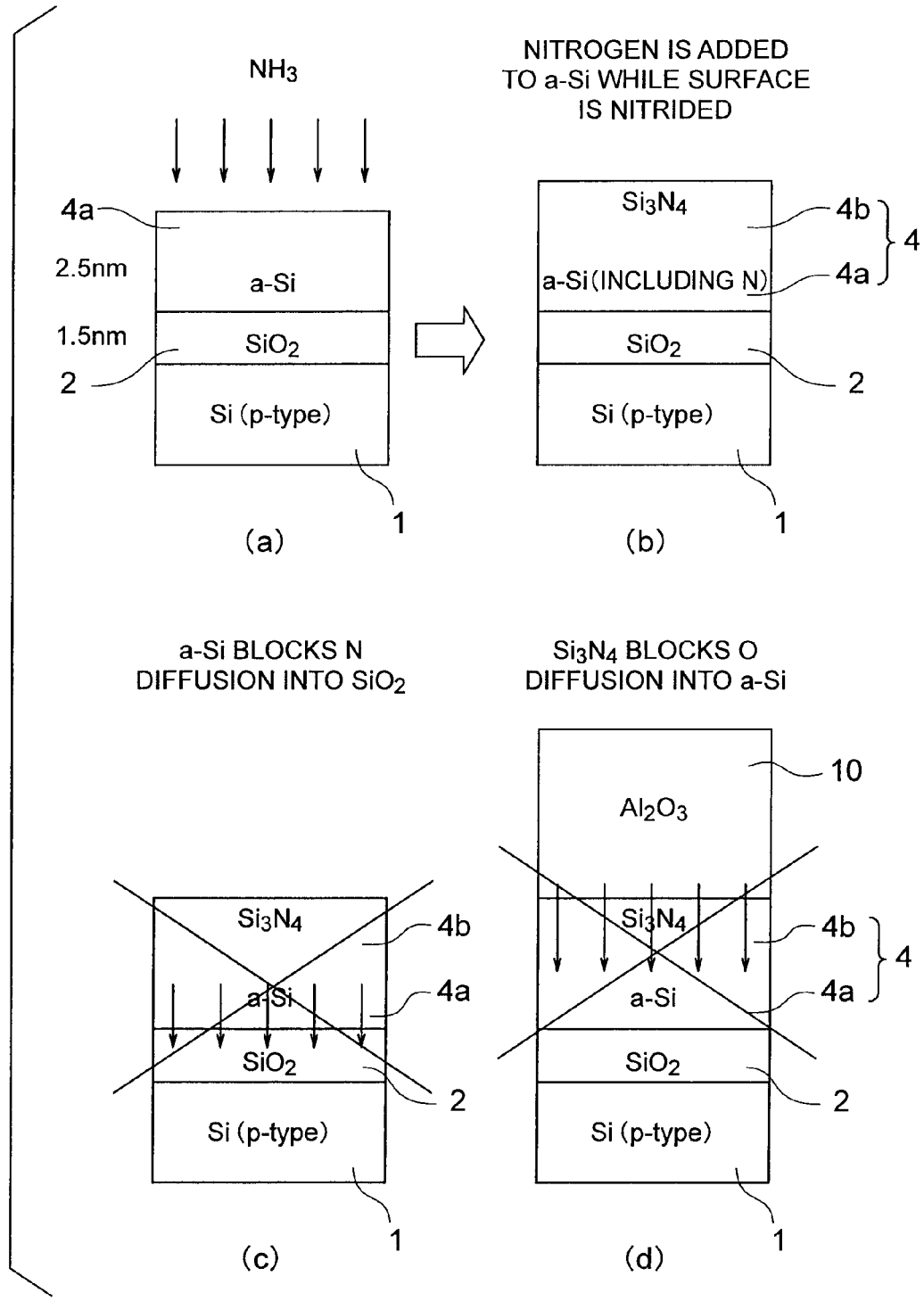
FIGS. 7(a) to 7(d) illustrate the effects of the manufacture method according to the first embodiment.

As an example of this embodiment, a nonvolatile semiconductor memory device is formed according to the method by which amorphous silicon provided on an insulating film is nitrided, and the charge storage film 4 of a stack structure formed with the amorphous silicon layer 4a having nitrogen added thereto and the silicon nitride layer 4b is formed. As a comparative example, a nonvolatile semiconductor memory device is formed according to a method by which a silicon nitride film to be the charge storage film is deposited directly on an insulating film. FIG. 6 shows the write and erase characteristics of the example and the comparative example. In FIG. 6, the abscissa axis indicates the time, and the ordinate axis indicates the shift amount $\Delta Vfb$ of the flat band voltage. As can be seen from FIG. 6, the write and erase characteristics of this example improve compared with the comparative example. In other words, more efficient charge injection can be performed, and higher charge capture density is achieved in this example than in the comparative example. In this example, the amorphous silicon (denoted by a-Si in the drawings) exists between the silicon nitride layer 4b and the tunnel insulating film 2 made of $SiO_2$, as shown in FIGS. 7(a) and 7(b). Accordingly, nitrogen diffusion into the tunnel insulating film 2 is restricted, and generation of a trap source in the tunnel insulating film 2 is prevented accordingly, as shown in FIG. 7(c). Thus, high injection efficiency can be achieved. Also, as the silicon nitride layer 4b exists between the block insulating film 10 made of alumina and the charge storage film 4, oxygen diffusion into the charge storage film 4 at the time of the formation of the block insulating film 10 can be restricted, as shown in FIG. 7(d). Thus, high charge capture density can be maintained.

Figure 8:
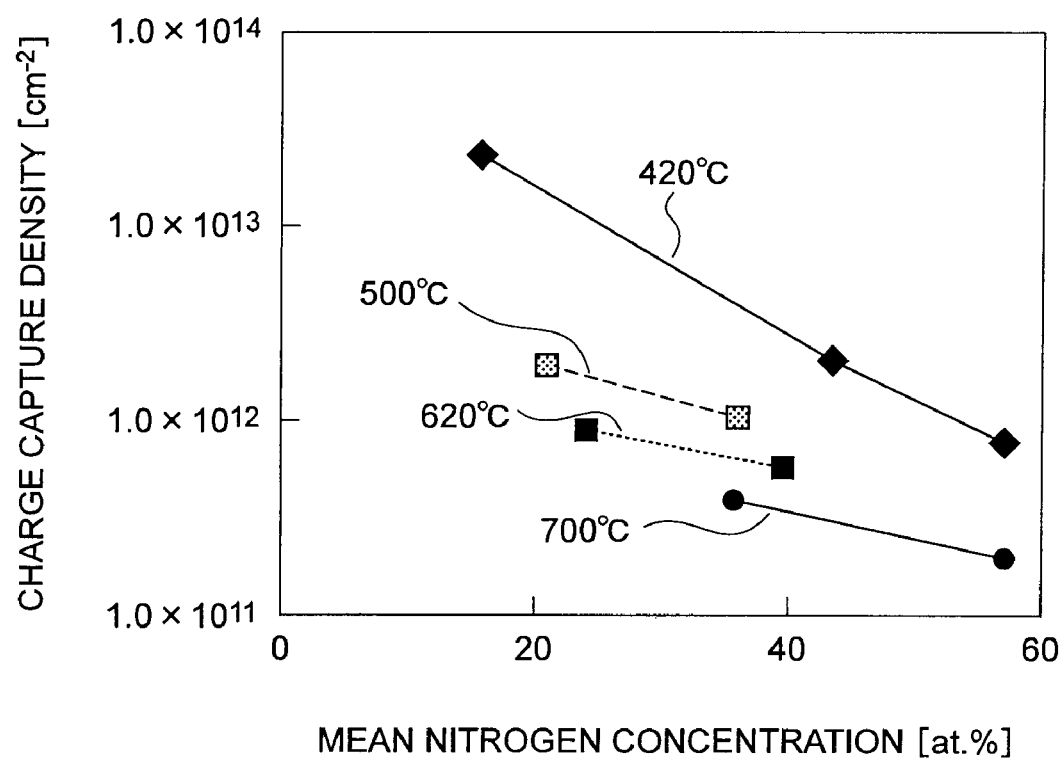
FIG. 8 shows the relationship between the in-film mean nitrogen concentration and the charge capture density where the silicon deposition temperature is varied.

When nitrogen is added so as to form the amorphous silicon layer 4a, attention should be paid to the deposition temperature of the amorphous silicon and the nitrogen concentration in the amorphous silicon. FIG. 8 shows the relationship between the mean nitrogen concentration in the amorphous silicon and the charge capture density, with the deposition temperature of the amorphous silicon being the parameter. As can be seen from FIG. 8, the charge capture density is increased by lowering the deposition temperature of the amorphous silicon and reducing the nitrogen concentration. This is because, when the deposition temperature of the amorphous silicon is low, the crystals in the amorphous silicon do not easily grow, and form an amorphous silicon structure containing a large number of defects, resulting in higher charge capture density. Also, when the deposition temperature of the amorphous silicon is low, a large amount of hydrogen is contained in the silicon. The hydrogen in the silicon later detaches from the a-Si and generates new defects at the time of nitriding. In view of this, the deposition temperature of the amorphous silicon should be such a temperature that the amorphous silicon can be deposited while containing hydrogen. More specifically, it is preferable that the deposition temperature is 500° C. or lower at which hydrogen is not easily desorbed, and the hydrogen concentration observed at the time of deposition is $1 \times 10^{21}$ $cm^{-3}$ or higher.

It is preferable that the temperature at which nitrogen is added (the nitriding temperature) is such a temperature that the defect density in the amorphous silicon does not become lower, and nitriding is caused. More specifically, the nitriding temperature should be 800° C. or lower. If it is higher than 800° C., not only the defect density becomes lower, but also aggregation of a nitride film is caused. As a result, the variation of the charge capture density becomes wider. The nitrogen partial pressure should preferably be low, so as to reduce the nitriding rate and increase the time controllability over the nitrogen concentration. More particularly, it is preferable that the nitrogen partial pressure is 50 Torr or lower.

Figure 9:
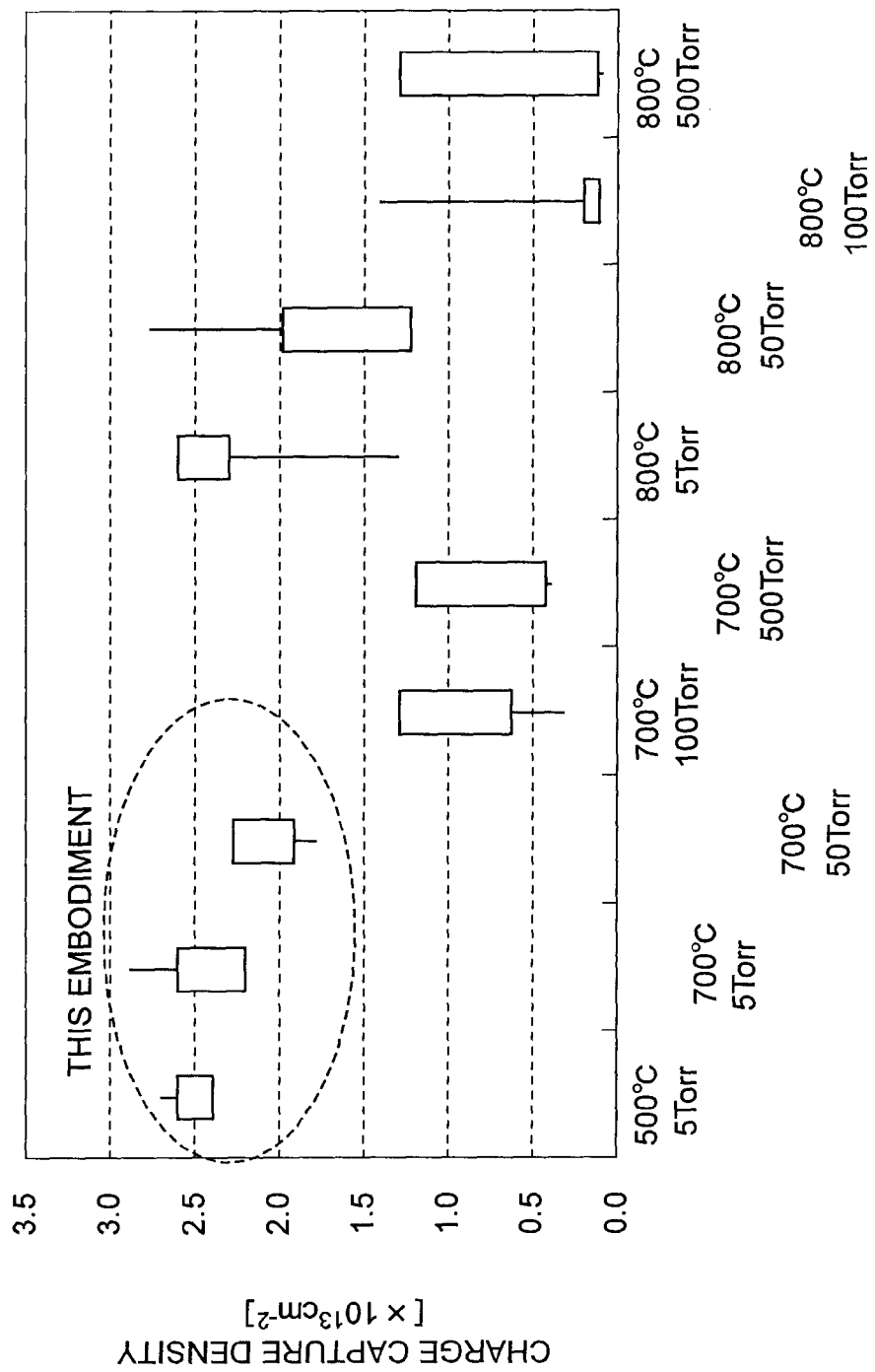
FIG. 9 shows the relationship between the conditions for the nitrogen addition to amorphous silicon and the variation of the in-plane charge capture density.

FIG. 9 shows the in-plane variation of the charge capture density observed in a case where a fixed nitrogen amount of 20 atomic % is added while the nitriding temperature and the nitrogen partial pressure are varied. As can be seen from FIG. 9, by restricting the nitriding temperature to 800° C. or lower, and restricting the nitrogen partial pressure to 50 Torr or lower, the in-plane variation can be made smaller while high charge capture density is maintained.

This is because, when the nitriding temperature and the nitrogen partial pressure are high, the nitriding rate is high, and a silicon nitride film is promptly formed on the surface of the amorphous silicon. Accordingly, diffusion of the nitriding species is restricted, and the variation of the nitrogen distribution in the amorphous silicon becomes larger.

On the other hand, when the nitriding temperature and the nitrogen partial pressure are low, the nitriding rate becomes lower, and nitrogen can be efficiently added into the amorphous silicon. Accordingly, a structure having high charge capture density and a small variation can be formed.

Figure 10:
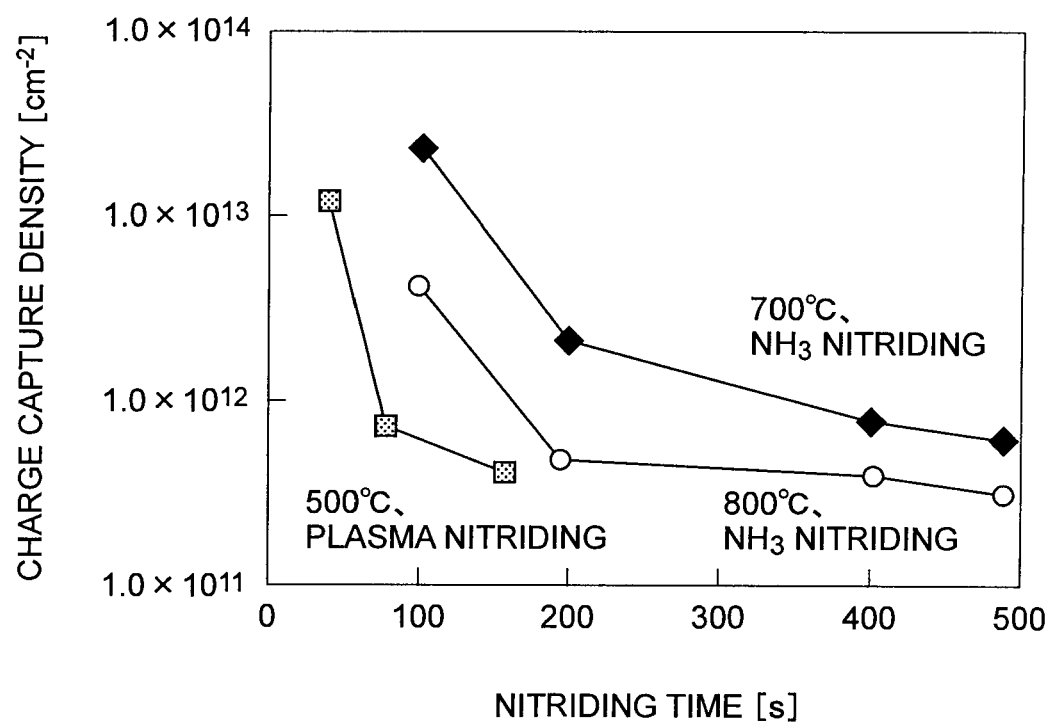
FIG. 10 shows the relationship between the condition for the nitrogen addition to amorphous silicon and the charge capture density.

Regardless of the nitriding temperature and the nitrogen partial pressure, it is preferable that the nitriding time is 400 seconds or shorter. Furthermore, it is preferable to select an optimum nitriding time range for each temperature, since the preferred nitriding time varies with temperature. FIG. 10 shows the relationship between the amorphous silicon nitriding time and the charge capture density in a case where the nitriding temperature is at 500° C., 700° C., or 800° C. When the nitriding temperature is 500° C., plasma nitriding is performed. When the nitriding temperature is 700° C. or 800° C., nitriding is performed with the use of a $NH_3$ gas. As can be seen from FIG. 10, the charge capture density becomes lower as the nitriding time becomes longer. On the other hand, the charge capture density is made higher by setting the nitriding time at 100 seconds or shorter for the 500° C. nitriding, at 200 seconds or shorter for the 800° C. nitriding, and at 400 seconds or shorter for the 700° C. nitriding. This is because the amorphous silicon is completely nitrided and turned into an insulating material if the nitriding time is long. Also, since the tunnel insulating film located under the amorphous silicon is nitrided by the nitrogen penetrating through the amorphous silicon, the characteristics are degraded. In this aspect, long-time nitriding is not preferable.

Although $Si_2H_6$ is used as the gas when the amorphous silicon is deposited in this embodiment, any gas that allows deposition of amorphous silicon such as $SiH_4$ or $SiH_2Cl_2$ may be used.

Although $NH_3$ is used as the gas when the amorphous silicon is nitrided in this embodiment, any nitriding gas such as NO, N radical, NH radical, $N_2$ radical, N plasma, NH plasma, or $N_2$ plasma may be used, not limited to $NO_3$.

Although $Al_2O_3$ is used for the block insulating film in this embodiment, any material that can prevent charge escape from the charge storage film may be used, and it is also preferable to use $SiO_2$ or LaAlO, instead of $Al_2O_3$. Alternatively, a high-k film made of HfSiO, HfAlO, LaAlSiO, LaHfO, or the like may be used.

As described above, in accordance with this embodiment, nitriding of the lower-layer insulating film can be prevented, and oxygen diffusion from the upper-layer insulating film can be restricted. Thus, the decrease in charge capture density can be minimized.

Second Embodiment

Figure 11:
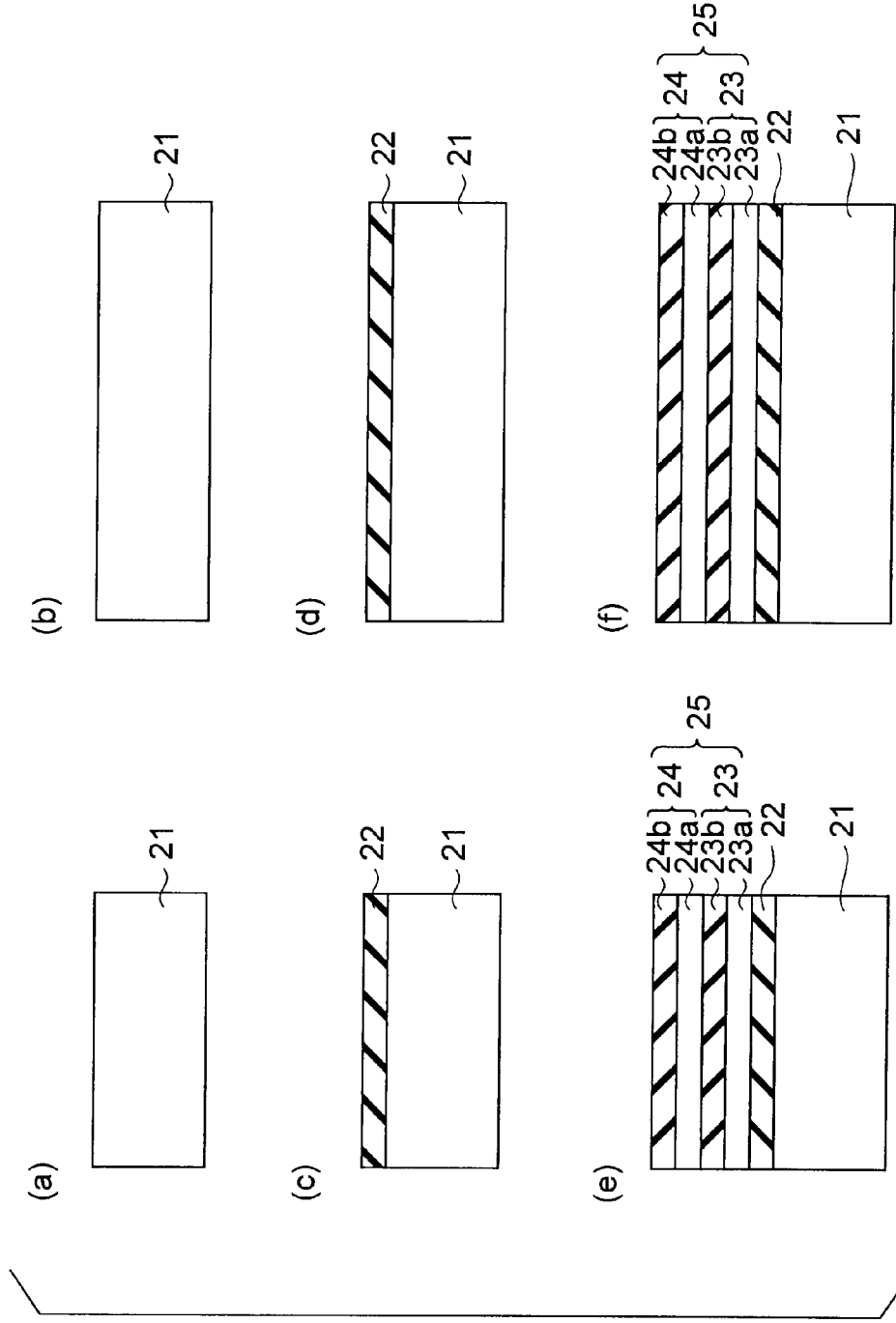

Next, a method for manufacturing a semiconductor memory device in accordance with a second embodiment is described. A semiconductor memory device to be manufactured by the manufacture method of this embodiment is a MONOS nonvolatile semiconductor memory device, and includes memory cells. Referring to FIGS. 11(*a*) through 14(*b*), the method for manufacturing the nonvolatile semiconductor memory device of this embodiment is described. FIGS. 11(*a*) through 14(*b*) are cross-sectional views illustrating the manufacture procedures according to the manufacture method of this embodiment. FIGS. 11(*a*), 11(*c*), 11(*e*), 12(*a*), 12(*c*), 13(*a*), 13(*c*), and 14(*a*) show cross sections perpendicular to the cross sections shown in FIGS. 11(*b*), 11(*d*), 11(*f*), 12(*b*), 12(*d*), 13(*b*), 13(*d*), and 14(*b*), respectively. The manufacture method of this embodiment is the same as the method of the first embodiment, except that the formation of a charge storage film is carried out twice in a row.

First, as shown in FIGS. 11(*a*) and 11(*b*), a silicon substrate 21 doped with desired impurities is subjected to a diluted HF treatment, so that the surface of the silicon substrate 21 is terminated by hydrogen. The silicon substrate 21 is then placed in the chamber of a film forming device. The atmosphere in the chamber is then filled only with a gas (such as a nitrogen gas) that does not react with silicon or does not etch silicon during the manufacturing process. After that, the temperature of the silicon substrate 21 is increased to 700° C., so as to completely remove hydrogen from the silicon substrate 21.

The atmosphere in the chamber is turned into a mixed gas atmosphere of a $N_2$ gas of 30 Torr in partial pressure and an $O_2$ gas of 3 Torr in partial pressure, for example. The surface of the silicon substrate 21 is increased to 1050° C., and is maintained at that temperature for 50 seconds. In this manner, a silicon oxide film 22 is formed on the silicon substrate 21, as shown in FIGS. 11(*c*) and 11(*d*).

With the use of a disilane gas, a 2-nm thick amorphous silicon layer 23*a* is deposited on the silicon oxide film 22 (FIGS. 11(*e*) and 11(*f*)). At this point, it is preferable that the temperature of the silicon substrate 21 is 550° C. or lower. In this embodiment, the temperature of the silicon substrate 21 is 420° C., for example. The atmosphere in the chamber is then turned into a mixed gas atmosphere of a $N_2$ gas of 30 Torr in partial pressure and a $NH_3$ gas of 0.03 Torr in partial pressure, for example. The surface of the silicon substrate 21 is changed to 750° C., and is maintained at that temperature for 100 seconds. In this manner, nitrogen is diffused into the amorphous silicon layer 23*a*, so that the amorphous silicon layer 23*a* having nitrogen added thereto is formed, and a silicon nitride layer 23*b* is formed on the amorphous silicon layer 23*a*. Thus, a first charge storage layer 23 having a stack structure formed with the amorphous silicon layer 23*a* and the silicon nitride layer 23*b* is formed. Here, the silicon nitride layer 23*b* is a layer that extends in the in-plane direction, and has a structure that includes three-coordinate nitrogen bonds and has a nitrogen atom as at least one of the second-nearest neighbors of nitrogen. The timing charts of the temperature of the silicon substrate, the supply of the disilane gas ($Si_2H_6$), and the supply of the $NH_3$ gas during the process for forming the first charge storage layer 23 are the same as the timing charts of the first embodiment shown in FIG. 5.

With the use of a disilane gas, another 2-nm thick amorphous silicon layer 24*a* is deposited on the silicon nitride layer 23*b* (FIGS. 11(*e*) and 11(*f*)). At this point, it is preferable that the substrate temperature is 550° C. or lower. In this embodiment, the temperature of the silicon substrate 21 is 420° C., for example. The atmosphere in the chamber is then turned into a mixed gas atmosphere of a $N_2$ gas of 30 Torr in partial pressure and a $NH_3$ gas of 0.03 Torr in partial pressure, for example. The surface of the silicon substrate 21 is adjusted to 750° C., and is maintained at that temperature for 100 seconds. In this manner, nitrogen is diffused into the amorphous silicon layer 24*a*, so that the amorphous silicon layer 24*a* having nitrogen added thereto is formed, and a silicon nitride layer 24*b* is formed on the amorphous silicon layer 24*a*. Thus, a second charge storage layer 24 having a stack structure formed with the amorphous silicon layer 24*a* and the silicon nitride layer 24*b* is formed. Here, the silicon nitride layer 24*b* is a layer that extends in the in-plane direction, and has a structure that includes three-coordinate nitrogen bonds and has a nitrogen atom as at least one of the second-nearest neighbors of nitrogen. The two-layer stack film formed with the first charge storage layer 23 and the second charge storage layer 24 serves as a charge storage film 25. The timing charts of the temperature of the silicon substrate, the supply of the disilane gas ($Si_2H_6$), and the supply of the $NH_3$ gas during the process for forming the second charge storage layer 24 are the same as the timing charts of the first embodiment shown in FIG. 5.

Figure 12:
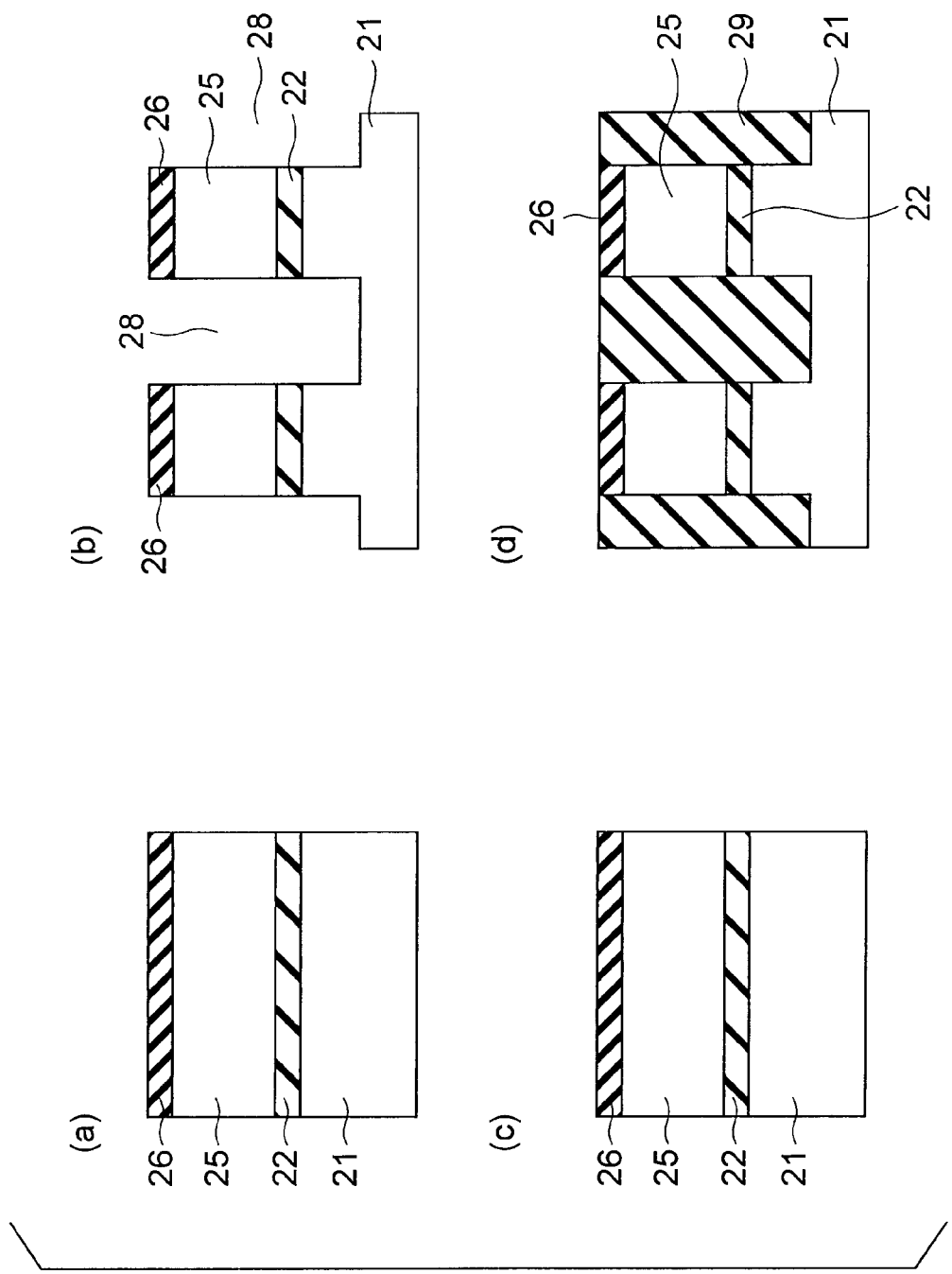

A mask material 26 to be used for the device isolation process is deposited on the charge storage film 25 by CVD (FIGS. 12(a) and 12(b)). After that, etching is successively performed on the mask material 26, the charge storage film 25, and the tunnel insulating film 22 by RIE using a resist mask (not shown), so as to expose a part of the surface of the silicon substrate 21. Etching is further performed on the exposed region of the silicon substrate 21, so as to form device isolation grooves 28 of 100 nm in depth, as shown in FIG. 12(b). After that, the resist mask is removed.

A silicon oxide film 29 for device isolation is then deposited on the entire surface, so as to completely fill the device isolation grooves 28. The portions of the silicon oxide film 29 existing on the surface are then removed by CMP, so that the surface of the silicon oxide film 29 is flattened. At this point, the mask material 26 becomes exposed (FIGS. 12(c) and 12(d)).

Figure 13:
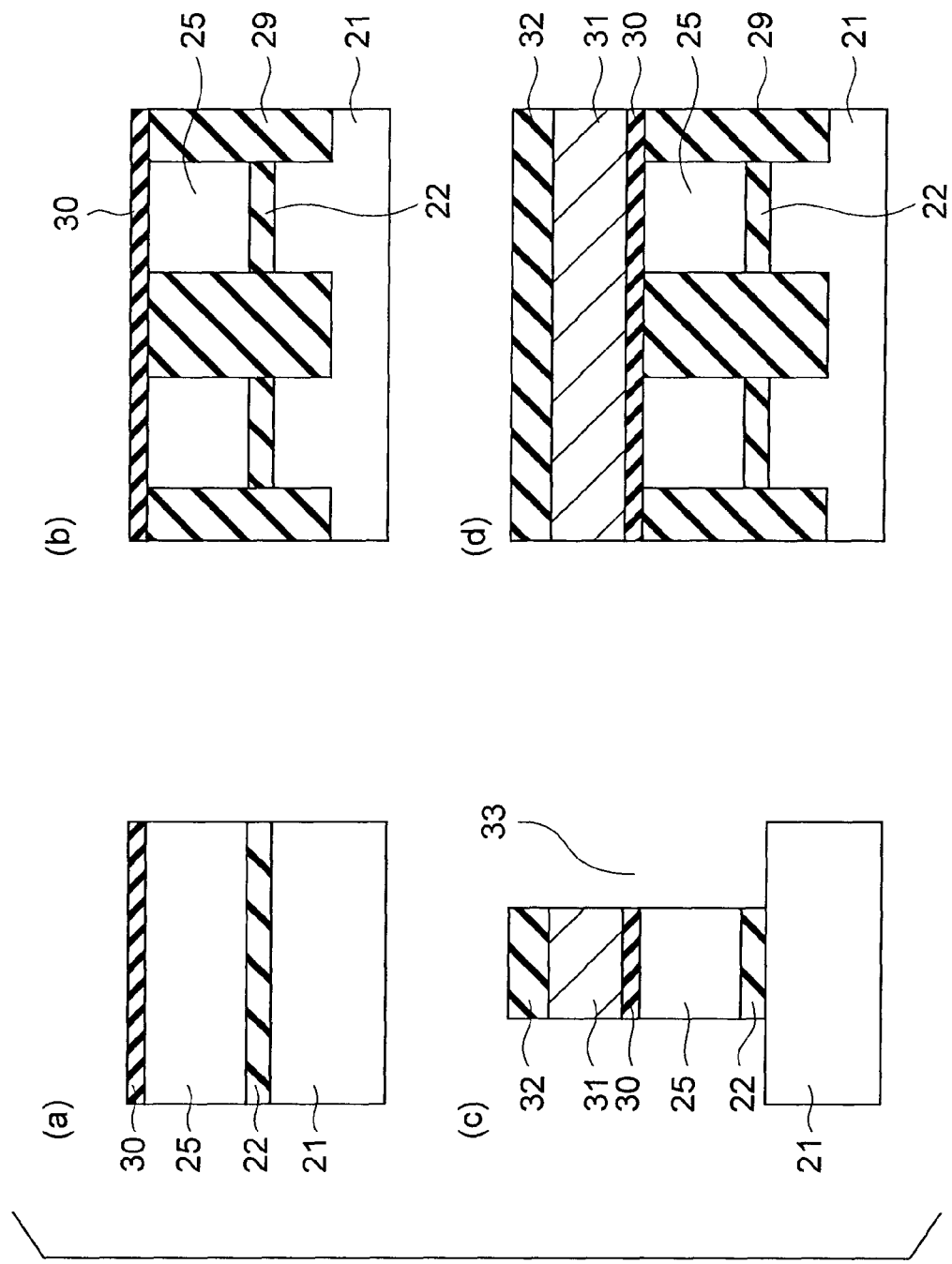

After the exposed mask material 26 is selectively removed by etching, the exposed portions of the silicon oxide film 29 on the surface are removed by etching with the use of a diluted hydrofluoric acid solution. An alumina layer of 15 nm in thickness is then deposited on the entire surface by ALD. At this point, the silicon nitride layer 24b (see FIGS. 11(e) and 11(f)) of the charge storage film 25 in contact with the alumina layer is oxidized by the oxidant used for the film formation by ALD. As a result, a very thin silicon oxynitride layer is formed, and a 16-nm thick block insulating film 30 having a two-layer structure of the silicon oxynitride layer and the alumina layer is formed (FIGS. 13(a) and 13(b)).

A polycrystalline silicon layer and a tungsten silicide layer are then successively deposited by CVD, so that a 100-nm thick conductive film 31 having a two-layer structure of the polycrystalline layer and the tungsten silicide layer is formed as a control gate electrode. Further, a mask material 32 for RIE is deposited on the conductive film 31 by CVD. After that, etching is successively performed on the mask material 32, the conductive film 31, the block insulating film 30, the charge storage film 25, and the tunnel insulating film 22 by RIE with the use of a resist mask (not shown), so as to form grooves 33 extending in the word line direction (FIGS. 13(c) and 13(d)). In this manner, the shapes of the charge storage film 25 and the control gate electrode 31 are defined.

Figure 14:
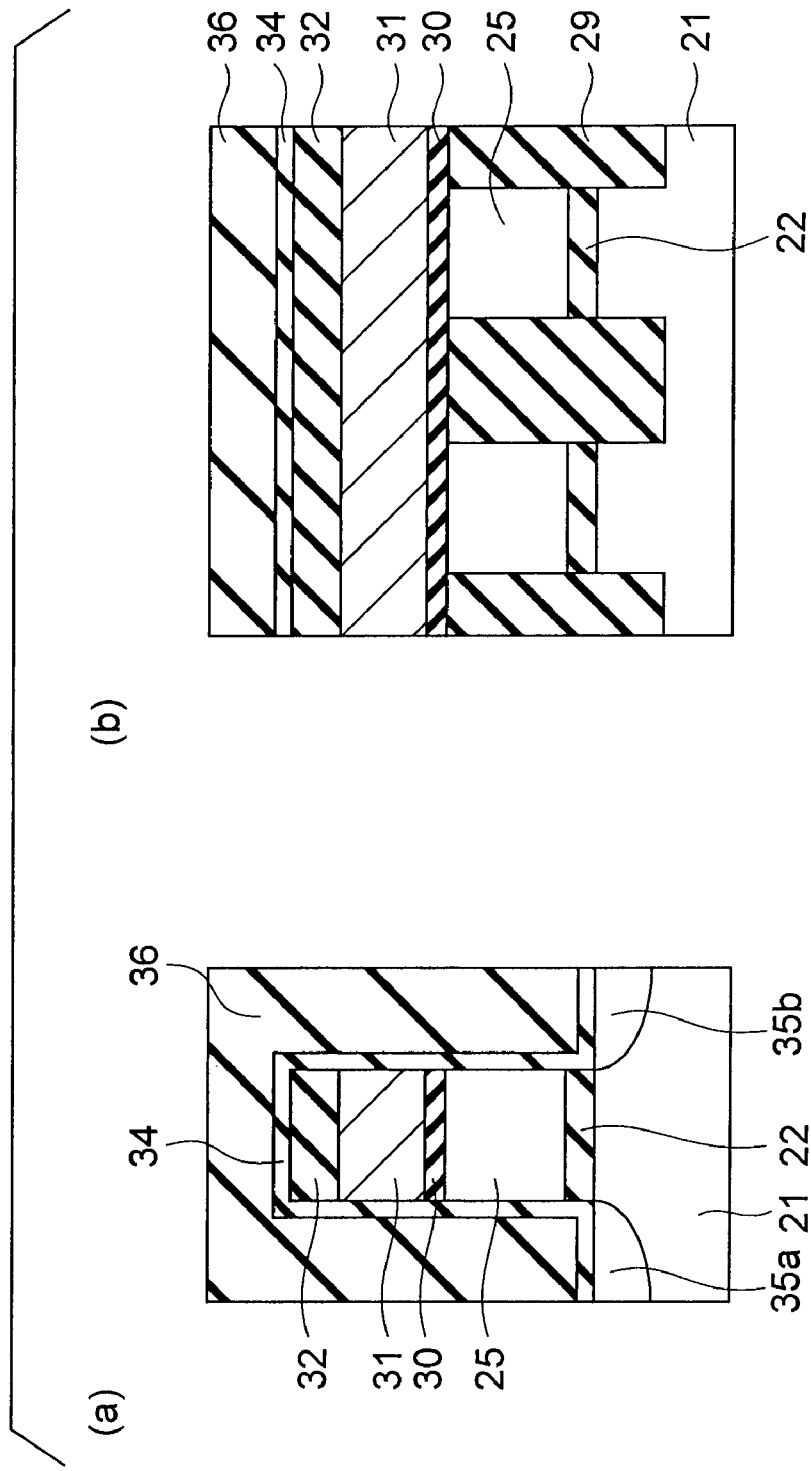

Lastly, a silicon oxide film 34 that is an electrode sidewall oxide film is formed on the exposed faces of the mask material 32, the conductive film 31, the block insulating film 30, the charge storage film 25, and the tunnel insulating film 22 by a thermal oxidation technique. Source/drain regions 35a and 35b are then formed by an ion implantation technique, and an interlayer insulating film 36 is formed to cover the entire surface by CVD (FIGS. 14(a) and 14(b)). After that, wiring layers and the likes are formed by a known technique, so as to complete a nonvolatile semiconductor memory device.

Figure 15:
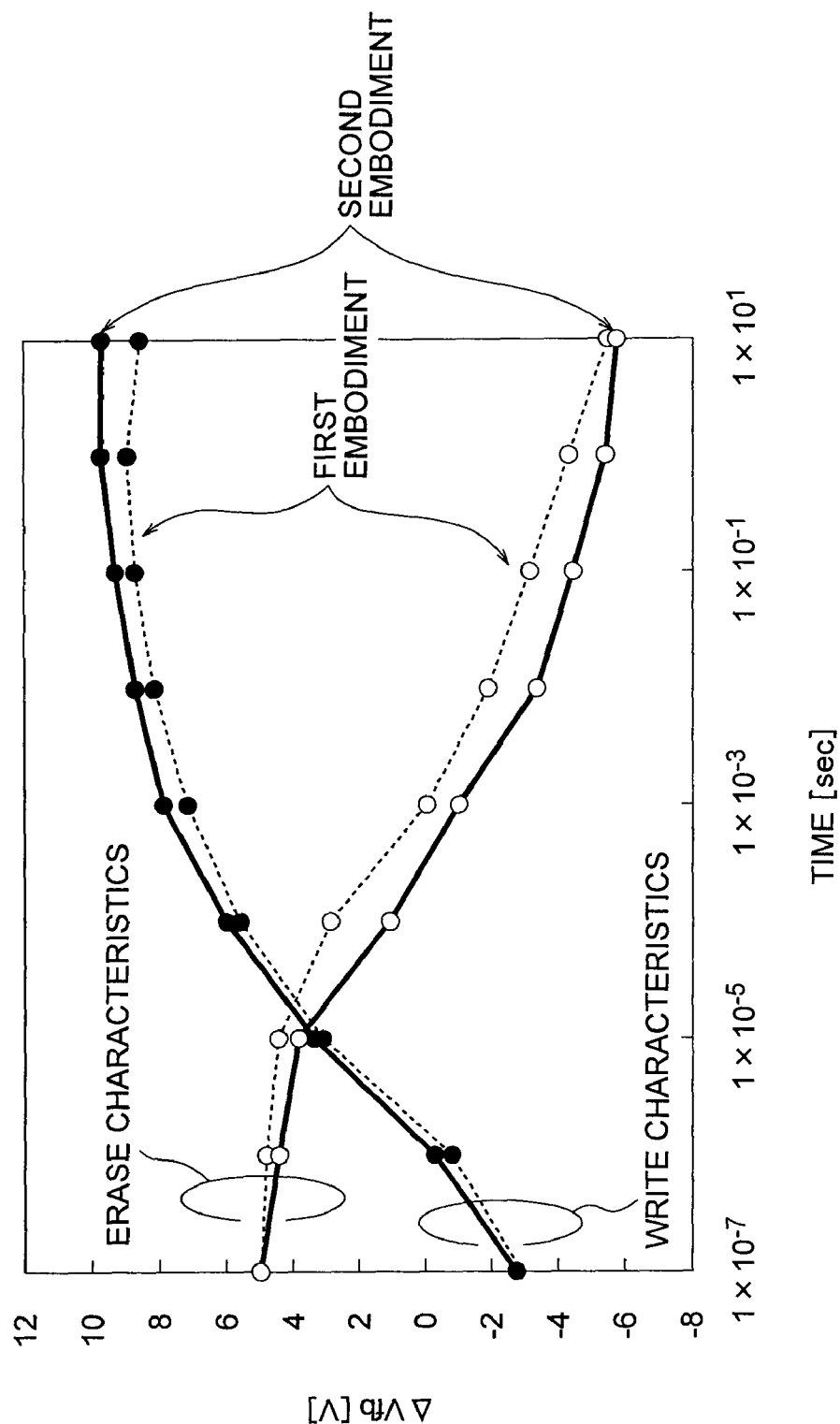
FIG. 15 shows the write/erase characteristics of the memory device manufactured according to the manufacture method of the second embodiment.
Figure 16:
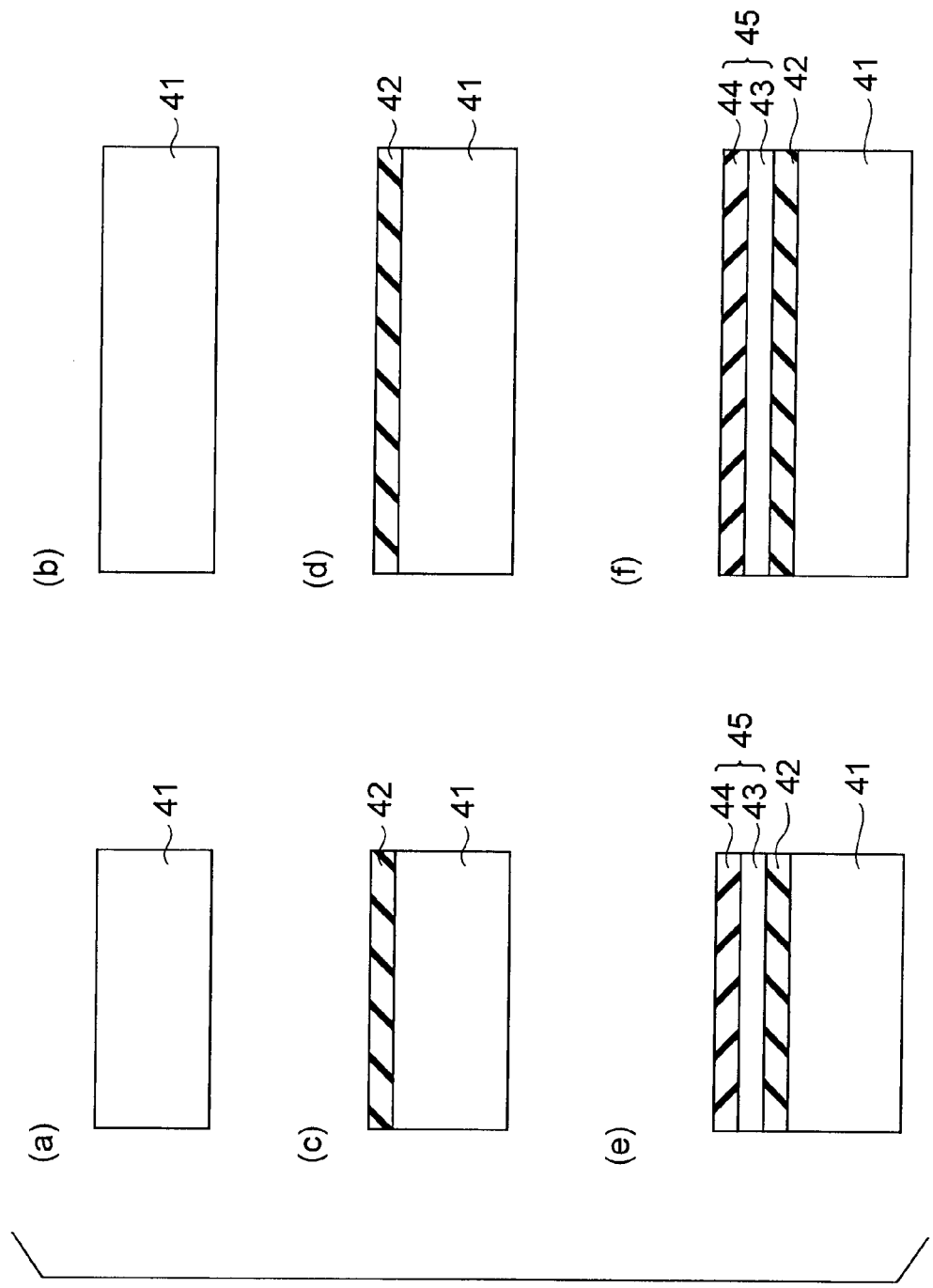
Figure 17:
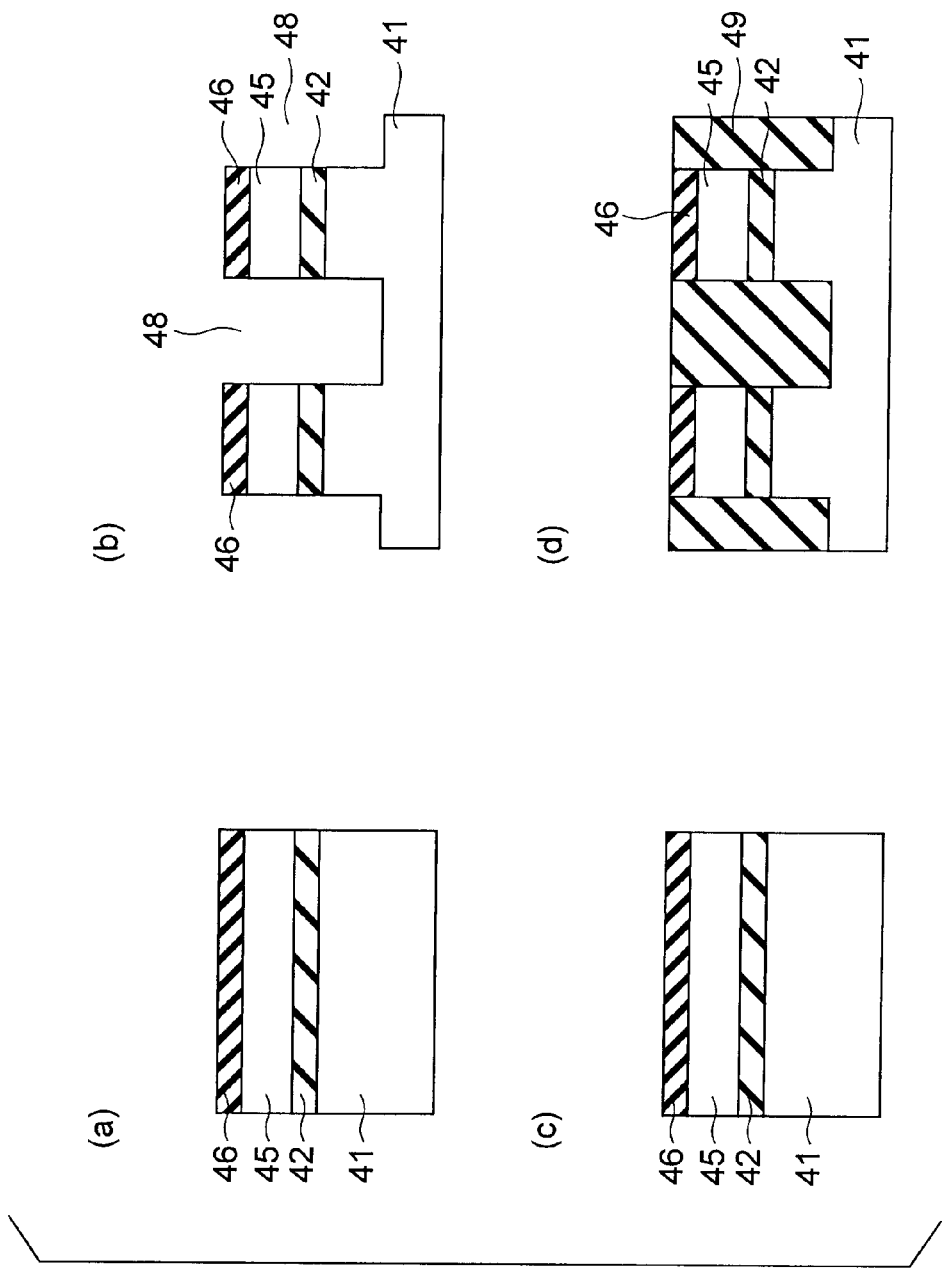
Figure 18:
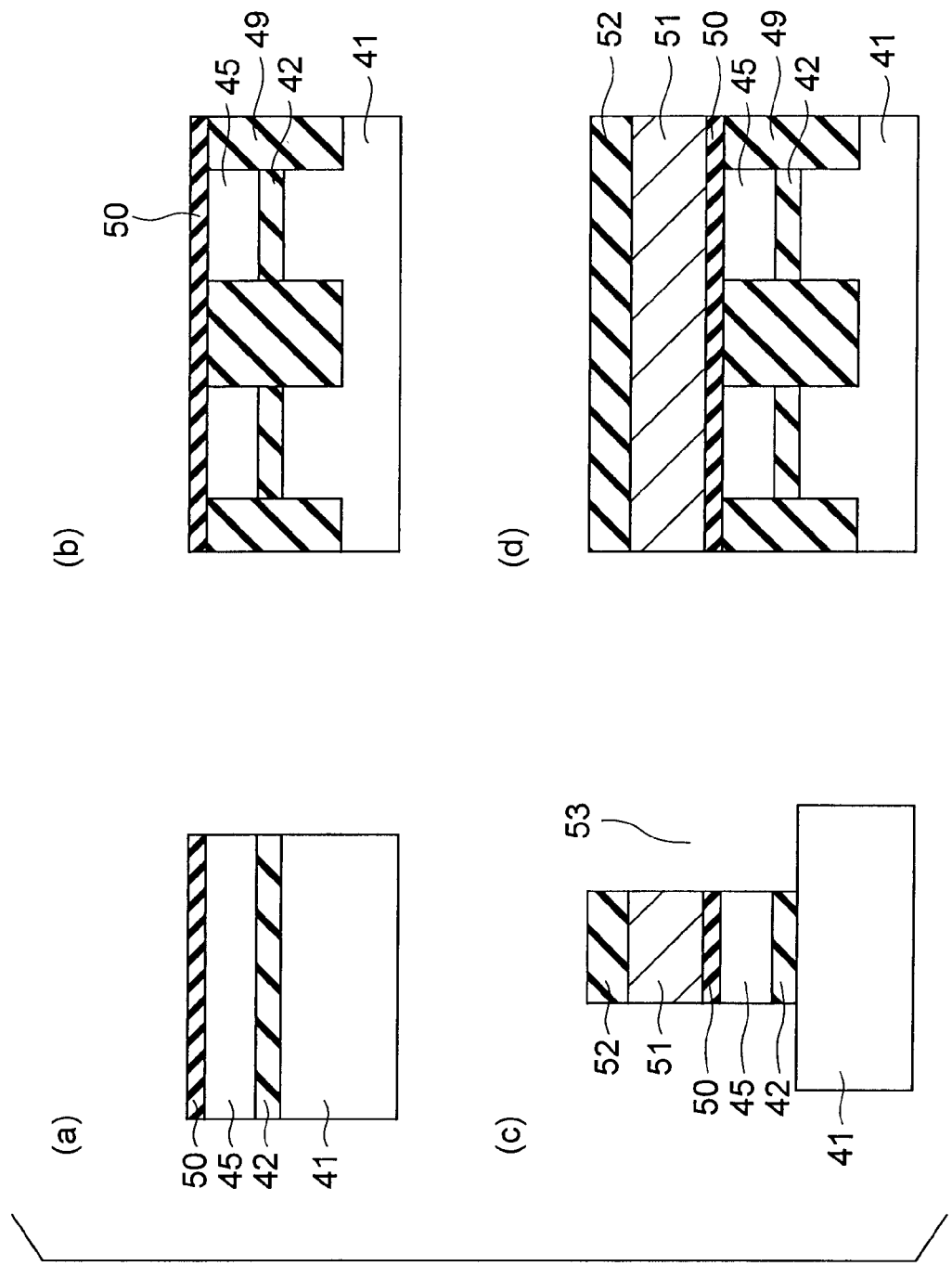
Figure 19:
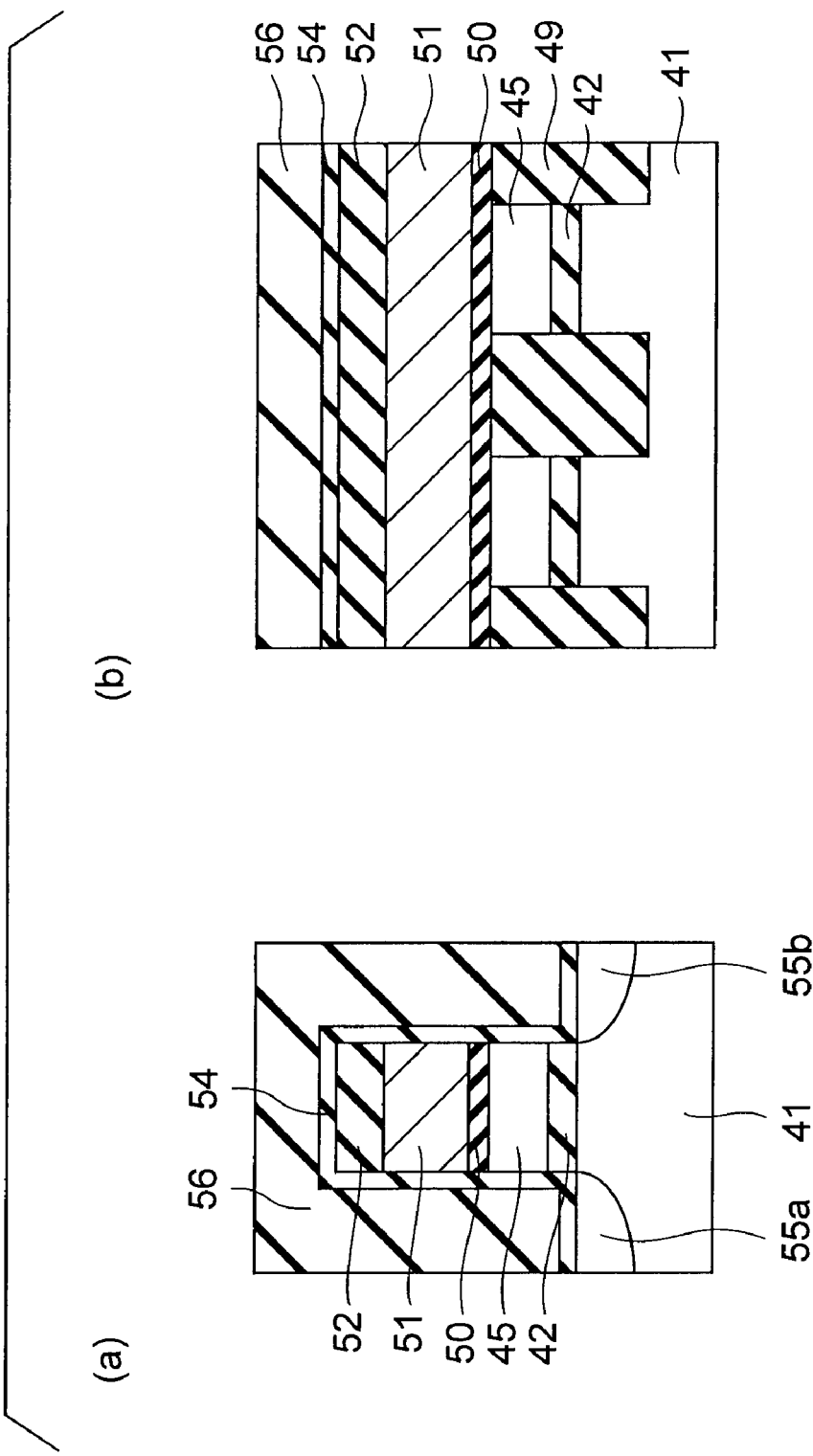

FIG. 15 shows the write and erase characteristics of a nonvolatile semiconductor memory device having a two-layer charge storage film formed with the first charge storage layer 23 and the second charge storage layer 24 as in this embodiment, and a nonvolatile semiconductor memory device having a single-layer charge storage film as in the first embodiment. As can be seen from FIG. 15, the write and erase characteristics of this embodiment are improved, compared with those of the first embodiment. This is because the electron and hole capture efficiency is higher where the thickness of the charge storage film is greater.

Although $Si_2H_6$ is used as the gas when the amorphous silicon is deposited in this embodiment, any gas that allows deposition of amorphous silicon such as $SiH_4$ or $SiH_2Cl_2$ may be used.

Although $NH_3$ is used as the gas when the amorphous silicon is nitrided in this embodiment, any nitriding gas such as NO, N radical, NH radical, $N_2$ radical, N plasma, NH plasma, or $N_2$ plasma may be used.

Although $Al_2O_3$ is used for the block insulating film in this embodiment, any material that can prevent charge escape from the charge storage film may be used, and it is also preferable to use $SiO_2$ or LaAlO, instead of $Al_2O_3$. Alternatively, a high-k film made of HfSiO, HfAlO, LaAlSiO, LaHfO, or the like may be used.

In this embodiment, the deposition and nitriding of amorphous silicon are repeated twice. However, the deposition and nitriding may be repeated three or more times. The number of times the deposition and nitriding are performed may be adjusted in accordance with the required film thickness of the charge storage film. In this manner, the charge capture efficiency can be made even higher. However, if the number of times the deposition and nitriding are performed becomes larger, the electric film thickness becomes greater. Therefore, it is necessary to adjust the number of times the deposition and nitriding are performed, in accordance with the total film thickness of the subject MONOS structure.

In this embodiment, nitriding of the lower-layer insulating film can be prevented, and oxygen diffusion from the upper-layer insulating film can be restricted. Thus, the decrease in charge capture density can be minimized as in the first embodiment.

Third Embodiment

Next, a method for manufacturing a nonvolatile semiconductor memory device in accordance with a third embodiment is described. A semiconductor memory device to be manufactured by the manufacture method of this embodiment is a MONOS nonvolatile semiconductor memory device, and includes memory cells. Referring to FIGS. 16(a) through 19(b), the method for manufacturing the nonvolatile semiconductor memory device of this embodiment is described. FIGS. 16(a) through 19(b) are cross-sectional views illustrating the manufacture procedures according to the manufacture method of this embodiment. FIGS. 16(a), 16(c), 16(e), 17(a), 17(c), 18(a), 18(c), and 19(a) show cross sections perpendicular to the cross sections shown in FIGS. 16(b), 16(d), 16(f), 17(b), 17(d), 18(b), 18(d), and 19(b), respectively.

First, as shown in FIGS. 16(a) and 16(b), a silicon substrate 41 doped with desired impurities is subjected to a diluted HF treatment, so that the surface of the silicon substrate 41 is terminated by hydrogen. The silicon substrate 41 is then placed in the chamber of a film forming device. The atmosphere in the chamber is then filled only with a gas (such as a nitrogen gas) that does not react with silicon or does not etch silicon during the manufacturing process. After that, the temperature of the silicon substrate 41 is increased to 700° C., so as to completely remove hydrogen from the silicon substrate 41.

The atmosphere in the chamber is turned into a mixed gas atmosphere of a $N_2$ gas of 30 Torr in partial pressure and an $O_2$ gas of 3 Torr in partial pressure, for example. The surface of the silicon substrate 41 is increased to 1050° C., and is maintained at that temperature for 50 seconds. In this manner, a silicon oxide film 42 to be a tunnel insulating film is formed on the silicon substrate 41, as shown in FIGS. 16(c) and 16(d).

Figure 20:
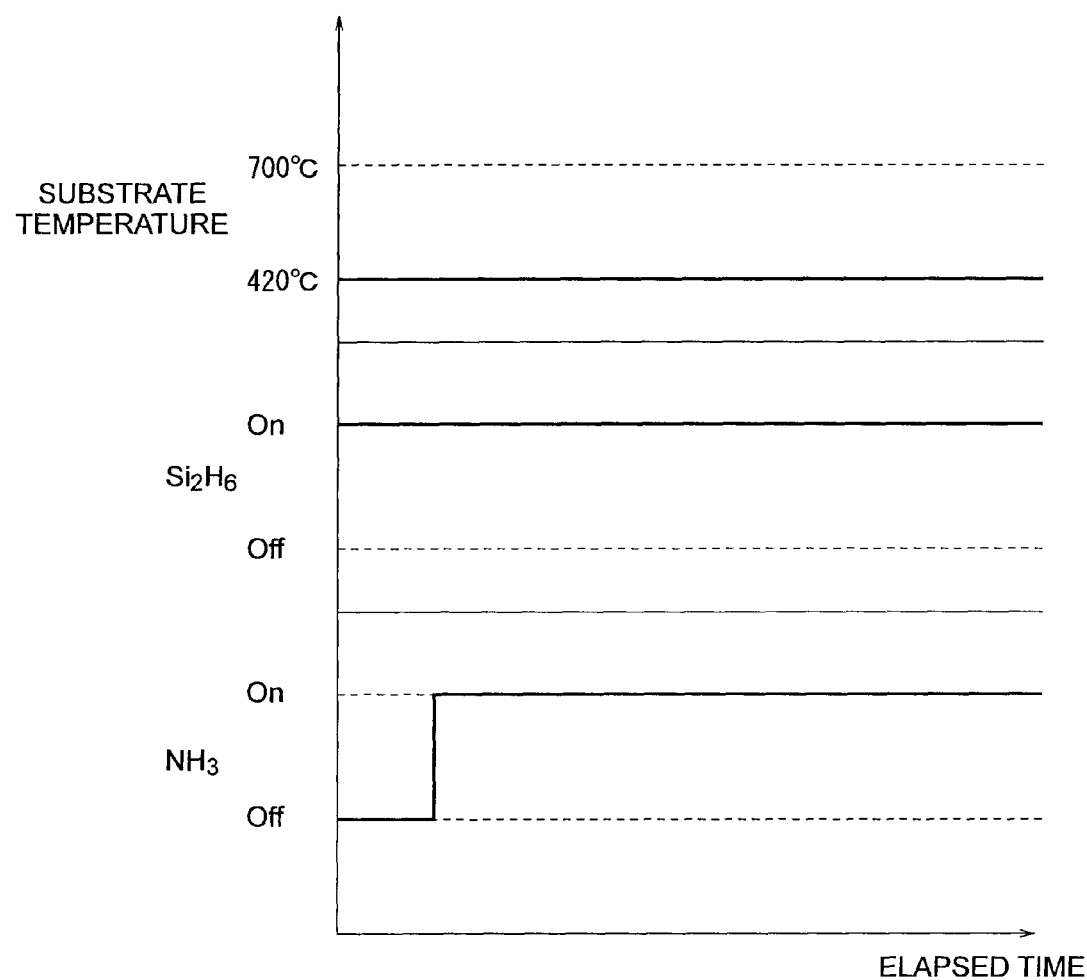
FIG. 20 shows the conditions for manufacturing the charge storage film of the third embodiment.

With the use of a disilane gas, a 1-nm thick amorphous silicon layer 43 is deposited on the silicon oxide film 42. At this point, it is preferable that the temperature of the silicon substrate 41 is 550° C. or lower. In this embodiment, the temperature of the silicon substrate 41 is 420° C., for example. With the temperature of the silicon substrate 41 being maintained at 420° C., a $NH_3$ gas of 0.03 Torr in partial pressure is supplied into the chamber while a disilane gas is introduced into the chamber. By doing so, a silicon nitride layer 44 is formed on the amorphous silicon layer 43. At the same time, nitrogen is diffused into the lower-layer amorphous silicon layer 43, so that the amorphous silicon layer 43 having nitrogen added thereto is formed, as shown in FIGS. 16(e) and 16(f). In this manner, a charge storage film 45 having a stack structure formed with the amorphous silicon layer 43 and the silicon nitride layer 44 is formed. Here, the silicon nitride layer 44 is a layer that extends in the in-plane direction, and has a structure that includes three-coordinate nitrogen bonds and has a nitrogen atom as at least one of the second-nearest neighbors of nitrogen. FIG. 20 shows the timing charts of the temperature of the silicon substrate, the supply of the disilane gas ($Si_2H_6$), and the supply of the $NH_3$ gas during the process for forming the charge storage film 45.

A mask material 46 to be used for the device isolation process is deposited on the charge storage film 45 by CVD (FIGS. 17(a) and 17(b)). After that, etching is successively performed on the mask material 46, the charge storage film 45, and the tunnel insulating film 42 by RIE using a resist mask (not shown), so as to expose a part of the surface of the silicon substrate 41. Etching is further performed on the exposed region of the silicon substrate 41, so as to form device isolation grooves 48 of 100 nm in depth, as shown in FIG. 17(b).

A silicon oxide film 49 for device isolation is then deposited on the entire surface, so as to completely fill the device isolation grooves 48. The portions of the silicon oxide film 49 existing on the surface are then removed by CMP, so that the surface of the silicon oxide film 49 is flattened. At this point, the mask material 46 becomes exposed (FIGS. 17(c) and 17(d)).

After the exposed mask material 46 is selectively removed by etching, the exposed portions of the silicon oxide film 49 on the surface are removed by etching with the use of a diluted hydrofluoric acid solution. An alumina layer of 15 nm in thickness is then deposited on the entire surface by ALD. At this point, the silicon nitride layer 44 is oxidized by the oxidant used for the film formation by ALD. As a result, a very thin silicon oxynitride layer is formed, and a 16-nm thick block insulating film 50 having a two-layer structure of the silicon oxynitride layer and the alumina layer is formed (FIGS. 18(a) and 18(b)).

A polycrystalline silicon layer and a tungsten silicide layer are then successively deposited by CVD, so that a 100-nm thick conductive film 51 having a two-layer structure of the polycrystalline silicon layer and the tungsten silicide layer is formed as a control gate electrode. Further, a mask material 52 for RIE is deposited on the conductive film 51 by CVD. After that, etching is successively performed on the mask material 52, the conductive film 51, the block insulating film 50, the charge storage film 45, and the tunnel insulating film 42 by RIE with the use of a resist mask (not shown), so as to form grooves 53 extending in the word line direction (FIGS. 18(c) and 18(d)). In this manner, the shapes of the charge storage film 45 and the control gate electrode 51 are defined.

Lastly, a silicon oxide film 54 that is an electrode sidewall oxide film is formed on the exposed faces of the mask material 52, the conductive film 51, the block insulating film 50, the charge storage film 45, and the tunnel insulating film 42 by a thermal oxidation technique. Source/drain regions 55a and 55b are then formed by an ion implantation technique, and an interlayer insulating film 56 is formed to cover the entire surface by CVD (FIGS. 19(a) and 19(b)). After that, wiring layers and the likes are formed by a known technique, so as to complete a nonvolatile semiconductor memory device.

Figure 21:
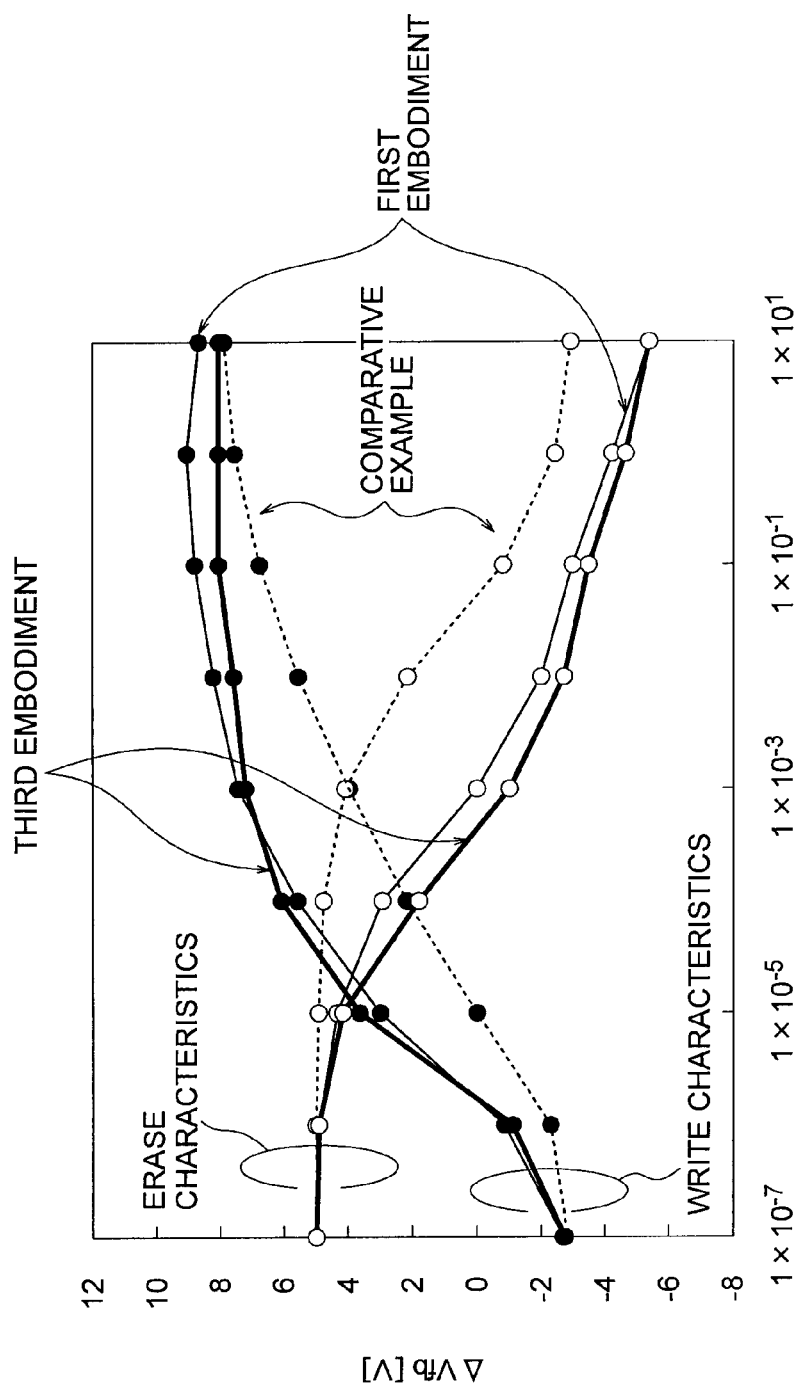
FIG. 21 shows the write/erase characteristics of the memory device manufactured according to the manufacture method of the third embodiment.
Figure 22:
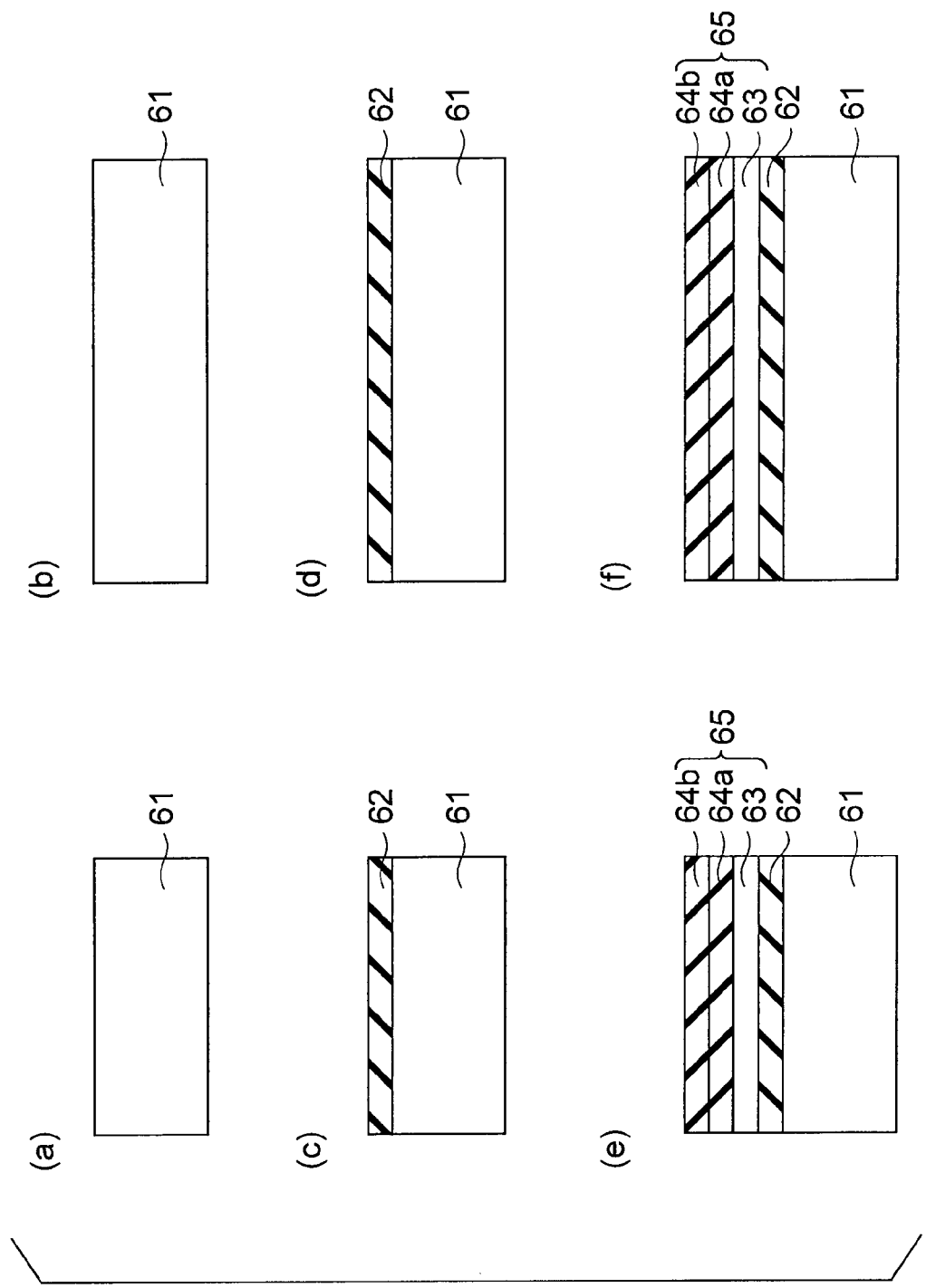
Figure 23:
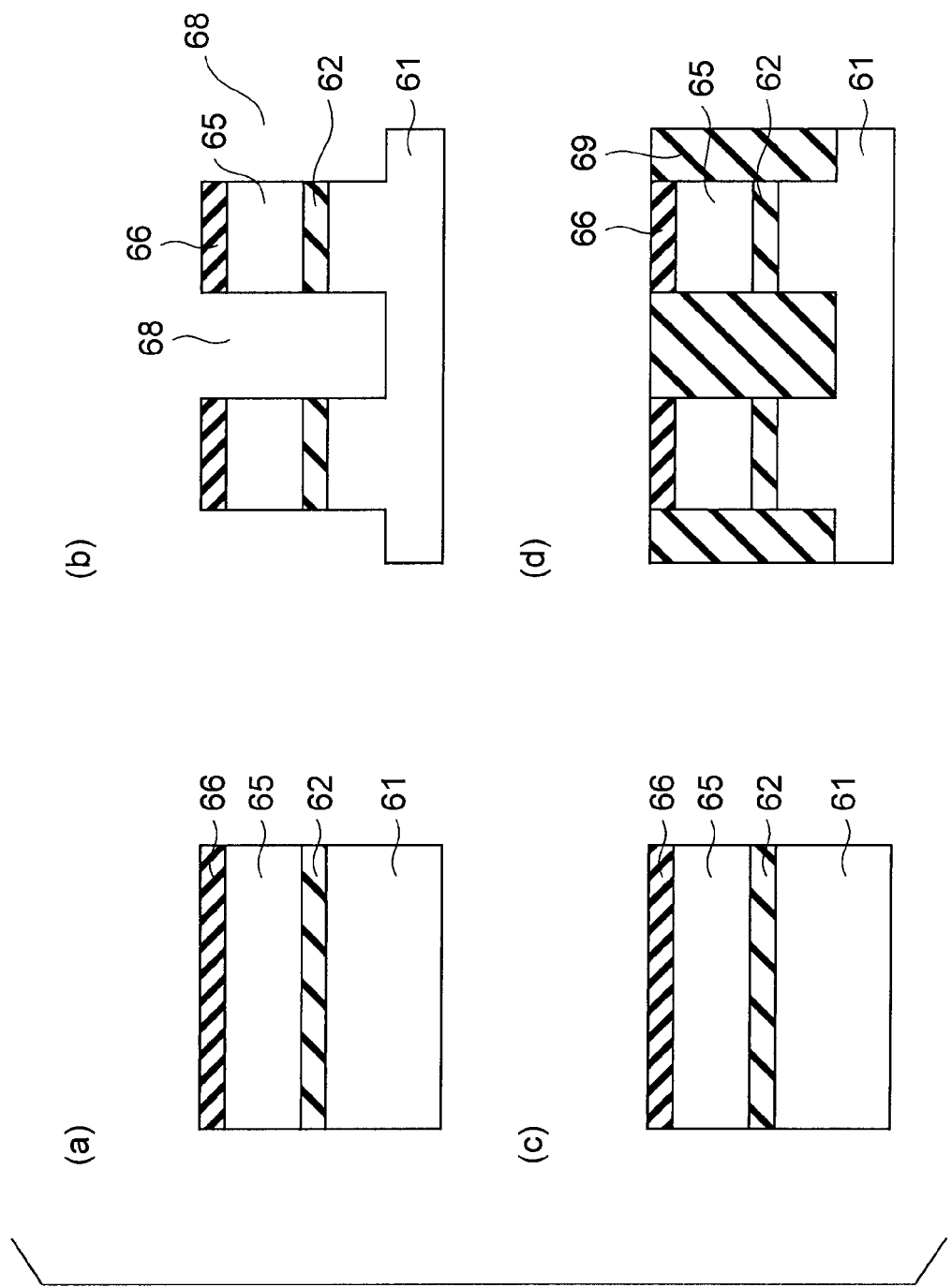
Figure 24:
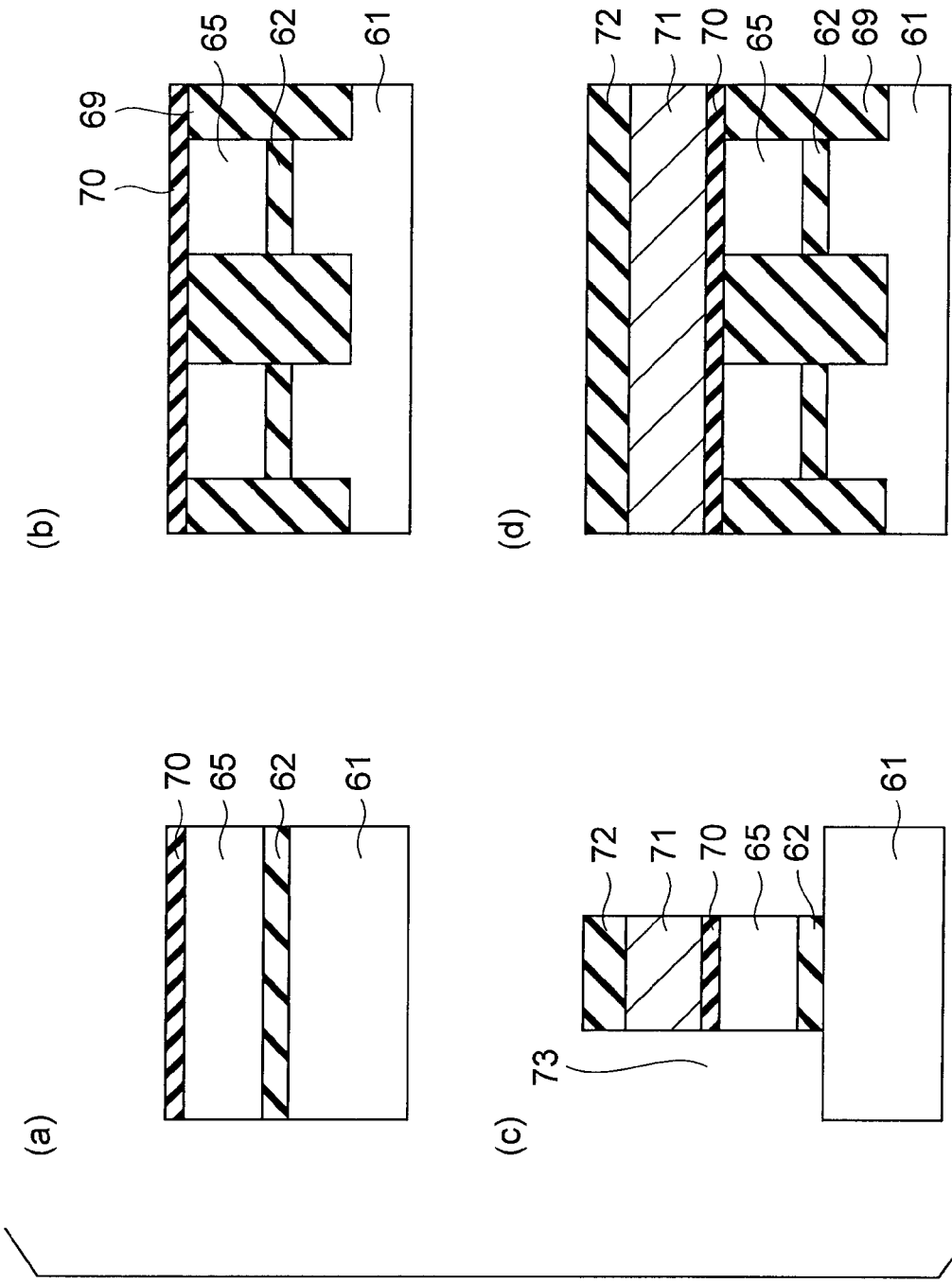
Figure 25:
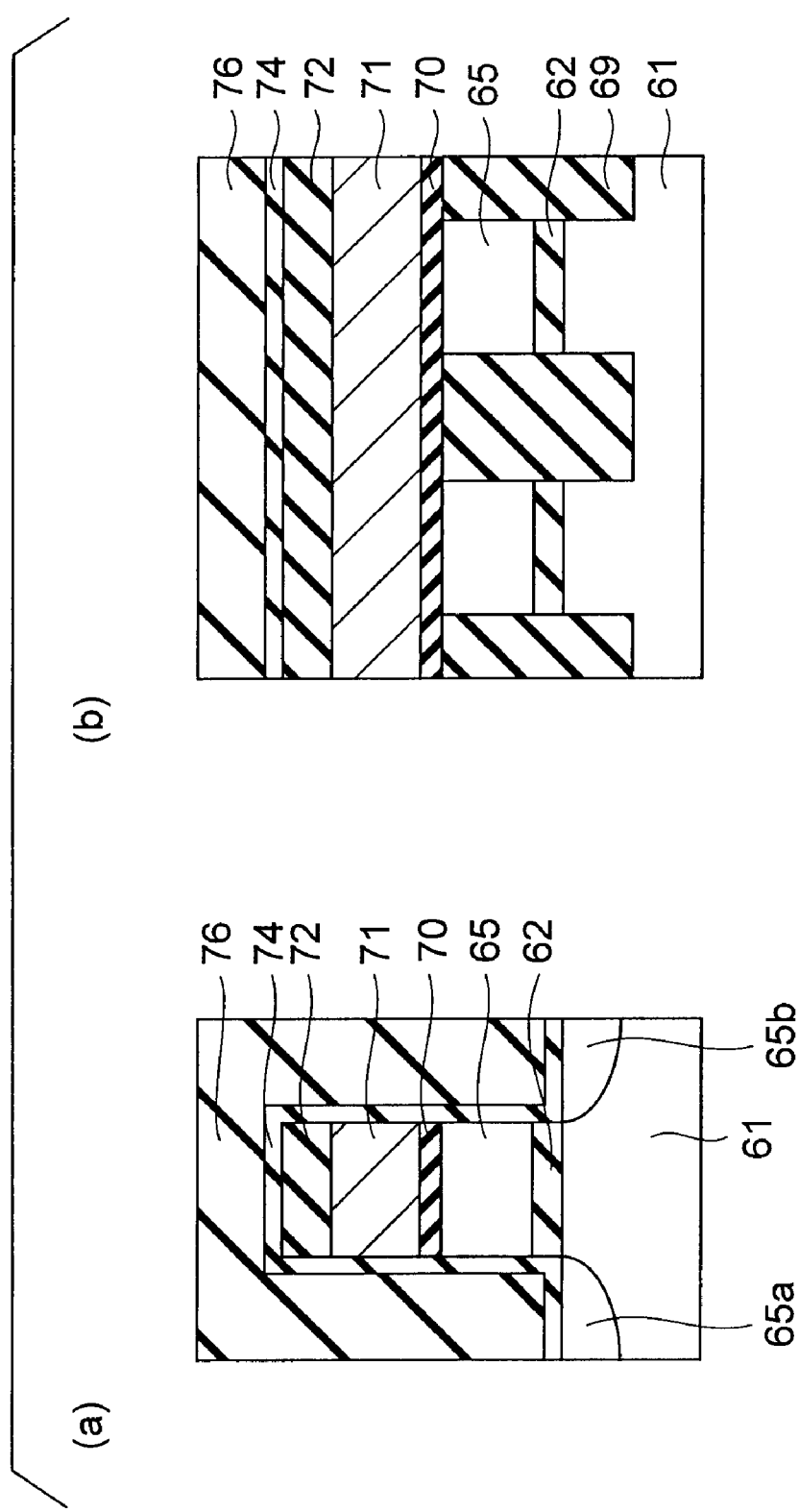

FIG. 21 shows the write and erase characteristics of a nonvolatile semiconductor memory device manufactured by the manufacture method of this embodiment, a nonvolatile semiconductor memory device manufactured by the manufacture method of the first embodiment, and a nonvolatile semiconductor memory device of a comparative example. In the comparative example, amorphous silicon is not deposited on the tunnel insulating film, and a silicon nitride film to be the charge storage film is directly deposited, with the substrate temperature being 750° C. In the manufacture method of this embodiment, after amorphous silicon is deposited, a $NH_3$ gas is supplied while the substrate temperature is maintained at 420° C. and the supply of a disilane gas is continued, so as to form the charge storage film, as shown in FIG. 20. In the manufacture method of the first embodiment, on the other hand, after amorphous silicon is deposited, the substrate temperature is increased to 750° C., the supply of a disilane gas is stopped, but a $NH_3$ gas is supplied to form the charge storage film, as shown in FIG. 5. As can be seen from FIG. 21, the write and erase characteristics indicate that the speed is higher in the initial period (during a short period of time after the start of a writing or erasing operation) in this embodiment than in the first embodiment, but the saturation value at the time of writing is lower in this embodiment than in the first embodiment. This is because more defects are formed in the amorphous silicon having nitrogen added thereto, as the nitriding is performed at a low temperature of 420° C. in this embodiment. With the larger amount of defects, the charge capture density becomes higher, and the write and erase rates become higher accordingly. However, the defects in the silicon nitride layer formed above the charge storage film also increase, and therefore, the charge retention characteristics are degraded, and written charges are easily released. Still, compared with the comparative example in which the silicon nitride film is directly deposited, the initial speed is much higher in this embodiment, and the improved effect can be utilized in a case where writing and erasing are performed in a short period of time. As mentioned above, this indicates that the charge capture density is made higher.

As described above, in accordance with this embodiment, nitriding of the lower-layer insulating film can be prevented, and oxygen diffusion from the upper-layer insulating film can be restricted. Thus, the decrease in charge capture density can be minimized.

Fourth Embodiment

Next, a method for manufacturing a nonvolatile semiconductor memory device in accordance with a fourth embodiment is described. A nonvolatile semiconductor memory device to be manufactured by the manufacture method of this embodiment is a MONOS nonvolatile semiconductor memory device, and includes memory cells. Referring to FIGS. 22(a) through 25(b), the method for manufacturing the nonvolatile semiconductor memory device of this embodiment is described. FIGS. 22(a) through 25(b) are cross-sectional views illustrating the manufacture procedures according to the manufacture method of this embodiment. FIGS. 22(a), 22(c), 22(e), 23(a), 23(c), 24(a), 24(c), and 25(a) show cross sections perpendicular to the cross sections shown in FIGS. 22(b), 22(d), 22(f), 23(b), 23(d), 24(b), 24(d), and 25(b), respectively.

First, as shown in FIGS. 22(a) and 22(b), a silicon substrate 61 doped with desired impurities is subjected to a diluted HF treatment, so that the surface of the silicon substrate 61 is terminated by hydrogen. The silicon substrate 61 is then placed in the chamber of a film forming device. The atmosphere in the chamber is then filled only with a gas (such as a nitrogen gas) that does not react with silicon or does not etch silicon during the manufacturing process. After that, the temperature of the silicon substrate 61 is increased to 700° C., so as to completely remove hydrogen from the silicon substrate 61.

The atmosphere in the chamber is turned into a mixed gas atmosphere of a $N_2$ gas of 30 Torr in partial pressure and an $O_2$ gas of 3 Torr in partial pressure, for example. The surface of the silicon substrate 61 is increased to 1050° C., and is maintained at that temperature for 50 seconds. In this manner, a silicon oxide film 62 to be a tunnel insulating film is formed on the silicon substrate 61, as shown in FIGS. 22(c) and 22(d).

With the use of a disilane gas, a 1-nm thick amorphous silicon layer 63 is deposited on the silicon oxide film 62. At this point, it is preferable that the substrate temperature is 550° C. or lower. In this embodiment, the temperature of the silicon substrate 61 is 420° C., for example. With the temperature of the silicon substrate 61 being maintained at 420° C., a $NH_3$ gas of 0.03 Torr in partial pressure is supplied into the chamber while the disilane gas is introduced into the chamber. By doing so, a 1-nm thick silicon nitride layer is formed on the amorphous silicon layer 63. In this manner, a silicon nitride layer 64a is formed on the amorphous silicon film 63. During this time, the substrate temperature is maintained at 420° C.

Figure 26:
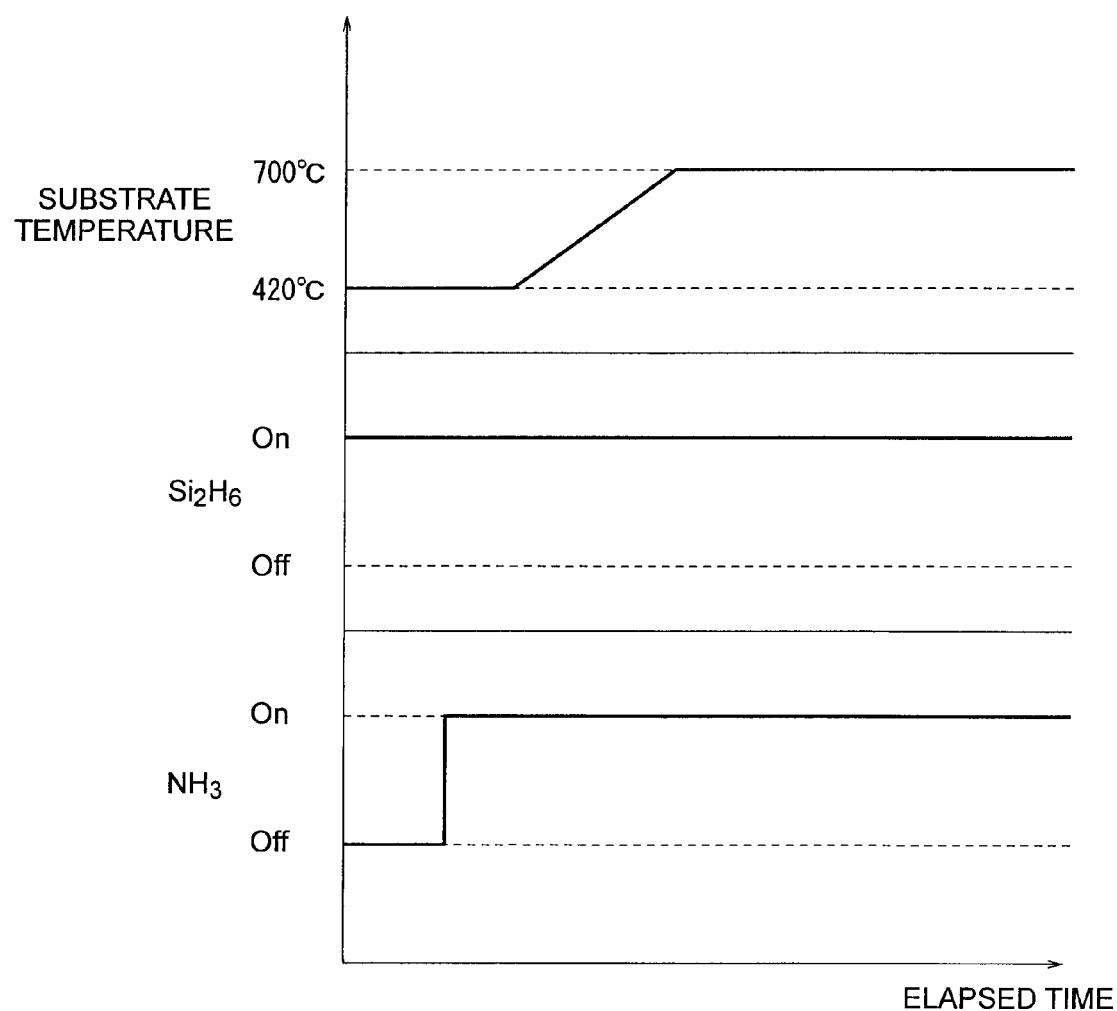
FIG. 26 shows the conditions for manufacturing the charge storage film of the fourth embodiment.

With the supply of the disilane gas and the $NH_3$ gas being continued, the temperature of the stage on which the silicon substrate is placed is increased to 700° C. By doing so, a silicon nitride layer 64b is formed on the silicon nitride layer 64a. Through the series of procedures for depositing the silicon nitride layers, nitrogen is diffused into the amorphous silicon layer 63, and the amorphous silicon layer 63 having nitrogen added thereto is formed. In this manner, a charge storage film 65 having a stack structure formed with the nitrogen-added amorphous silicon layer 63, the silicon nitride layer 64a, and the silicon nitride layer 64b is formed. Here, the silicon nitride layers 64a and 64b are layers that extend in the in-plane direction, and each have a structure that includes three-coordinate nitrogen bonds and has a nitrogen atom as at least one of the second-nearest neighbors of nitrogen. The three-coordinate density is higher in the silicon nitride layer 64b than in the silicon nitride layer 64a. FIG. 26 shows the timing charts of the temperature of the silicon substrate, the supply of the disilane gas ($Si_2H_6$), and the supply of the $NH_3$ gas during the process for forming the charge storage film 65.

After the charge storage film 65 is formed in the above manner, a mask material 66 to be used for the device isolation process is formed by CVD (FIGS. 23(a) and 23(b)). After that, etching is successively performed on the mask material 66, the charge storage film 65, and the tunnel insulating film 62 by RIE using a resist mask (not shown), so as to expose a part of the surface of the silicon substrate 61. Etching is further performed on the exposed region of the silicon substrate 61, so as to form device isolation grooves 68 of 100 nm in depth, as shown in FIG. 23(b).

A silicon oxide film 69 for device isolation is then deposited on the entire surface, so as to completely fill the device isolation grooves 68. The portions of the silicon oxide film 69 existing on the surface are then removed by CMP, so that the surface of the silicon oxide film 69 is flattened. At this point, the mask material 66 becomes exposed (FIGS. 23(c) and 23(d)).

After the exposed mask material 66 is selectively removed by etching, the exposed portions of the silicon oxide film 69 on the surface are removed by etching with the use of a diluted hydrofluoric acid solution. An alumina layer of 15 nm in thickness is then deposited on the entire surface by ALD. At this point, the silicon nitride layer 64b is oxidized by the oxidant used for the film formation by ALD. As a result, a very thin silicon oxynitride layer is formed, and a 16-nm thick block insulating film 70 having a two-layer structure of the silicon oxynitride layer and the alumina layer is formed (FIGS. 24(a) and 24(b)).

A polycrystalline silicon layer and a tungsten silicide layer are then successively deposited by CVD, so that a 100-nm thick conductive film 71 having a two-layer structure of the polycrystalline layer and the tungsten silicide layer is formed as a control gate electrode. Further, a mask material 72 for RIE is formed on the conductive film 71 by CVD (FIGS. 24(c) and 24(d)). After that, etching is successively performed on the mask material 72, the conductive film 71, the block insulating film 70, the charge storage film 65, and the tunnel insulating film 62 by RIE with the use of a resist mask (not shown), so as to form grooves 73 extending in the word line direction (FIG. 24(d)). In this manner, the shapes of the charge storage film 65 and the control gate electrode 71 are defined.

Lastly, a silicon oxide film 74 that is an electrode sidewall oxide film is formed on the exposed faces of the mask material 72, the conductive film 71, the block insulating film 70, the charge storage film 65, and the tunnel insulating film 62 by a thermal oxidation technique. Source/drain regions 75a and 75b are then formed by an ion implantation technique, and an interlayer insulating film 76 is formed to cover the entire surface by CVD (FIGS. 25(a) and 25(b)). After that, wiring layers and the likes are formed by a known technique, so as to complete a nonvolatile semiconductor memory device.

Figure 27:
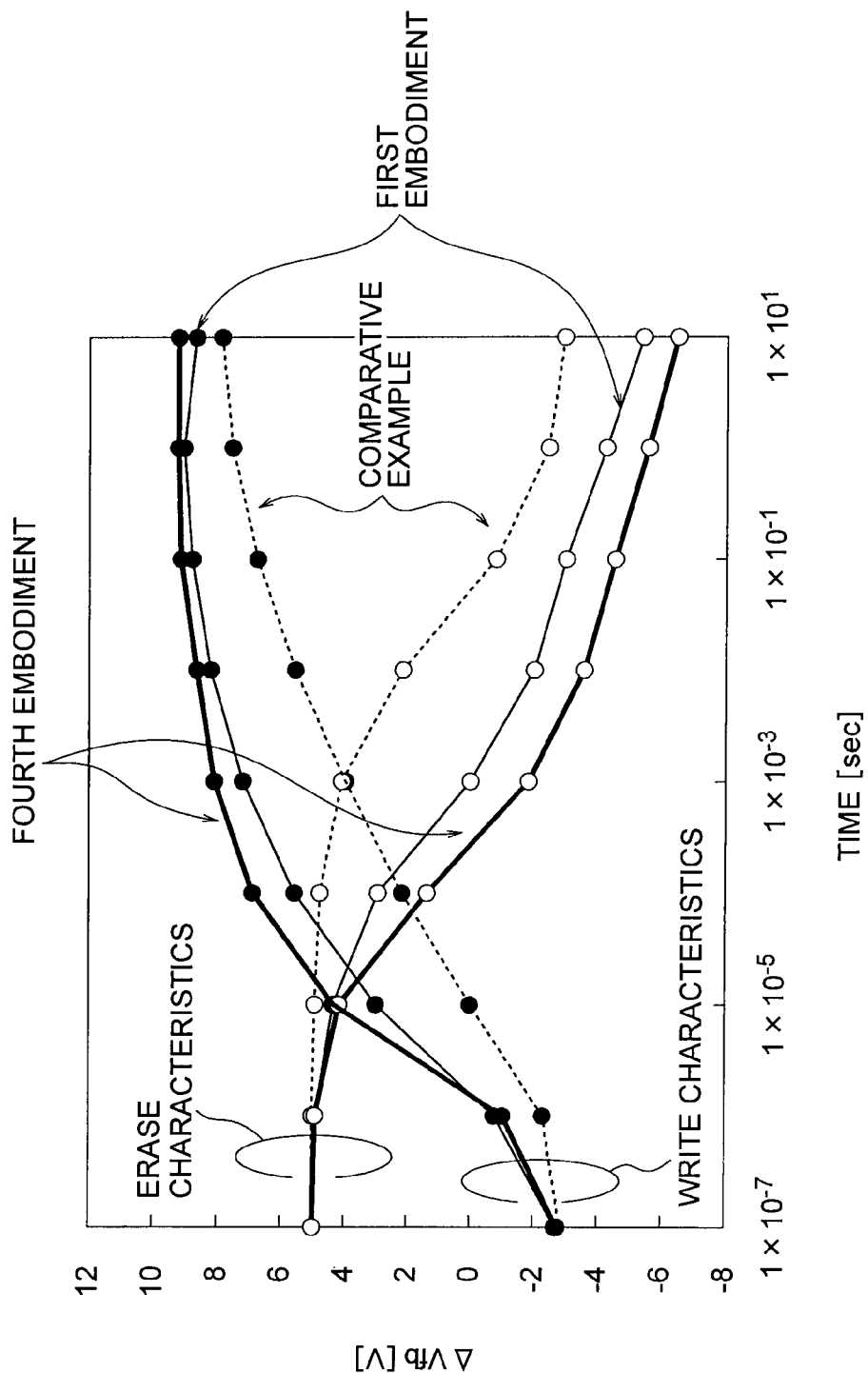
FIG. 27 shows the write/erase characteristics of the memory device manufactured according to the manufacture method of the fourth embodiment.

FIG. 27 shows the write and erase characteristics of a nonvolatile semiconductor memory device manufactured by the manufacture method of this embodiment, a nonvolatile semiconductor memory device manufactured by the manufacture method of the first embodiment, and a nonvolatile semiconductor memory device of a comparative example. In the comparative example, amorphous silicon is not deposited on the tunnel insulating film, and a silicon nitride film to be the charge storage film is directly deposited, with the substrate temperature being 750° C.

As can be seen from FIG. 27, the write and erase characteristics indicate that the speed is higher in the initial period (during a short period of time after the start of a writing or erasing operation) in this embodiment than in the first embodiment, and the saturation value is higher in this embodiment than in the first embodiment. This is because more defects are formed in the amorphous silicon having nitrogen added thereto, as the nitriding is performed at a low temperature of 420° C. in this embodiment. With the larger amount of defects, the charge capture density becomes higher, and the write and erase rates become higher. Furthermore, a silicon nitride layer having few defects is formed on the surface of the charge storage film in this embodiment. Accordingly, the charge retention characteristics are improved, and written charges are not easily released.

As described above, in accordance with this embodiment, nitriding of the lower-layer insulating film can be prevented, and oxygen diffusion from the upper-layer insulating film can be restricted. Thus, the decrease in charge capture density can be minimized.

Fifth Embodiment

Figure 28:
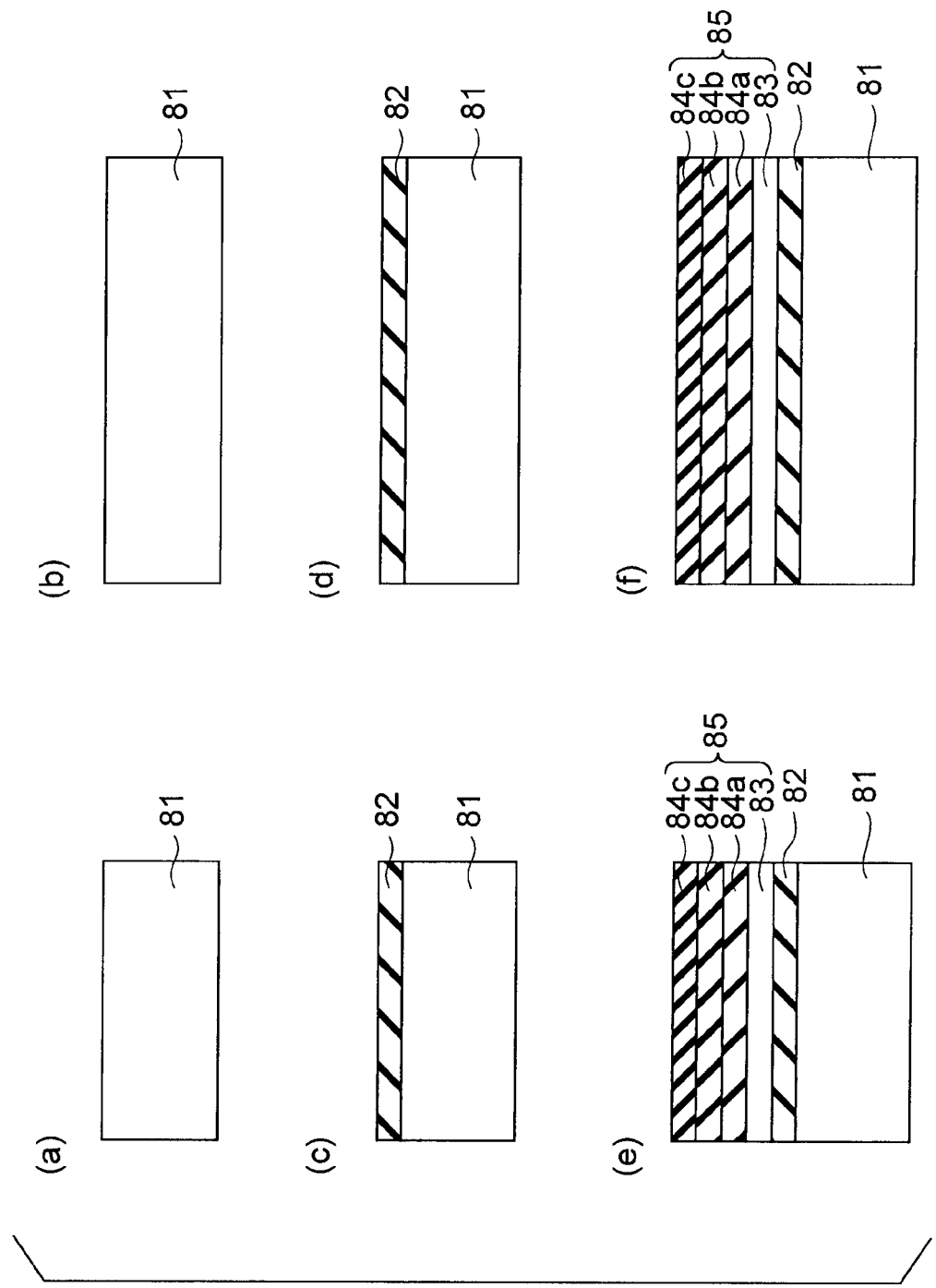

Next, a method for manufacturing a nonvolatile semiconductor memory device in accordance with a fifth embodiment is described. A nonvolatile semiconductor memory device to be manufactured by the manufacture method of this embodiment is a MONOS nonvolatile semiconductor memory device, and includes memory cells. Referring to FIGS. 28(*a*) through 31(*b*), the method for manufacturing the nonvolatile semiconductor memory device of this embodiment is described. FIGS. 28(*a*) through 31(*b*) are cross-sectional views illustrating the manufacture procedures according to the manufacture method of this embodiment. FIGS. 28(*a*), 28(*c*), 28(*e*), 29(*a*), 29(*c*), 30(*a*), 30(*c*), and 31(*a*) show cross sections perpendicular to the cross sections shown in FIGS. 28(*b*), 28(*d*), 28(*f*), 29(*b*), 29(*d*), 30(*b*), 30(*d*), and 31(*b*), respectively.

First, as shown in FIGS. 28(*a*) and 28(*b*), a silicon substrate 81 doped with desired impurities is subjected to a diluted HF treatment, so that the surface of the silicon substrate 81 is terminated by hydrogen. The silicon substrate 81 is then placed in the chamber of a film forming device. The atmosphere in the chamber is then filled only with a gas (such as a nitrogen gas) that does not react with silicon or does not etch silicon during the manufacturing process. After that, the temperature of the silicon substrate 81 is increased to 700° C., so as to completely remove hydrogen from the silicon substrate 81.

The atmosphere in the chamber is turned into a mixed gas atmosphere of a $N_2$ gas of 30 Torr in partial pressure and an $O_2$ gas of 3 Torr in partial pressure, for example. The surface of the silicon substrate 81 is increased to 1050° C., and is maintained at that temperature for 50 seconds. In this manner, a silicon oxide film 82 to be a tunnel insulating film is formed on the silicon substrate 81, as shown in FIGS. 28(*c*) and 28(*d*).

With the use of a disilane gas, a 1-nm thick amorphous silicon layer 83 is deposited on the silicon oxide film 82. At this point, it is preferable that the temperature of the silicon substrate 81 is 550° C. or lower. In this embodiment, the temperature of the silicon substrate 81 is 420° C., for example. With the temperature of the silicon substrate 81 being maintained at 420° C., a $NH_3$ gas of 0.03 Torr in partial pressure is supplied into the chamber while the supply of the disilane gas into the chamber is continued. By doing so, a 1-nm thick silicon nitride layer 84*a* is formed on the amorphous silicon layer 83. In this manner, the silicon nitride layer 84*a* is formed on the amorphous silicon film 83. With the supply of the disilane gas and the $NH_3$ gas being continued, the stage temperature is increased to 700° C. In this manner, a silicon nitride layer 84*b* is formed on the silicon nitride layer 84*a*. The supply of the disilane gas is then stopped, and the silicon nitride film 84*b* is subjected to a heat treatment with a $NH_3$ gas, with only the $NH_3$ gas being supplied. Through the series of procedures for depositing the silicon nitride layers, nitrogen is diffused into the amorphous silicon layer 83, and the amorphous silicon layer 83 having nitrogen added thereto is formed. As the silicon nitride layers 84*a* and 84*b* are formed, and the silicon nitride layer 84*b* is subjected to the heat treatment with the $NH_3$ gas at 700° C., the three-coordinate components in the surface increase, and a silicon nitride layer 84*c* that has few defects and is highly resistant to oxidation is formed on the surface.

As a result, a charge storage film 85 having a stack structure formed with the nitrogen-added amorphous silicon layer 83, the silicon nitride layer 84*a*, the silicon nitride layer 84*b*, and the silicon nitride layer 84*c* is formed. Here, the silicon nitride layers 84*a*, 84*b*, and 84*c* are layers that extend in the in-plane direction, and each have a structure that includes three-coordinate nitrogen bonds and has a nitrogen atom as at least one of the second-nearest neighbors of nitrogen. The three-coordinate nitrogen bond density is higher in the silicon nitride layer 84*b* than in the silicon nitride layer 84*a*. The three-coordinate nitrogen bond density is higher in the silicon nitride layer 84*c* than in the silicon nitride layer 84*b*. Accordingly, the silicon nitride layer 84*c* has few defects and can minimize the charge release to the upper layers. Thus, excellent charge retention characteristics can be achieved. It is preferable that the temperature at which the silicon nitride layer 84*c* is formed is 850° C. or lower. If the temperature exceeds 850° C., the number of defects becomes smaller not only in the silicon nitride layer 84*c* but also in the silicon nitride layers 84*b* and 84*a*. As a result, the amount of charges to be stored becomes smaller, and the write efficiency becomes lower.

Figure 32:
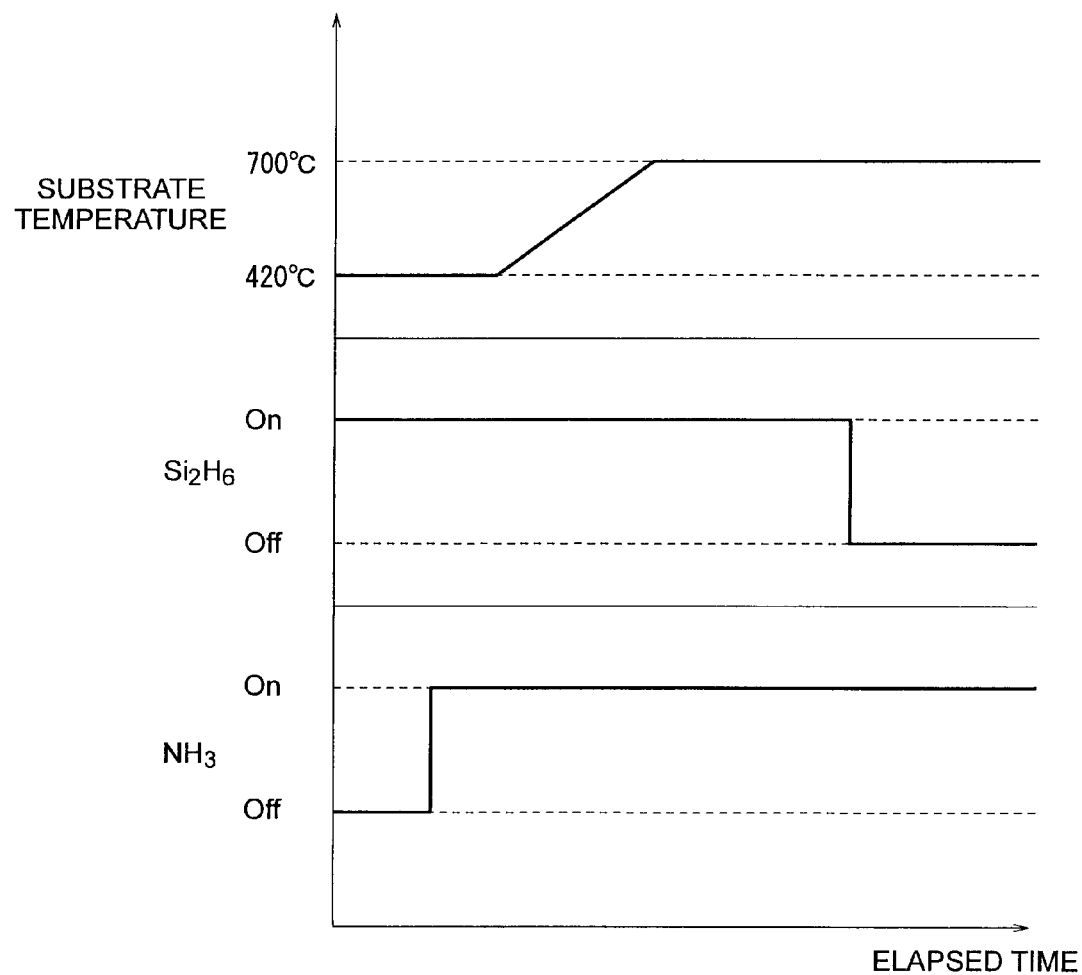
FIG. 32 shows the conditions for manufacturing the charge storage film of the fifth embodiment.

FIG. 32 shows the timing charts of the temperature of the silicon substrate, the supply of the disilane gas ($Si_2H_6$), and the supply of the $NH_3$ gas during the process for forming the charge storage film 85 in accordance with this embodiment.

Figure 29:
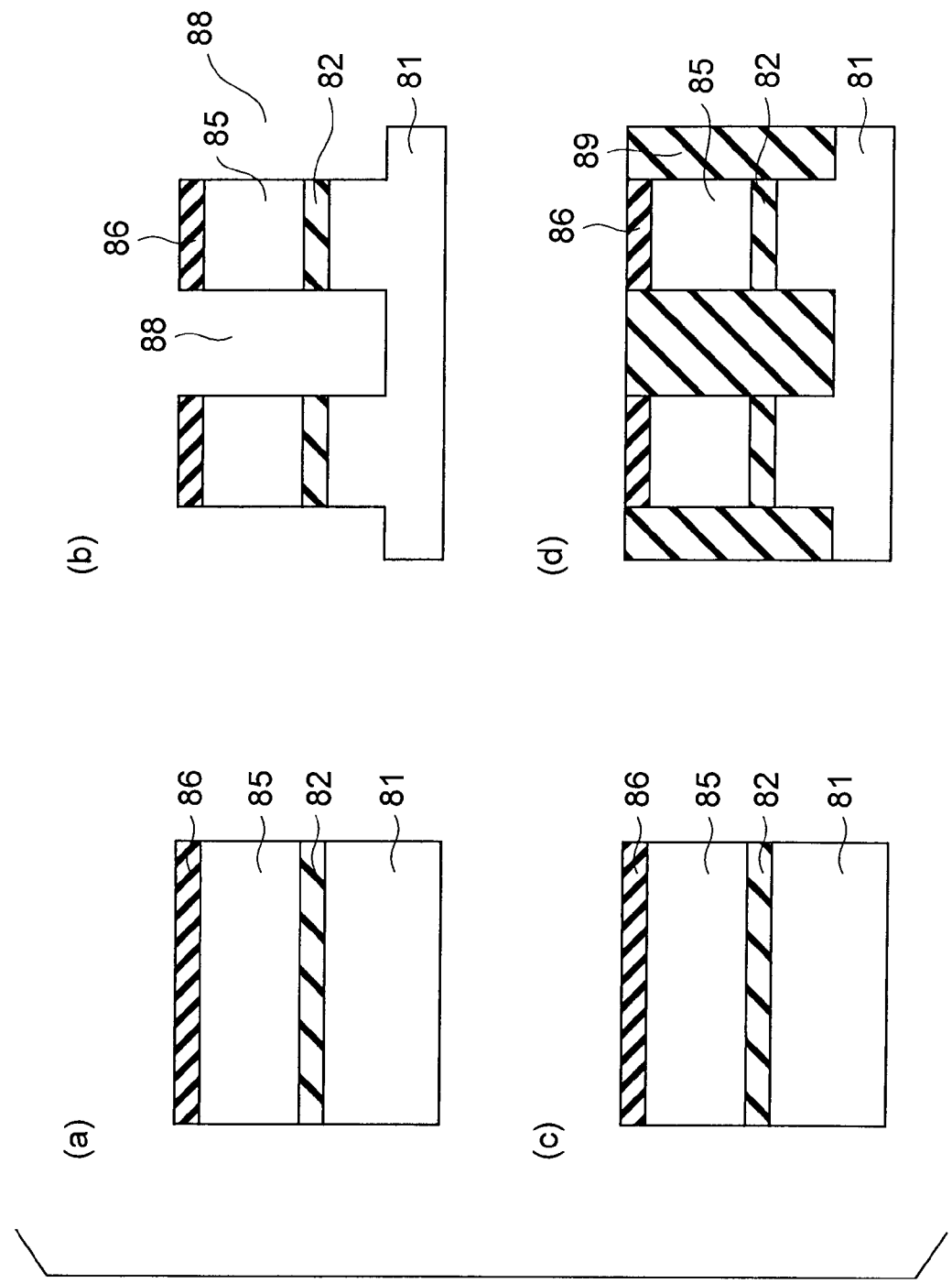

After the charge storage film 85 is formed in the above manner, a mask material 86 to be used for the device isolation process is formed by CVD (FIGS. 29(*a*) and 29(*b*)). After that, etching is successively performed on the mask material 86*f* the charge storage film 85, and the tunnel insulating film 82 by RIE using a resist mask (not shown), so as to expose a part of the surface of the silicon substrate 81. Etching is further performed on the exposed region of the silicon substrate 81, so as to form device isolation grooves 88 of 100 nm in depth, as shown in FIG. 29(*b*).

A silicon oxide film 89 for device isolation is then deposited on the entire surface, so as to completely fill the device isolation grooves 88. The portions of the silicon oxide film 89 existing on the surface are then removed by CMP, so that the surface of the silicon oxide film 89 is flattened. At this point, the mask material 86 becomes exposed (FIGS. 29(*c*) and 29(*d*)).

Figure 30:
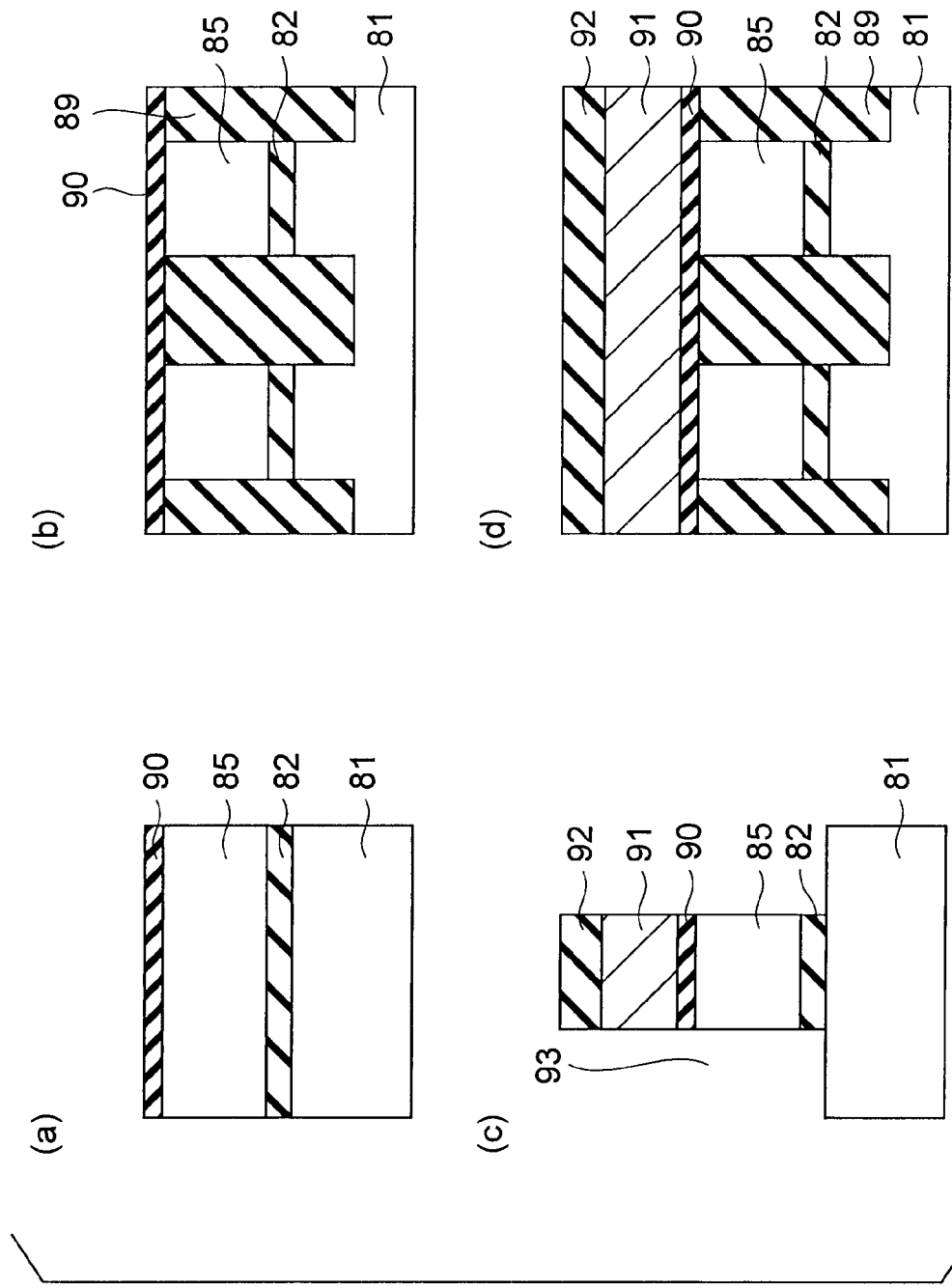

After the exposed mask material 86 is selectively removed by etching, the exposed portions of the silicon oxide film 89 on the surface are removed by etching with the use of a diluted hydrofluoric acid solution. An alumina layer of 15 nm in thickness is then deposited on the entire surface by ALD. At this point, the silicon nitride layer 84*c* as the uppermost layer of the charge storage film 85 is oxidized by the oxidant used for the film formation by ALD. As a result, a very thin silicon oxynitride layer is formed, and a 16-nm thick block insulating film 90 having a two-layer structure of the silicon oxynitride layer and the alumina layer is formed (FIGS. 30(*a*) and 30(*b*)).

A polycrystalline silicon layer and a tungsten silicide layer are then successively deposited by CVD, so that a 100-nm thick conductive film 91 having a two-layer structure of the polycrystalline silicon layer and the tungsten silicide layer is formed as a control gate electrode. Further, a mask material 92 for RIE is deposited by CVD. After that, etching is successively performed on the mask material 92, the conductive film 91, the block insulating film 90, the charge storage film 85, and the tunnel insulating film 82 by RIE with the use of a resist mask (not shown), so as to form grooves 93 extending in the word line direction (FIGS. 30(c) and 30(d)). In this manner, the shapes of the charge storage film 85 and the control gate electrode 91 are defined.

Figure 31:
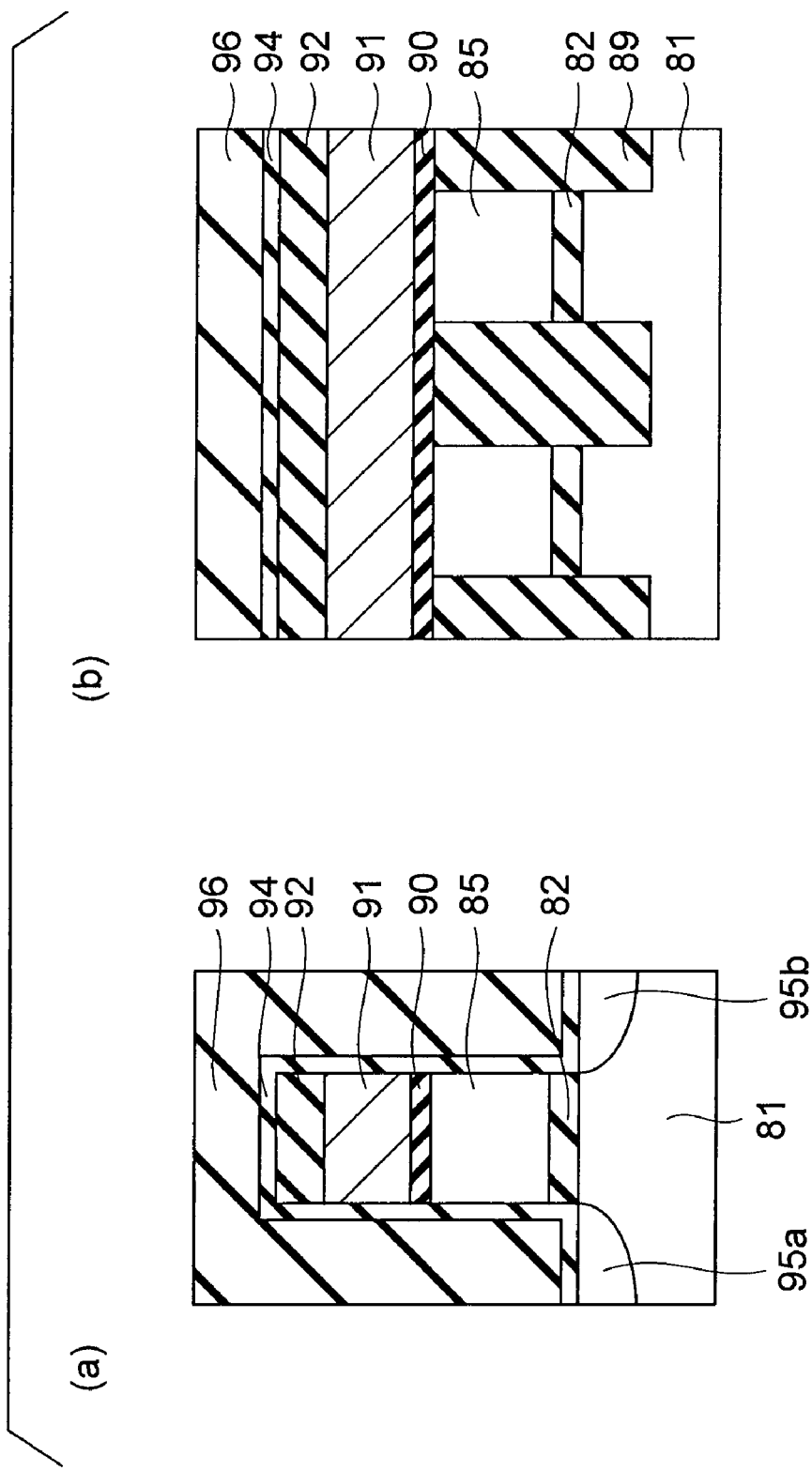

Lastly, a silicon oxide film 94 that is an electrode sidewall oxide film is formed on the exposed faces of the mask material 92, the conductive film 91, the block insulating film 90, the charge storage film 85, and the tunnel insulating film 82 by a thermal oxidation technique. Source/drain regions 95a and 95b are then formed by an ion implantation technique, and an interlayer insulating film 96 is formed to cover the entire surface by CVD (FIGS. 31(a) and 31(b)). After that, wiring layers and the likes are formed by a known technique, so as to complete a nonvolatile semiconductor memory device.

Figure 33:
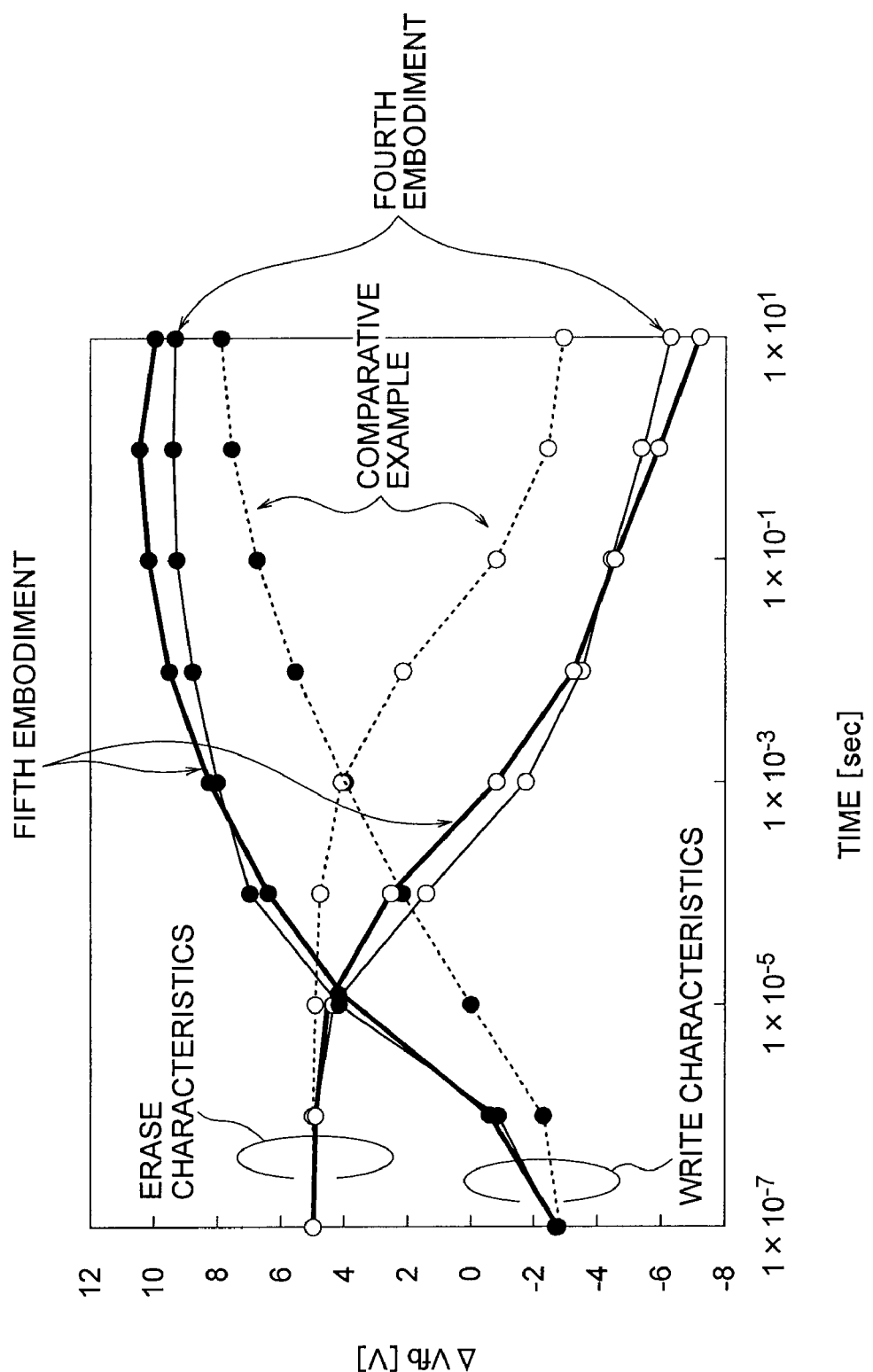
FIG. 33 shows the write/erase characteristics of the memory device manufactured according to the manufacture method of the fifth embodiment.
Figure 34:
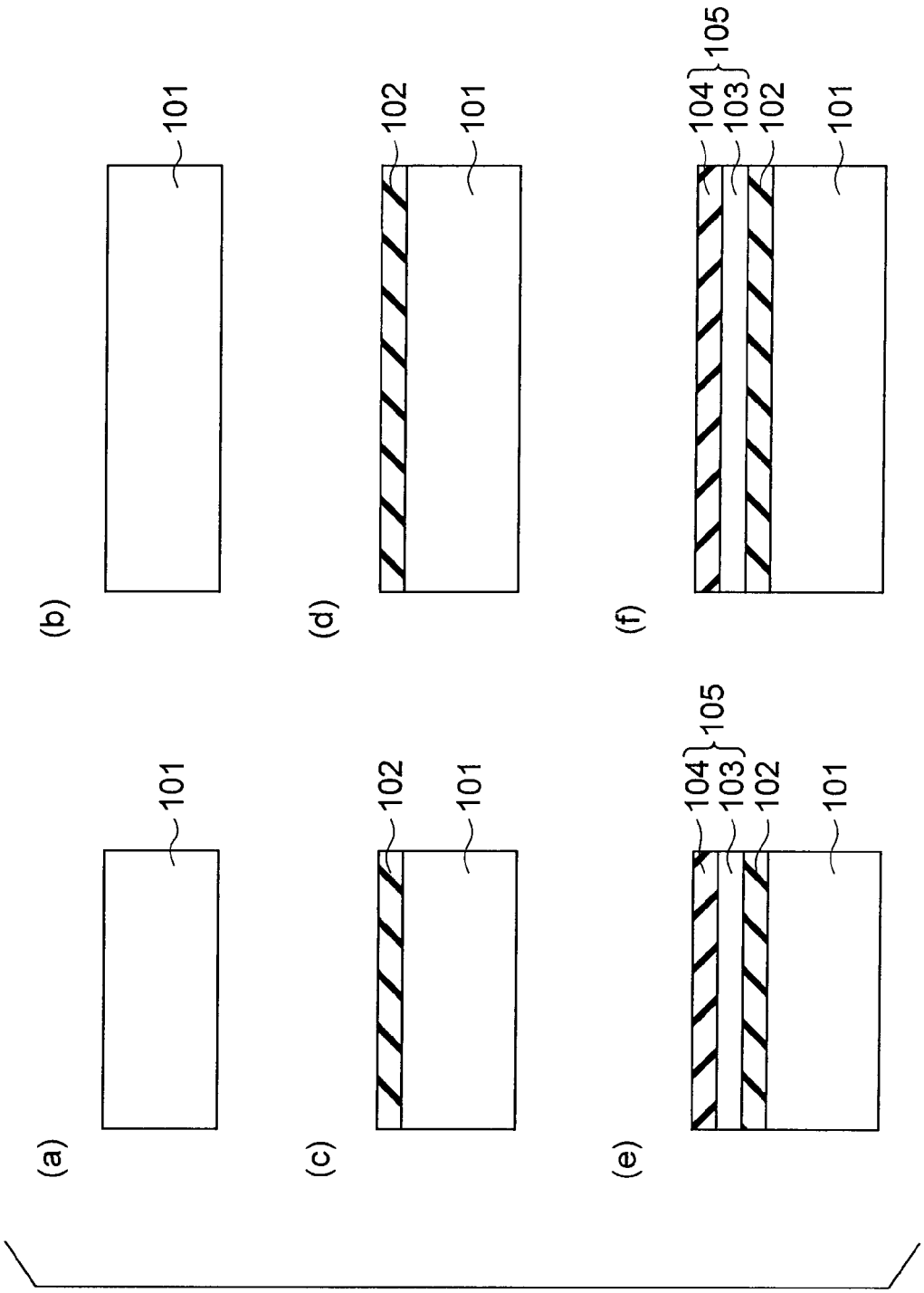
Figure 35:
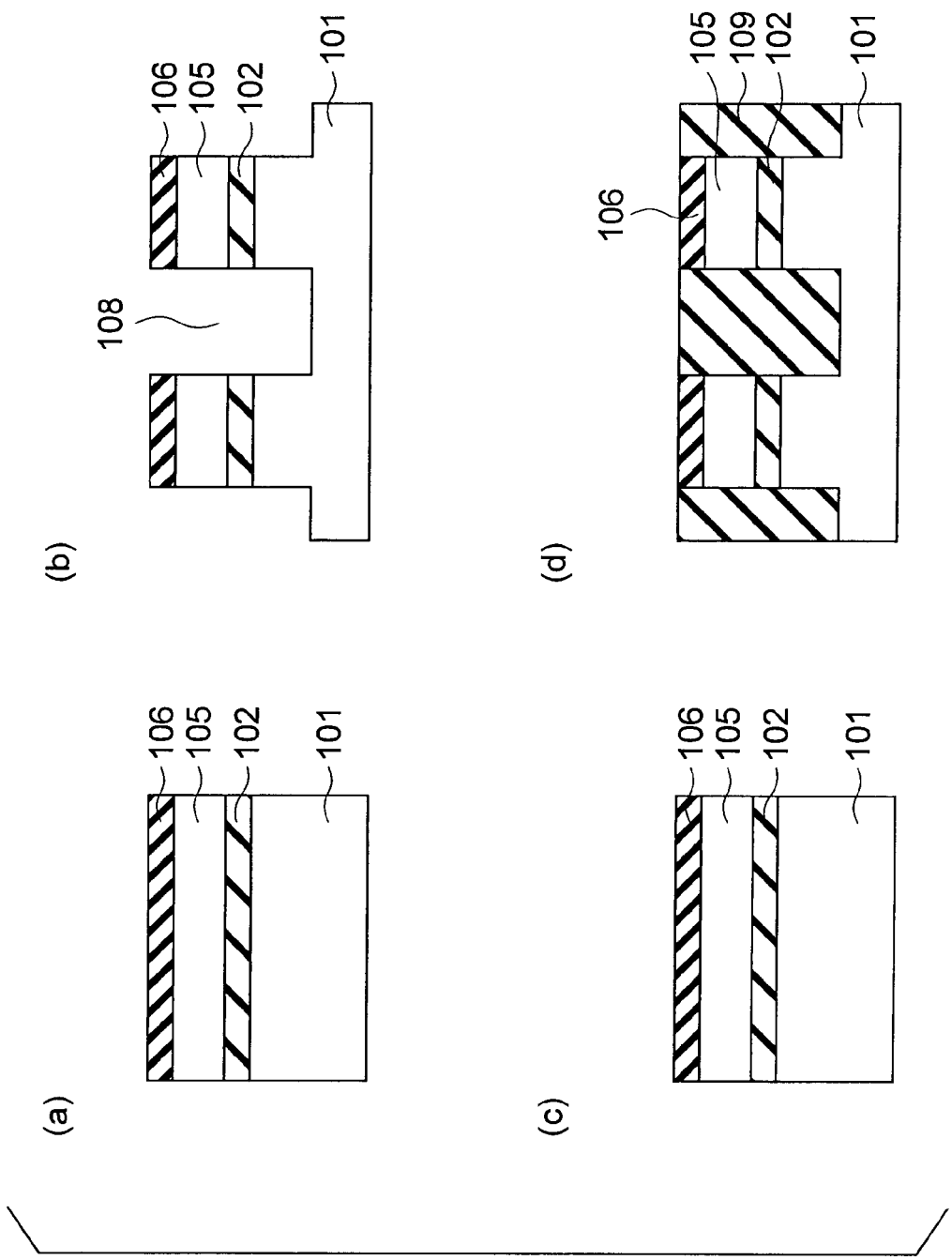

FIG. 33 shows the write and erase characteristics of a nonvolatile semiconductor memory device manufactured by the manufacture method of this embodiment, a nonvolatile semiconductor memory device manufactured by the manufacture method of the fourth embodiment, and a nonvolatile semiconductor memory device of a comparative example. In the comparative example, amorphous silicon is not deposited on the tunnel insulating film, and a silicon nitride film to be the charge storage film is directly deposited, with the substrate temperature being 750° C. The fourth embodiment is the same as this embodiment, except that the last $NH_3$ treatment is omitted when the charge storage film is formed.

As can be seen from FIG. 33, the write and erase characteristics indicate that the speed is lower in the initial period (during a short period of time after the start of a writing or erasing operation) in this embodiment than in the fourth embodiment, and the saturation value is even higher in this embodiment than in the fourth embodiment. This is because, after the charge storage layer 84b is formed, annealing is performed with the use of the $NH_3$ gas at 700° C. in this embodiment. Although the capture charge density in the charge storage layer 84b becomes lower, the charge retention characteristics are further improved, as the silicon nitride layer 84c having few defects is formed as the outermost layer. Thus, the written charges are not easily released.

As described above, in accordance with this embodiment, nitriding of the lower-layer insulating film can be prevented, and oxygen diffusion from the upper-layer insulating film can be restricted. Thus, the decrease in charge capture density can be minimized.

Sixth Embodiment

Next, a method for manufacturing a nonvolatile semiconductor memory device in accordance with a sixth embodiment is described. A nonvolatile semiconductor memory device to be manufactured by the manufacture method of this embodiment is a MONOS nonvolatile semiconductor memory device, and includes memory cells. Referring to FIGS. 34(a) through 37(b), the method for manufacturing the nonvolatile semiconductor memory device of this embodiment is described. FIGS. 34(a) through 37(b) are cross-sectional views illustrating the manufacture procedures according to the manufacture method of this embodiment. FIGS. 34(a), 34(c), 34(e), 35(a), 35(c), 36(a), 36(c), and 37(a) show cross sections perpendicular to the cross sections shown in FIGS. 34(b), 34(d), 34(f), 35(b), 35(d), 36(b), 36(d), and 37(b), respectively.

First, as shown in FIGS. 34(a) and 34(b), a silicon substrate 101 doped with desired impurities is subjected to a diluted HF treatment, so that the surface of the silicon substrate 101 is terminated by hydrogen. The silicon substrate 101 is then placed in the chamber of a film forming device. The atmosphere in the chamber is then filled only with a gas (such as a nitrogen gas) that does not react with silicon or does not etch silicon during the manufacturing process. After that, the temperature of the silicon substrate 101 is increased to 700° C., so as to completely remove hydrogen from the silicon substrate 101.

The atmosphere in the chamber is turned into a mixed gas atmosphere of a $N_2$ gas of 30 Torr in partial pressure and an $O_2$ gas of 3 Torr in partial pressure, for example. The surface of the silicon substrate 101 is increased to 1050° C., and is maintained at that temperature for 50 seconds. In this manner, a silicon oxide film 102 to be a tunnel insulating film is formed on the silicon substrate 101, as shown in FIGS. 34(c) and 34(d).

With the use of a disilane gas, a 1-nm thick amorphous silicon layer 103 is deposited on the silicon oxide film 102. At this point, it is preferable that the temperature of the silicon substrate 101 is 550° C. or lower. In this embodiment, the temperature of the silicon substrate 101 is 420° C., for example. With the temperature of the silicon substrate 101 being maintained at 420° C., a $NH_3$ gas of 0.03 Torr in partial pressure is supplied into the chamber while the supply of the disilane gas into the chamber is continued. By doing so, a silicon nitride layer 104 is formed on the amorphous silicon layer 103. At the same time, nitrogen is diffused into the amorphous silicon film 103, and a charge storage film 105 having a stack structure formed with the nitrogen-added amorphous silicon layer 103 and the silicon nitride layer 104 is formed (FIGS. 34(e) and 34(f)). Here, the silicon nitride layer 104 is a layer that extends in the in-plane direction, and has a structure that includes three-coordinate nitrogen bonds and has a nitrogen atom as at least one of the second-nearest neighbors of nitrogen. The timing charts of the temperature of the silicon substrate, the supply of the disilane gas ($Si_2H_6$), and the supply of the $NH_3$ gas during the process for forming the charge storage film 105 are the same as those of the third embodiment shown in FIG. 20. Since the silicon nitride layer 104 is used as the block insulating film, the silicon nitride layer is made thicker in this embodiment than in the third embodiment.

After the charge storage film 105 is formed in the above manner, a mask material 106 to be used for the device isolation process is deposited by CVD (FIGS. 35(a) and 35(b)). After that, etching is successively performed on the mask material 106, the charge storage film 105, and the tunnel insulating film 102 by RIE using a resist mask (not shown), so as to expose a part of the surface of the silicon substrate 101. Etching is further performed on the exposed region of the silicon substrate 101, so as to form device isolation grooves 108 of 100 nm in depth, as shown in FIG. 35(b).

A silicon oxide film 109 for device isolation is then deposited on the entire surface, so as to completely fill the device isolation grooves 108. The portions of the silicon oxide film 109 existing on the surface are then removed by CMP, so that the surface of the silicon oxide film 109 is flattened. At this point, the mask material 106 becomes exposed (FIGS. 35(c) and 35(d)).

After the exposed mask material 106 is selectively removed by etching, the exposed portions of the silicon oxide film 109 on the surface are removed by etching with the use of a diluted hydrofluoric acid solution (FIGS. 36(a) and 36(b)).

Figure 36:
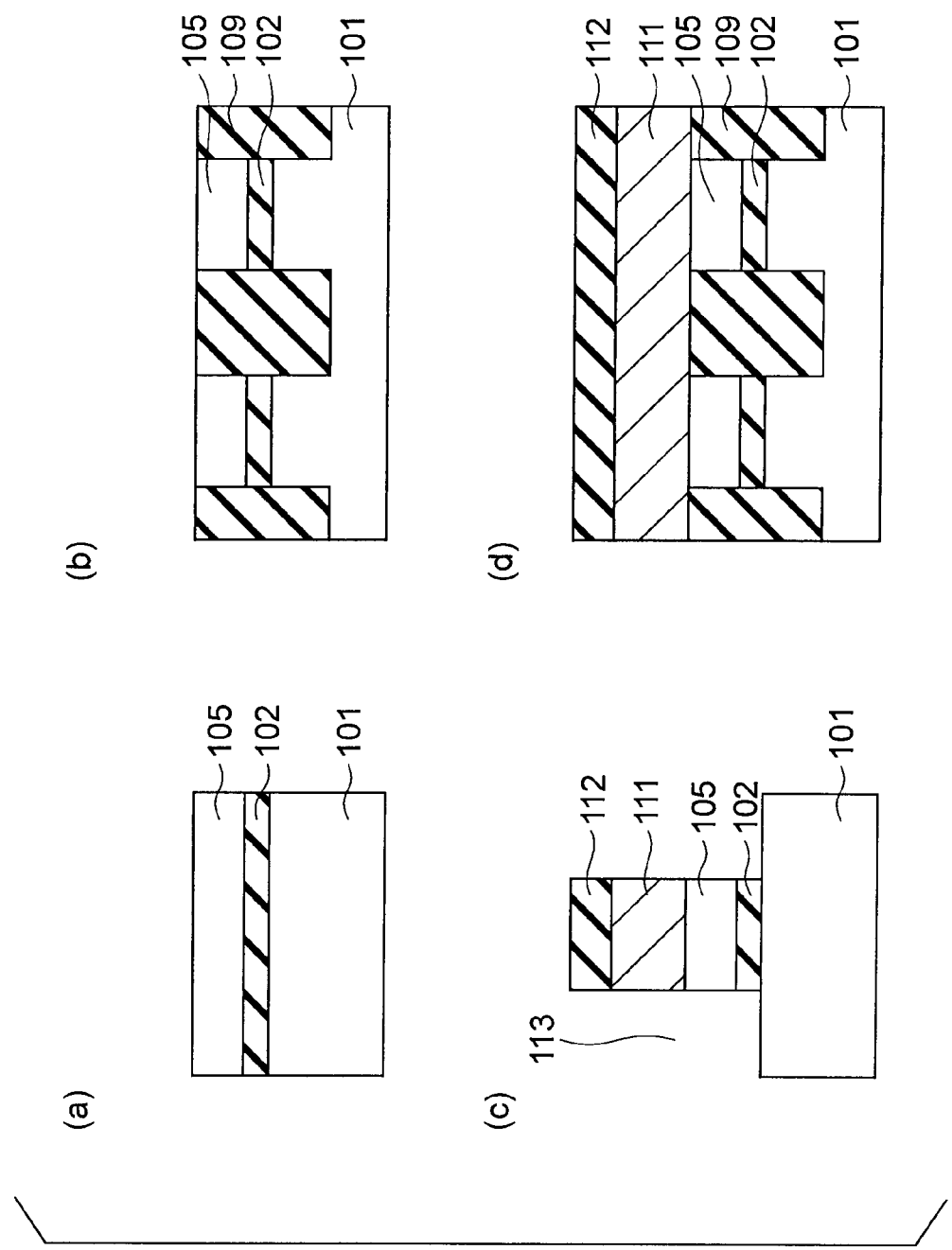
Figure 37:
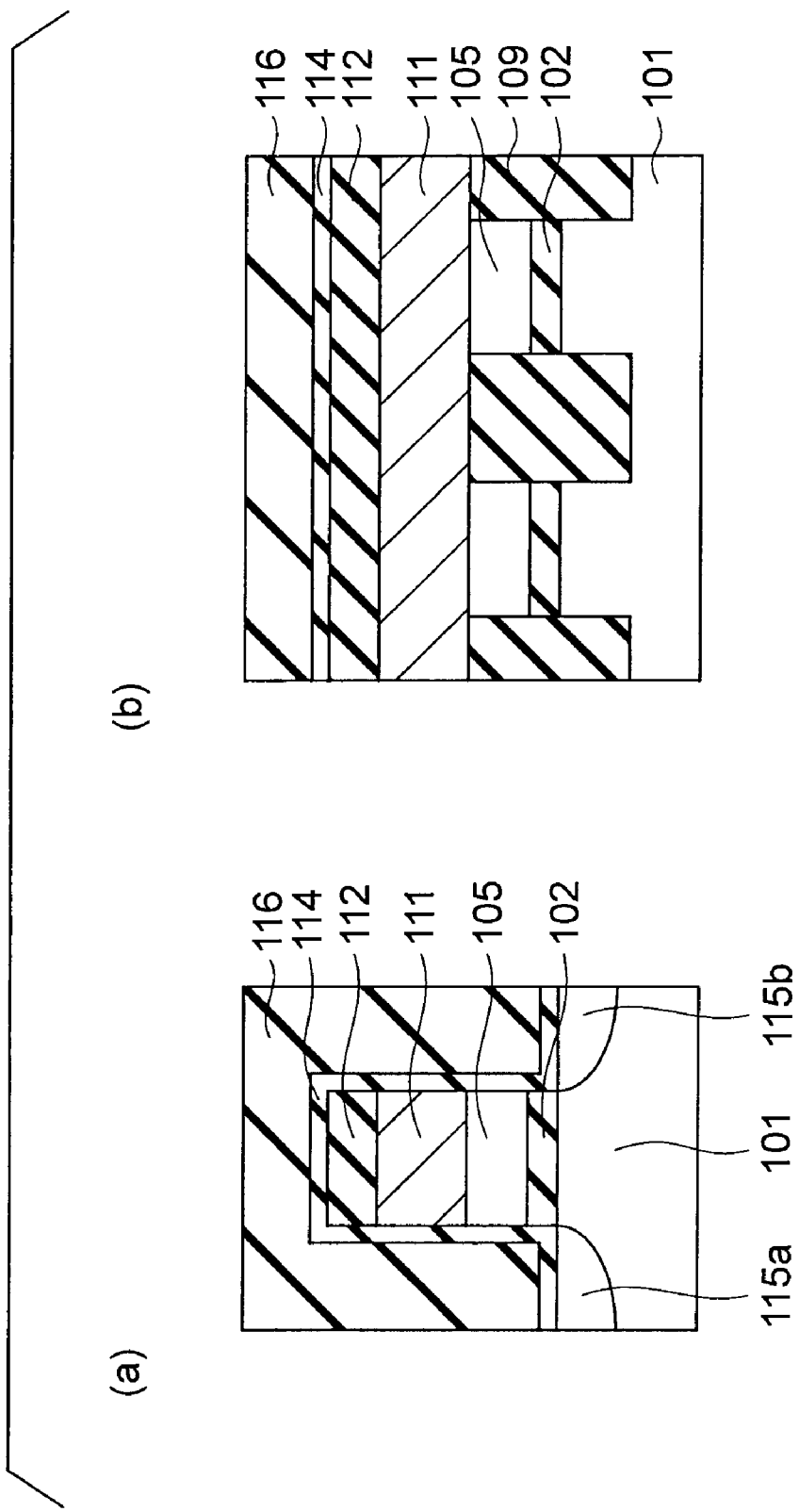

A polycrystalline silicon layer and a tungsten silicide layer are then successively deposited by CVD, so that a 100-nm thick conductive film 111 having a two-layer structure of the polycrystalline layer and the tungsten silicide layer is formed as a control gate electrode (FIGS. 36(c) and 36(d)). Further, a mask material 112 for RIE is deposited by CVD. After that, etching is successively performed on the mask material 112, the conductive film 111, the charge storage film 105, and the tunnel insulating film 102 by RIE with the use of a resist mask (not shown), so as to form grooves 113 extending in the word line direction (FIG. 36(*c*)). In this manner, the shapes of the charge storage film 105 and the control gate electrode 111 are defined.

Lastly, a silicon oxide film 114 that is an electrode sidewall oxide film is formed on the exposed faces of the mask material 112, the conductive film 111, the charge storage film 105, and the tunnel insulating film 102 by a thermal oxidation technique. Source/drain regions 115*a* and 115*b* are then formed by an ion implantation technique, and an interlayer insulating film 116 is formed to cover the entire surface by CVD (FIGS. 37(*a*) and 37(*b*)). After that, wiring layers and the likes are formed by a known technique, so as to complete nonvolatile semiconductor memory cells.

Figure 38:
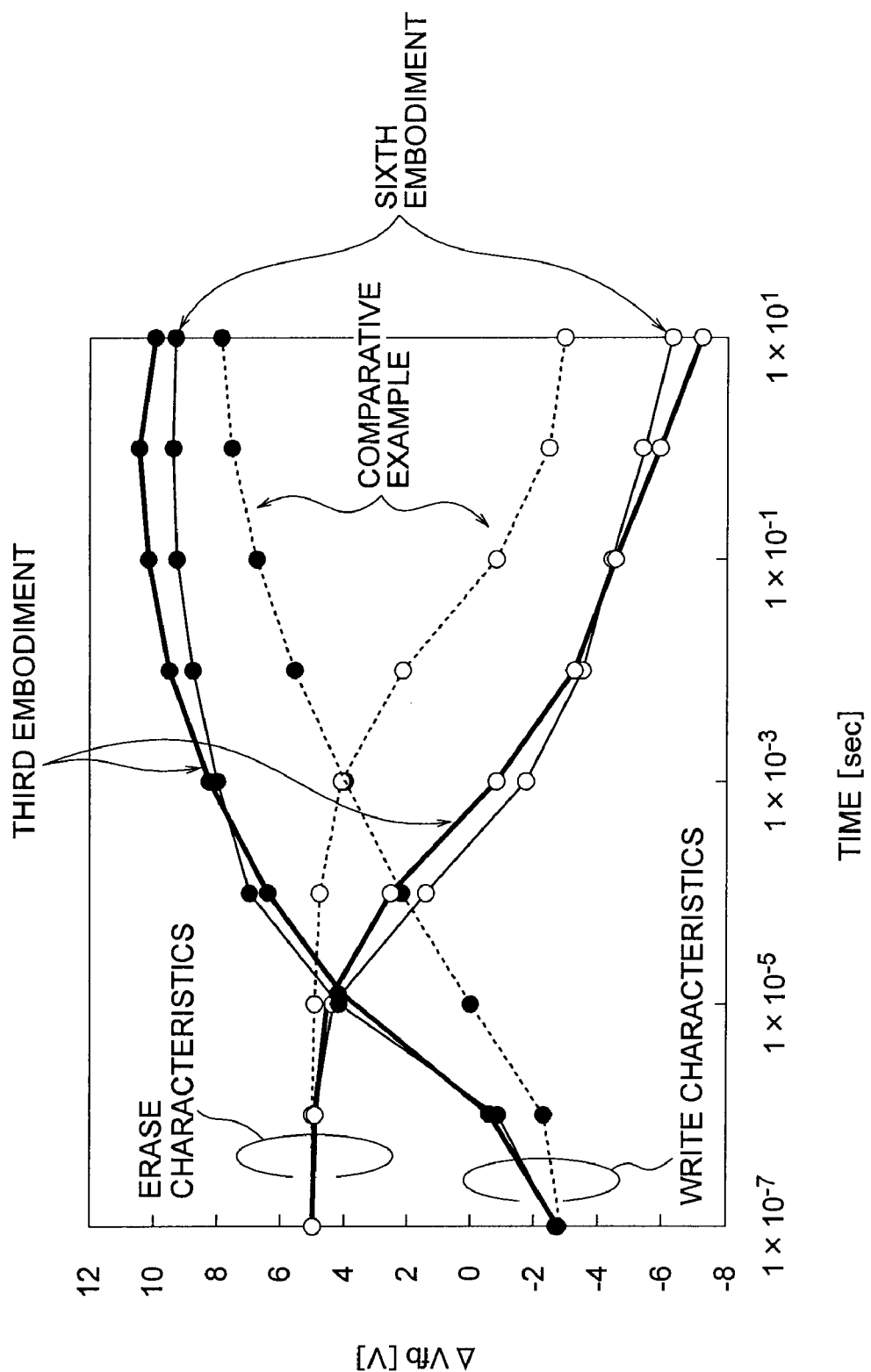
FIG. 38 shows the write/erase characteristics of the memory device manufactured according to the manufacture method of the sixth embodiment.

FIG. 38 shows the write and erase characteristics of a nonvolatile semiconductor memory device manufactured by the manufacture method of this embodiment, a nonvolatile semiconductor memory device manufactured by the manufacture method of the third embodiment, and a nonvolatile semiconductor memory device of a comparative example. In the comparative example, amorphous silicon is not deposited on the tunnel insulating film, and a silicon nitride film to be the charge storage film is directly deposited, with the substrate temperature being 750° C.

As can be seen from FIG. 38, the write and erase characteristics indicate that the speed is higher and improved in the initial period (during a short period of time after the start of a writing or erasing operation) in this embodiment than in the third embodiment, but the characteristics are degraded as the time lapses since the start of the writing or erasing operation. This is because the layer thickness of the charge storage film is greater, and the charge capture density is higher, when the silicon nitride layer 104 is used as the block insulating film as shown in this embodiment, accordingly, as the total amount of captured charges is larger, the initial characteristics are greatly improved. However, the bandgap of a nitride layer is normally narrower than the bandgap of an insulating film such as an alumina film. Therefore, after the time lapses since the start of a writing or erasing operation, charges are easily exchanged with the gate electrode side. Still, reasonable characteristics are maintained in the initial stage, and this should be an effective method in a case where writing and erasing are performed in a short period of time.

As described above, in accordance with this embodiment, nitriding of the lower-layer insulating film can be prevented, and oxygen diffusion from the upper-layer insulating film can be restricted. Thus, the decrease in charge capture density can be minimized.

Seventh Embodiment

Figure 39:
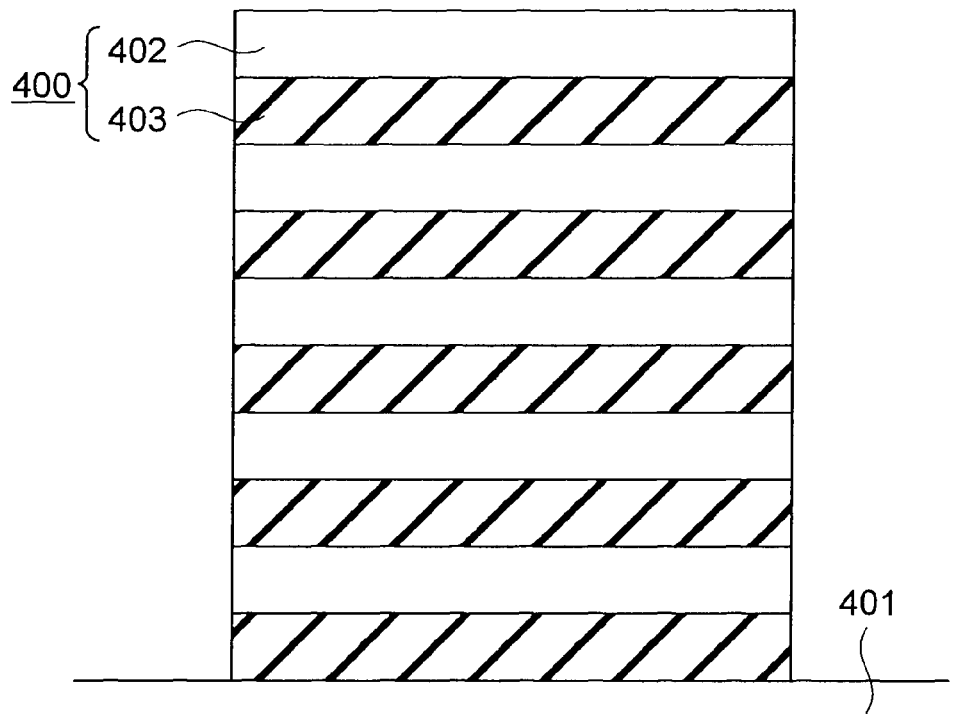
FIGS. 39 to 41 are cross-sectional views illustrating the procedures for manufacturing a nonvolatile semiconductor memory device according to a seventh embodiment.
Figure 40:
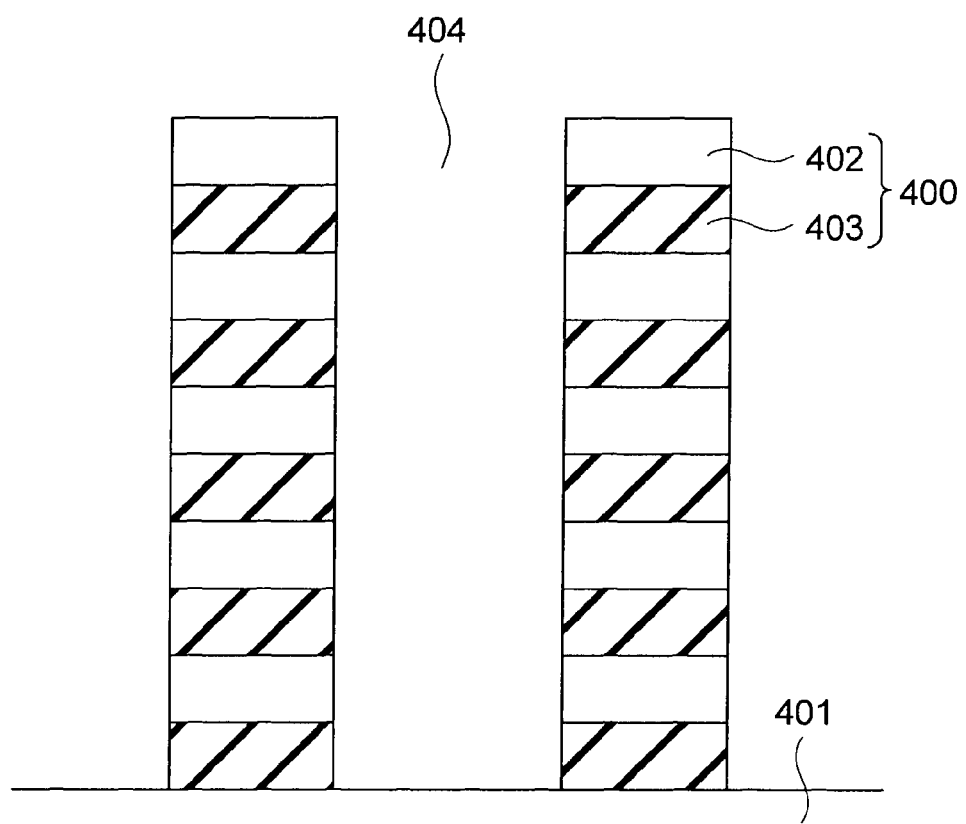
Figure 41:
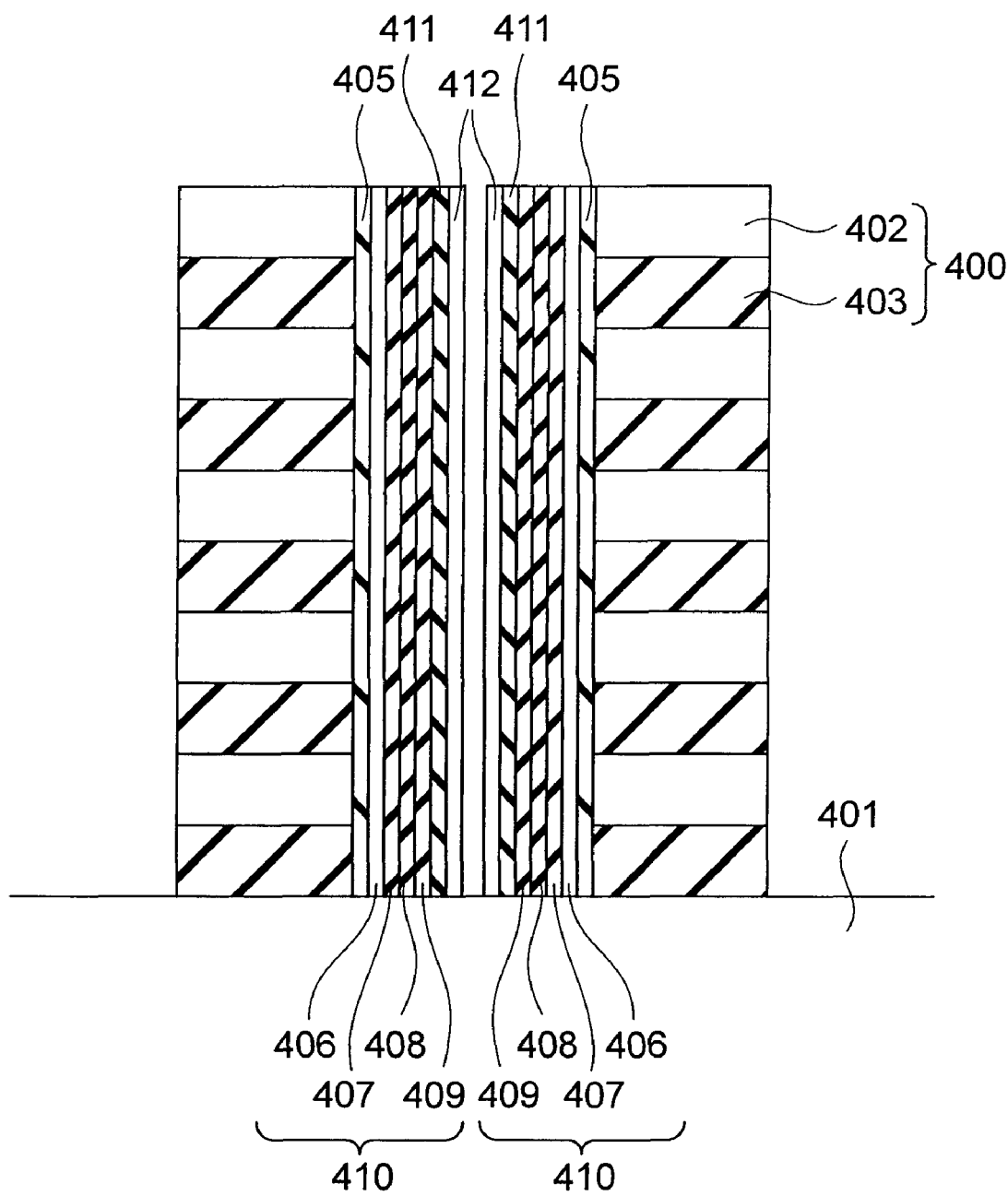

Next, a method for manufacturing a nonvolatile semiconductor memory device in accordance with a seventh embodiment is described. A nonvolatile semiconductor memory device to be manufactured by the manufacture method of this embodiment is a MONOS nonvolatile semiconductor memory device that has a stack structure formed by depositing control gate electrodes made of doped polysilicon or the like, and interlayer insulating films such as silicon oxide films. The MONOS nonvolatile semiconductor memory device includes memory cells. Referring now to FIGS. 39 through 41, the method for manufacturing the nonvolatile semiconductor memory device of this embodiment is described.

First, a stack structure 400 that has control gate electrodes 402 and interlayer insulating films 403 alternately stacked is formed on a substrate 401 (FIG. 39). Each of the control gate electrodes 402 is made of doped polysilicon or the like, and each of the interlayer insulating films 403 is formed with a silicon oxide film or the like. A hole 404 is then formed through the stack structure 400 by dry etching (FIG. 40). A block insulating film 405 that is a high-dielectric insulating film or a silicon oxide film is formed to cover the inner wall of the hole 404.

With the use of a disilane gas, a 1-nm thick amorphous silicon layer 406 is deposited to cover the inner surface of the silicon oxide film 405 (on the opposite side from the control gate electrodes 402 and the interlayer insulating films 402). Here, it is preferable that the temperature of the substrate 401 is 550° C. or lower. In this embodiment, the substrate temperature is set at 420° C., for example.

While the temperature of the substrate 401 is maintained at 420° C., the supply of the disilane gas is not stopped, and a $NH_3$ gas of 0.03 Torr in partial pressure is supplied into the chamber. By doing so, a 1-nm thick silicon nitride layer 407 is deposited to cover the inner surface of the amorphous silicon layer 406 (on the opposite side from the block insulating film). In this manner, the silicon nitride layer 407 is formed on the inner surface of the amorphous silicon layer 406.

While the supply of the disilane gas and the $NH_3$ gas is continued, the temperature of the stage on which the substrate is placed is increased to 700° C. In this manner, a silicon nitride layer 408 is formed to cover the inner surface of the silicon nitride layer 407 (on the opposite side from the amorphous silicon layer 406).

The supply of the disilane gas is then stopped, and only the supply of the $NH_3$ gas is continued. The silicon nitride layer 408 is subjected to a heat treatment in the $NH_3$ gas. Through the series of procedures for depositing the silicon nitride layers, nitrogen is diffused into the amorphous silicon layer 406, and the amorphous silicon layer 406 having nitrogen added thereto is formed. In addition to that, the three-coordinate components in the surface increase, as the silicon nitride layers 407 and 408 are subjected to the heat treatment in the $NH_3$ gas at 700° C. A silicon nitride layer 409 that is highly resistant to oxidation is formed on the inner surface of the silicon nitride layer 408 (on the opposite side from the silicon nitride layer 407). As a result, a charge storage layer 410 having a stack structure formed with the amorphous silicon layer 406, the silicon nitride layer 407, the silicon nitride layer 408, and the silicon nitride layer 409 is formed. Here, the silicon nitride layers 407, 408, and 409 are films that extend in the in-plane direction, and each have a structure that includes three-coordinate nitrogen bonds and has a nitrogen atom as at least one of the second-nearest neighbors of nitrogen. The three-coordinate nitrogen bond density is higher in the silicon nitride layer 408 than in the silicon nitride layer 407, and is even higher in the silicon nitride layer 409 than in the silicon nitride layer 408. A tunnel insulating film 411 formed with a silicon oxide film or the like is then formed to cover the inner surface of the silicon nitride layer 409 (on the opposite side from the silicon nitride layer 408). After that, a semiconductor layer 412 that is made of amorphous silicon or the like and is to be the channel is formed to cover the inner surface of the tunnel insulating film 411 (on the opposite side from the silicon nitride layer 409) (FIG. 41).

The tunnel insulating film 411 may be a silicon oxide film formed by the same method as the method for forming the block insulating film 405, or may be a silicon oxynitride film formed by nitriding the silicon oxide film in a nitric oxide gas atmosphere, an ammonia gas atmosphere, or a nitrogen plasma atmosphere. Further, in a case where a tunnel insulating film of an ONO (Oxide-Nitride-Oxide) structure is used, a silicon nitride film may be formed by ALD, LPCVD, or plasma nitriding during the formation of the above silicon oxide film. The film formation should be carried out with the use of dichlorosilane and ammonia at a temperature between 300° C. and 500° C. by ALD, at a temperature between 600° C. and 800° C. by LPCVD.

Furthermore, ALD and CVD have the advantage that the block insulating film 405, the charge storage film 410, and the tunnel insulating film 411 can be collectively formed in the same device. Accordingly, the smaller number of procedures contributes to lower costs, and the unnecessary interface levels formed between the layers can be reduced. Thus, the time degradation of the cells after the application of write/erase stress can be prevented.

Figure 42:
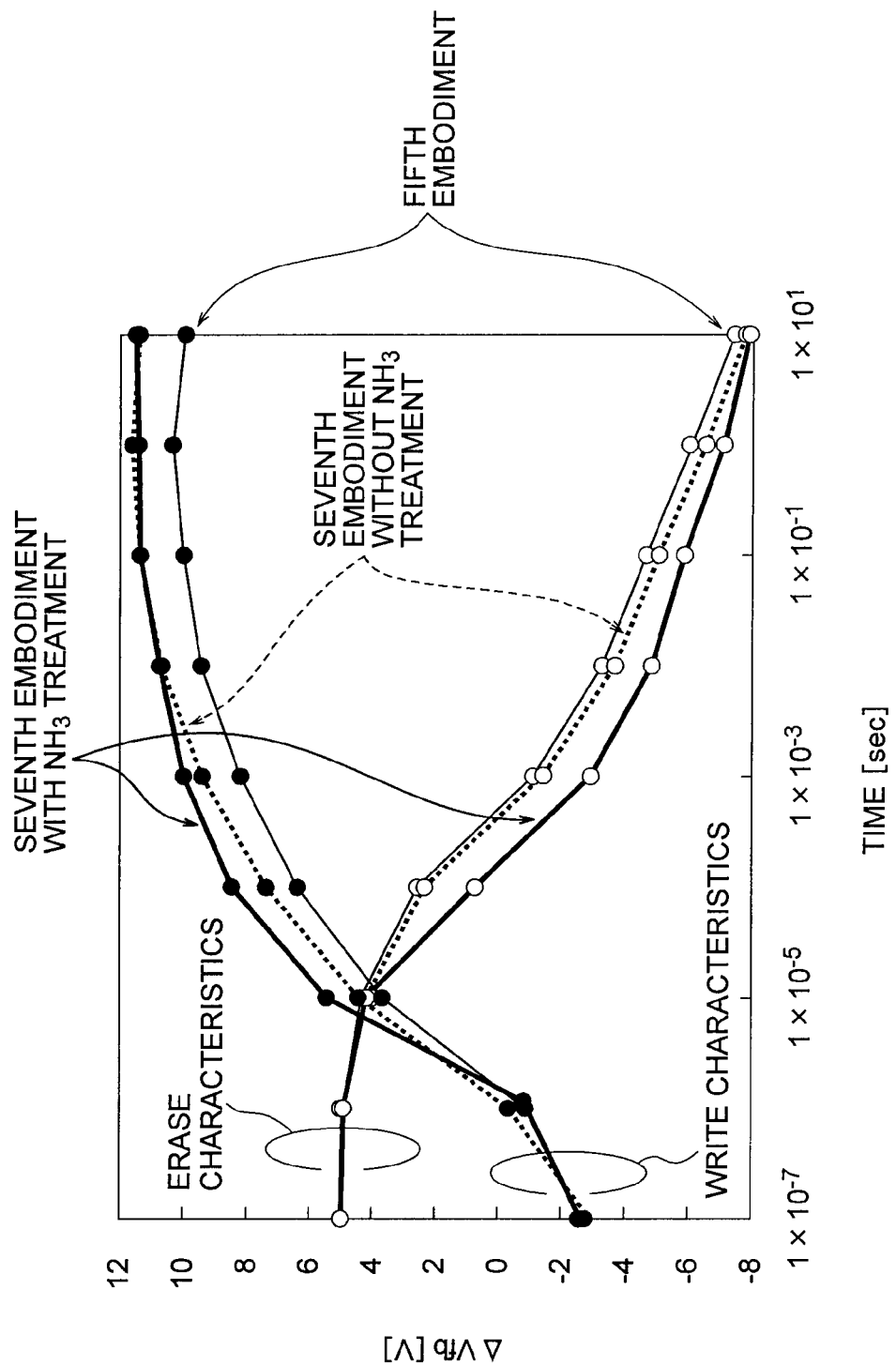
FIG. 42 shows the write/erase characteristics of the memory device manufactured according to the manufacture method of the seventh embodiment.

A first nonvolatile semiconductor memory device is prepared according to the manufacture method of this embodiment. A second nonvolatile semiconductor memory device is prepared according to the same method as the manufacture method of this embodiment, except that the last nitriding process using a $NH_3$ gas is not carried out when the charge storage film 410 is formed. A third nonvolatile semiconductor memory device is prepared according to the manufacture method of the fifth embodiment. FIG. 42 shows the write and erase characteristics of the first through third nonvolatile semiconductor memory devices.

As can be seen from FIG. 42, the write and erase characteristics of the first nonvolatile semiconductor memory device are greatly improved, compared with the write and erase characteristics of the second and third nonvolatile semiconductor memory devices. Also, the saturation value is even higher in the first nonvolatile semiconductor memory device. This is because a strong electric field is induced between the charge storage film 410 and the channel semiconductor layer 412 during each writing or erasing operation in the memory, as the first nonvolatile semiconductor memory device is formed into the above described memory device structure. The electron/hole injection from the channel semiconductor layer becomes more active, and the write and erase characteristics are further improved. Moreover, after the charge storage layer 408 is formed, annealing is performed with the use of a $NH_3$ gas at 700° C., so as to form the silicon nitride layer 409 with few defects on the outermost surface. Accordingly, the charge retention characteristics are further improved, and written charges are not easily released. Also, the decrease of the defects in the charge storage film due to the oxygen invasion during the formation of the tunnel oxide film can be restricted.

As described above, in accordance with this embodiment, not only the write characteristics but also the captured charge density is improved, as the above memory device structure is formed. Accordingly, the decrease in captured charge density due to the formation of the tunnel insulating film can be prevented, and the memory window can be made even larger.

As described above, in accordance with this embodiment, nitriding of the lower-layer insulating film can be prevented, and oxygen diffusion from the upper-layer insulating film can be restricted. Thus, the decrease in charge capture density can be minimized.

It is also possible to form a nonvolatile semiconductor memory device by replacing the process of forming the charge storage film of the seventh embodiment with the process of forming the charge storage film of any of the first through fourth embodiments and the sixth embodiment.

As described above, in accordance with each of the embodiments of the present invention, nitriding of the lower-layer insulating film can be prevented, and oxygen diffusion from the upper-layer insulating film can be restricted. Thus, the decrease in charge capture density can be minimized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for manufacturing a semiconductor device, further comprising:
    forming a first insulating film;
    forming an amorphous silicon layer on the first insulating film by supplying a silicon containing gas in an atmosphere at a first temperature of 550° C. or lower;
    forming a first silicon nitride layer on the amorphous silicon layer and diffusing nitrogen to the amorphous silicon layer by supplying the silicon containing gas, and supplying a nitriding gas while maintaining the atmosphere at the first temperature;
    forming a second silicon nitride layer on the first silicon nitride layer and diffusing nitrogen to the amorphous silicon layer by increasing the temperature of the atmosphere from the first temperature to a second temperature and maintaining the atmosphere at the second temperature;
    forming a third silicon nitride layer on the second silicon nitride layer and diffusing nitrogen to the amorphous silicon layer by stopping supplying the silicon containing gas and keep supplying the nitriding gas while maintaining the atmosphere at the second temperature; and
    forming a second insulating film above the third silicon nitride layer.

2. The method according to claim 1, wherein the first silicon nitride layer is formed by use of ALD method.

3. The method according to claim 1, wherein the first silicon nitride layer is formed by use of CVD method.

* * * * *